US010886133B2

(12) United States Patent
Shimizu et al.

(10) Patent No.: US 10,886,133 B2
(45) Date of Patent: Jan. 5, 2021

(54) SUBSTRATE PROCESSING METHOD AND SUBSTRATE PROCESSING DEVICE

(71) Applicant: SCREEN Holdings Co., Ltd., Kyoto (JP)

(72) Inventors: Daisuke Shimizu, Kyoto (JP); Masayuki Otsuji, Kyoto (JP); Shota Iwahata, Kyoto (JP)

(73) Assignee: SCREEN Holdings Co., Ltd.

(*) Notice: Subject to any disclaimer, the term of this patent is extended or adjusted under 35 U.S.C. 154(b) by 0 days.

(21) Appl. No.: 16/319,843

(22) PCT Filed: Sep. 1, 2017

(86) PCT No.: PCT/JP2017/031628
§ 371 (c)(1),
(2) Date: Jan. 23, 2019

(87) PCT Pub. No.: WO2018/047741
PCT Pub. Date: Mar. 15, 2018

(65) Prior Publication Data

US 2019/0267244 A1 Aug. 29, 2019

(30) Foreign Application Priority Data

Sep. 12, 2016 (JP) ................................ 2016-177882

(51) Int. Cl.
*B08B 3/10* (2006.01)
*H01L 21/67* (2006.01)
(Continued)

(52) U.S. Cl.
CPC .............. *H01L 21/304* (2013.01); *B08B 3/10* (2013.01); *B24B 57/02* (2013.01);
(Continued)

(58) Field of Classification Search
CPC ..... B08B 3/10; B24B 57/02; H01L 21/02057; H01L 21/304; H01L 21/67028;
(Continued)

(56) References Cited

U.S. PATENT DOCUMENTS 8,475,602 B2 * 7/2013 Matsui .................. B08B 7/0071 134/19
9,950,405 B2 * 4/2018 Deng ...................... B24B 37/04
(Continued)

FOREIGN PATENT DOCUMENTS

JP 03049223 A * 3/1991
JP H03-049223 A 3/1991
(Continued)

OTHER PUBLICATIONS

International Preliminary Report on Patentability (Chapter I) dated Mar. 21, 2019 with a Notification from the International Bureau (Form PCT/IB/326) in corresponding PCT International Application No. PCT/JP2017/031628 in Japanese.
(Continued)

*Primary Examiner* — Nadine G Norton
*Assistant Examiner* — Christopher Remavege
(74) *Attorney, Agent, or Firm* — Ostrolenk Faber LLP

(57) ABSTRACT

A substrate processing method includes a substrate holding step of holding a substrate in which a pattern is defined on one major surface, a charge supply step of supplying a charge of one polarity to the substrate, a first voltage application step of applying, in parallel with the charge supply step, a voltage of the other polarity to a first electrode arranged on the other major surface of the substrate through a dielectric member, a second voltage application step of applying, after the first voltage application step, a voltage of the one polarity to the first electrode while keeping a state where a ground connection of the substrate is released and
(Continued)

a drying step of removing, in parallel with the second voltage application step, a liquid from the one major surface of the substrate so as to dry the substrate.

19 Claims, 31 Drawing Sheets

(51) Int. Cl.
*H01L 21/304* (2006.01)
*B24B 57/02* (2006.01)
*H01L 21/687* (2006.01)

(52) U.S. Cl.
CPC .. *H01L 21/67028* (2013.01); *H01L 21/67051* (2013.01); *H01L 21/68728* (2013.01); *H01L 21/68792* (2013.01)

(58) Field of Classification Search
CPC ......... H01L 21/67051; H01L 21/68728; H01L 21/68792
See application file for complete search history.

(56) References Cited

U.S. PATENT DOCUMENTS

2004/0221875 A1 11/2004 Saga et al. .................... 134/26
2006/0099339 A1 5/2006 Hashizume .................. 427/240
2007/0218656 A1* 9/2007 Miyagi ............ H01L 21/67051 438/478
2008/0173327 A1* 7/2008 Miyagi .................... B05B 5/03 134/1.3
2008/0178917 A1 7/2008 Miyagi et al. ............. 134/57 R
2012/0055506 A1* 3/2012 Moriya ............ H01L 21/67051 134/1
2013/0084710 A1 4/2013 Miyagi ........................ 438/745
2014/0011366 A1 1/2014 Klipp et al. ................. 438/745
2014/0377463 A1 12/2014 Hachiya et al. ............. 427/341
2015/0243542 A1 8/2015 Yoshihara et al.

FOREIGN PATENT DOCUMENTS

JP 2004-249189 A 9/2004
JP 2011-124383 A 6/2011
JP 5379663 B2 * 12/2013
JP 5379663 B2 12/2013
JP 2014-514739 A 6/2014
JP 2015-043379 A 3/2016
KR 10-2015-0101951 A 9/2015

OTHER PUBLICATIONS

English translation of the International Preliminary Report on Patentability (Chapter I) dated Mar. 21, 2019 with a Notification from the International Bureau (Form PCT/IB/338) in corresponding PCT International Application No. PCT/JP2017/031628 in English.
International Search Report dated Nov. 14, 2017 in corresponding PCT International Application No. PCT/JP2017/031628.
Written Opinion dated Nov. 14, 2017 in corresponding PCT International Application No. PCT/JP2017/031628.

* cited by examiner 1
2
4
2
4
LP
W
C
LP
W
C
LP
W
C
H1
H2
IR
CR
CONTROLLER
3
2
4
2
4

PURE WATER
HFE
HF
SC1
FIRST POWER SUPPLY DEVICE
FIRST OPPOSITE PORTION LIFTING UNIT
A1
W
H2
16A(16)
(16)16B
19A
19B 5
16B(16)
16A(16)
30
27
29
26
34
32
29
(16)
16B
34
30
16A
(16)
32
26
A1
27
15
34
32
16B
(16)
16A
(16)
27
26
30
29

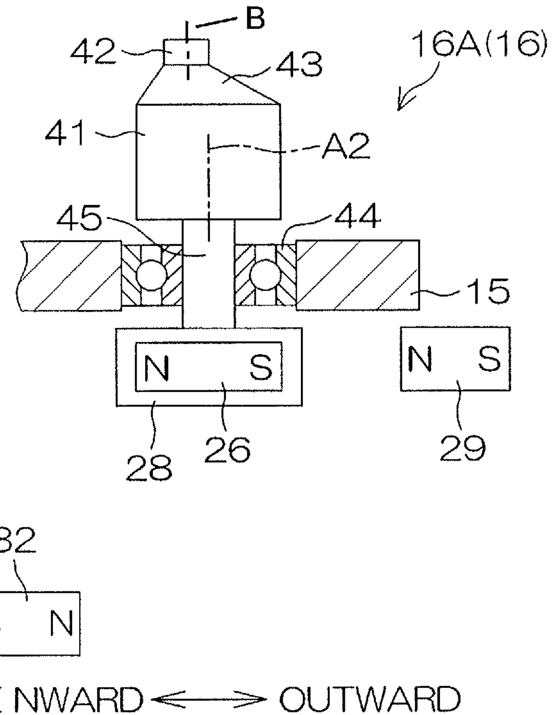
FIG. 4A HOLDING POSITION
B
42
43
16A(16)
41
A2
45
44
15
N
S
N
S
28
26
29
32
S
N
INWARD
OUTWARD
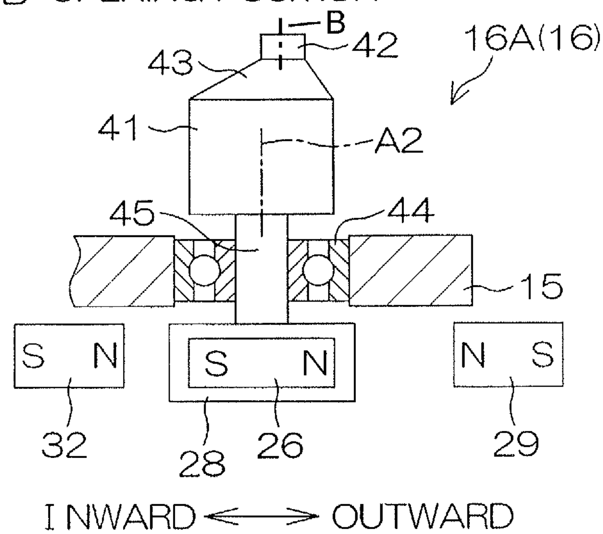
FIG. 4B OPENING POSITION
B
42
43
16A(16)
41
A2
45
44
15
S
N
S
N
N
S
32
28
26
29
INWARD
OUTWARD FIG. 5A HOLDING POSITION
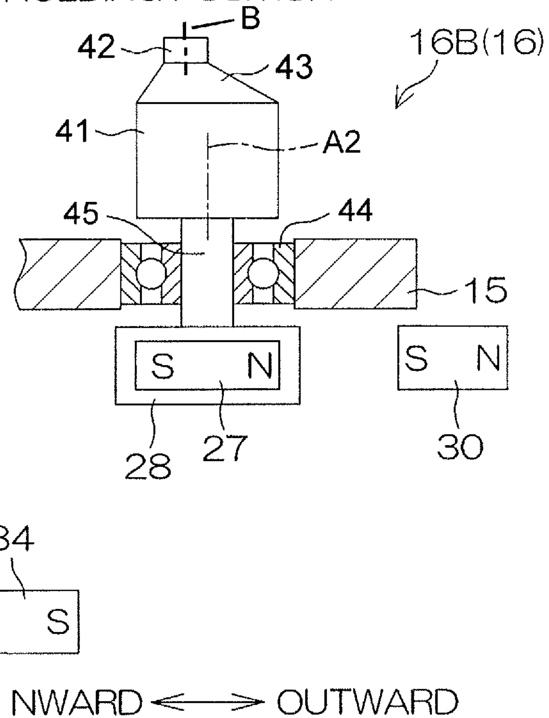
FIG. 5B OPENING POSITION
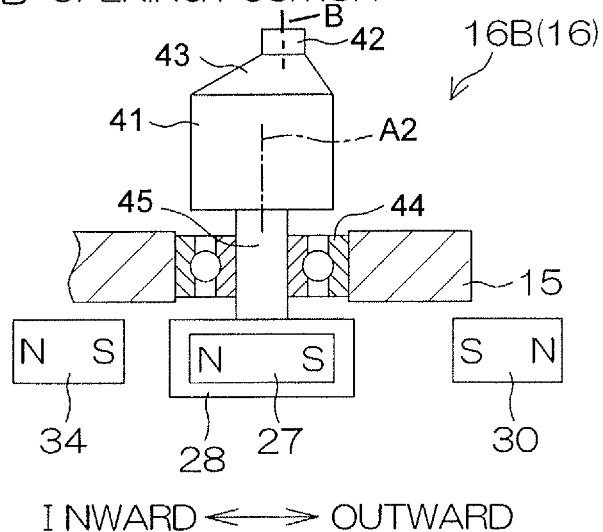

S0
CARRY-IN OF SUBSTRATE W
S1
START ROTATION OF SUBSTRATE W
S2
HF STEP
S3
FIRST PURE WATER STEP
S4
SC1 STEP
S5
SECOND PURE WATER STEP
S6
CHARGE SUPPLY STEP
S7
GROUND CONNECTION RELEASE
S8
DRYING STEP
S9
CARRY-OUT OF SUBSTRATE W
FIRST VOLTAGE APPLICATION STEP
SECOND VOLTAGE APPLICATION STEP

S6
S7
I NSULATING LIQUID DISCHARGE
DISCHARGE
STOP
VOLTAGE APPLIED TO FIRST ELECTRODE 21
POSITIVE
STOP
NEGATIVE
HOLDING PIN 16
CONDUCTIVE
I NSULATING
GROUND CONNECTION
ON
OFF
ROTATIONAL SPEED OF SUBSTRATE W
1500rpm
1000rpm
0rpm 71
62
62
36
W
61
23
12
20
19A 71
62
62
W
61
23
12
20
19A 62
REPULSIVE FORCE
62
66
66
ATTRACTIVE FORCE
ATTRACTIVE FORCE
65
65
71
64
64
W
61
Si
23
12
20
FIRST POWER SUPPLY DEVICE
24

201
202
211
206
HF
212
213
207
SC1
214
224
225
215
208
純水
216
SECOND POWER SUPPLY DEVICE
217
209
HFE
218
205
210
SECOND OPPOSITE PORTION LIFTING UNIT
204
221
(203)
223
230
223
222
H2
W
A1
12
23
16B
(16)
16A
(16)
30
27
19A
19
19B
20
15
26
29
31
28
34
32
28
31
14
35
33
13
22
38
11
36
FIRST OPPOSITE PORTION LIFTING UNIT
37
10
21
5
FIRST POWER SUPPLY DEVICE
24

201
3
CONTROLLER
SPIN MOTOR
13
LIFTING UNIT
21, 33, 35, 205
SWITCH
38
POWER SUPPLY DEVICE
24, 224
VALVE
212, 214, 216, 218, 234

S6
S7
INSULATING LIQUID DISCHARGE
DISCHARGE
STOP
VOLTAGE APPLIED TO FIRST ELECTRODE 21
POSITIVE
STOP
NEGATIVE
VOLTAGE APPLIED TO SECOND ELECTRODE 223
POSITIVE
STOP
HOLDING PIN 16
CONDUCTIVE
INSULATING
GROUND CONNECTION
ON
OFF
ROTATIONAL SPEED OF SUBSTRATE W
1500rpm
1000rpm
0rpm

HFE
210
204
221 (203)
71
W
16B
19A
15
16A
38
14
36
A1
37

SECOND POWER SUPPLY DEVICE
224
221(203)
222
223
62
REPULSIVE FORCE
62
66
66
ATTRACTIVE FORCE
ATTRACTIVE FORCE
65
65
71
64
64
W
61
Si
23
12
20
FIRST POWER SUPPLY DEVICE
24

CARBONATED WATER
PURE WATER
HFE
HF
SC1
CHUCK OPENING/
CLOSING UNIT
FIRST POWER
SUPPLY DEVICE
FIRST OPPOSITE
PORTION LIFTING
UNIT
4
A1
W
H2
12
19
19A
19B
20
21
22
23
24
42
51
52
53
54
55
56
57
58
6
7
8
9
301
302
303
305
306
307
308
310
311
321
322
323
324
325
326

S6
S7
INSULATING LIQUID DISCHARGE
DISCHARGE
STOP
CONDUCTIVE LIQUID DISCHARGE
DISCHARGE
STOP
VOLTAGE APPLIED TO FIRST ELECTRODE 21
POSITIVE
STOP
NEGATIVE
ROTATIONAL SPEED OF SUBSTRATE W
1500rpm
1000rpm
0rpm PURE WATER
HFE
HF
SC1
FIRST POWER SUPPLY DEVICE
FIRST OPPOSITE PORTION LIFTING UNIT
16A(16)
(16)16B
403B
19A
A1
W
H2

501
502
503
HF
506
505
GAS KNIFE
MOVEMENT UNIT
508
504
507
16
15
5
W
19B
A1
14
19A
504
16

SUBSTRATE PROCESSING METHOD AND SUBSTRATE PROCESSING DEVICE

CROSS-REFERENCE TO RELATED APPLICATIONS

The present application is a 35 U.S.C. §§ 371 national phase conversion of PCT/JP2017/031628, filed Sep. 1, 2017, which claims priority to Japanese Patent Application No. 2016-177882, filed Sep. 12, 2016, the contents of both of which are incorporated herein by reference. The PCT International Application was published in the Japanese language.

TECHNICAL FIELD

The present invention relates to a substrate processing method and a substrate processing apparatus that process a substrate in which patterns are defined on one major surface of the substrate. Examples of the substrate to be processed include semiconductor wafers, substrates for liquid crystal display devices, substrates for plasma displays, substrates for FEDs (Field Emission Displays), substrates for optical disks, substrates for magnetic disks, substrates for magneto-optical disks, substrates for photomasks, ceramic substrates and substrates for solar cells.

BACKGROUND ART

In a process of manufacturing a semiconductor device, the front surface of a substrate such as a semiconductor wafer is processed with a processing liquid. A single substrate processing type substrate processing apparatus that processes substrates one by one includes a spin chuck which rotates a substrate while holding the substrate substantially horizontally and a nozzle which supplies the processing liquid to the front surface of the substrate that is rotated by the spin chuck. In a typical substrate processing step, a chemical liquid is supplied to the substrate which is held by the spin chuck. Thereafter, a rinse liquid is supplied to the substrate, and thus the chemical liquid on the substrate is replaced by the rinse liquid. Thereafter, a drying step of removing the rinse liquid on the substrate so as to dry the substrate is performed.

In order to suppress the collapse of patterns formed on the front surface of a substrate when the substrate is processed, in Patent Literature 1 which will be described below, a voltage is directly applied to a silicon substrate so as to charge the patterns, and thus a repulsive force (force for moving the patterns away from each other) is generated on adjacent patterns.

CITATION LIST

Patent Literature

Patent Literature 1: Japanese Patent No. 5379663

SUMMARY OF INVENTION

Technical Problem

The inventors of the present application consider that when drying processing which removes a liquid from the front surface of a substrate is performed, adjacent patterns attract each other so as to make contact with each other, and that this leads to the collapse of the patterns. One of the causes for the collapse is estimated to be a surface tension which is generated by the liquid between the adjacent patterns. Specifically, it is estimated that when the liquid between adjacent patterns is removed, an attractive force caused by the surface tension is exerted on adjacent patterns, and that this results in the collapse of the patterns.

In the method disclosed in Patent Literature 1, the repulsive force can be generated on adjacent patterns. Since the repulsive force as described above can cancel out the attractive force exerted on adjacent patterns, the method disclosed in Patent Literature 1 is adopted, and thus it is possible to suppress the collapse of the patterns.

Then, the inventors of the present application made a study by using a method different from that in Patent Literature 1 so as to generate a repulsive force on adjacent patterns and to thereby effectively suppress patterns on one major surface of the substrate.

Hence, an object of the present invention is to provide a substrate processing method and a substrate processing apparatus which can effectively suppress the collapse of patterns on a substrate.

Solution to Problem

The invention provides a substrate processing method which includes a substrate holding step of holding a substrate in which a pattern is defined on one major surface, a charge supply step of supplying a charge of one polarity to the substrate, a first voltage application step of applying, in parallel with the charge supply step, a voltage of the other polarity to a first electrode arranged on the other major surface of the substrate through a dielectric member, a second voltage application step of applying, after the first voltage application step, a voltage of the one polarity to the first electrode while keeping a state where a ground connection of the substrate is released and a drying step of removing, in parallel with the second voltage application step, a liquid from the one major surface of the substrate so as to dry the substrate.

The "one polarity" means one of a positive polarity and a negative polarity, and the "other polarity" means the other of the positive polarity and the negative polarity.

The "one major surface of the substrate" means one of a front surface which is a device forming surface and a rear surface opposite to the front surface, and the "other major surface of the substrate" means the other of the front surface and the rear surface.

The dielectric member has a meaning which includes not only a solid dielectric member arranged between the other major surface of the substrate and the first electrode but also a gas (for example, air) present between the other major surface of the substrate and the first electrode.

In this method, in parallel with the charge supply step of supplying the charge of the one polarity to the substrate, the voltage of the other polarity is applied to the first electrode. In this way, the charge of the one polarity supplied to the substrate can be attracted to the other major surface of the substrate, and consequently, the charge of the one polarity can be accumulated within the substrate.

After the first voltage application step, the second voltage application step of applying the voltage of the other polarity to the first electrode while keeping the state where the ground connection of the substrate is released is performed. In parallel with the second voltage application step, the drying step of removing the liquid from the one major surface of the substrate is performed.

The substrate is insulated from the surroundings, and thus the flowing out of the charge of the one polarity accumulated within the substrate to the outside of the substrate is prevented. In this state, the voltage of the one polarity is applied to the first electrode, and thus the charge of the one polarity accumulated within the substrate repels the first electrode so as to be collected on the one major surface of the substrate. Hence, electrical polarization occurs in the patterns, and thus the charge of the one polarity is collected on the individual patterns, with the result that the individual patterns are charged to the one polarity. In this way, a repulsive force (coulomb force) is exerted between adjacent patterns.

On the other hand, when a liquid surface is present between adjacent patterns, the surface tension of the liquid is exerted on the position of a boundary between the liquid surface and the patterns. In other words, an attractive force (surface tension) is exerted between adjacent patterns. However, the attractive force (surface tension) is cancelled out by the repulsive force (coulomb force) resulting from the charging of the patterns. Hence, while the force exerted on the patterns is being reduced, the liquid can be removed from the one major surface of the substrate. In this way, it is possible to dry the substrate while effectively suppressing the collapse of the patterns.

In a preferred embodiment of the invention, the method further includes an insulating liquid film holding step of holding, in parallel with the second voltage application step, a liquid film of an insulating liquid whose resistivity is equal to or more than the resistivity of pure water on the one major surface of the substrate, and the drying step includes a step of removing the insulating liquid from the one major surface of the substrate.

In this method, in parallel with the second voltage application step, the liquid film of the insulating liquid is held on the one major surface of the substrate, and thus it is possible to suppress or prevent the flowing out of the charge of the one polarity accumulated in the substrate through the liquid film formed on the one major surface of the substrate. In this way, in the second voltage application step, a larger amount of charge of the one polarity can be collected on the one major surface of the substrate. Hence, it is possible to increase the repulsive force (coulomb force) exerted between adjacent patterns.

The insulating liquid may include a low surface tension liquid whose surface tension is lower than the surface tension of the pure water. In this case, the surface tension exerted between adjacent patterns is reduced, and thus it is possible to further suppress the collapse of the patterns.

The method may further include a first distance changing step of changing, in parallel with the second voltage application step, a distance between the first electrode and the other major surface of the substrate.

In this method, the distance between the first electrode and the other major surface of the substrate is changed, and thus it is possible to adjust the amount of charge of the one polarity collected on the one major surface of the substrate. In this way, it is possible to adjust the magnitude of the repulsive force (coulomb force) generated between adjacent patterns.

The method may further include a third voltage application step of applying, in parallel with the second voltage application step, the voltage of the other polarity to a second electrode which is opposite the one major surface of the substrate with a predetermined distance left therebetween.

In this method, the voltage of the other polarity is applied to the second electrode which is opposite the one major surface of the substrate with the predetermined distance left therebetween, and thus in the second voltage application step, a large amount of charge of the one polarity can be collected on the one major surface of the substrate.

The voltage of the other polarity is applied to the second electrode which is opposite the one major surface of the substrate with the predetermined distance left therebetween, and thus it is possible to facilitate polarization within the patterns.

Hence, it is possible to increase the repulsive force (coulomb force) exerted between adjacent patterns.

The method may further include a second distance changing step of changing, in parallel with the third voltage application step, a distance between the second electrode and the other major surface of the substrate.

In this method, the distance between the second electrode and the one major surface of the substrate is changed, and thus it is possible to adjust the amount of charge of the one polarity collected on the one major surface of the substrate. In this way, it is possible to adjust the magnitude of the repulsive force (coulomb force) generated between adjacent patterns.

The substrate holding step may further include a first substrate holding step of supporting, in parallel with the charge supply step, the substrate by a plurality of holding pins including at least one conductive pin formed with a conductive material and a second substrate holding step of supporting, in parallel with the second voltage application step, the substrate with an insulating pin formed with an insulating material without use of the conductive pin.

In this method, in the first substrate holding step, the substrate is supported by the holding pins including at least the one conductive pin. Hence, in the charge supply step, the charge of the one polarity can also be supplied through the conductive pin to the substrate. In the second substrate holding step, the substrate is supported only with the insulating pin. Hence, the substrate can be kept in a state where the substrate is grounded.

The charge supply step may include a step of providing, while supplying a conductive liquid to the substrate, the charge of the one polarity to the conductive liquid.

In this method, the charge of the one polarity provided to the conductive liquid is supplied through the conductive liquid to the substrate which makes contact with the conductive liquid. As described above, with the relatively simple method, it is possible to provide the charge of the one polarity to the substrate.

The invention provides a substrate processing apparatus which includes a substrate holding unit that holds a substrate in which a pattern is defined on one major surface, a charge supply unit for supplying a charge of one polarity to the substrate held in the substrate holding unit, a first electrode that is arranged through a dielectric member on the other major surface of the substrate held in the substrate holding unit, a first power supply device for applying a voltage to the first electrode, a drying unit for removing a liquid from the one major surface of the substrate held in the substrate holding unit and a controller that controls the charge supply unit, the first power supply device and the drying unit. The controller performs a charge supply step of applying a voltage to the substrate held in the substrate holding unit so as to supply the charge of the one polarity to the substrate, a first voltage application step of applying, in parallel with the charge supply step, a voltage of the other polarity to the first electrode arranged on the other major surface of the substrate through the dielectric member, a second voltage application step of applying, after the first voltage application step, a voltage of the one polarity to the first electrode while keeping a state where a ground connection of the substrate is released and a drying step of removing, in parallel with the second voltage application step, the liquid from the one major surface of the substrate so as to dry the substrate.

The "one polarity" means one of a positive polarity and a negative polarity, and the "other polarity" means the other of the positive polarity and the negative polarity.

The "one major surface of the substrate" means one of a front surface which is a device forming surface and a rear surface opposite to the front surface, and the "other major surface of the substrate" means the other of the front surface and the rear surface.

The dielectric member has a meaning which includes not only a solid dielectric member arranged between the other major surface of the substrate and the first electrode but also a gas (for example, air) present between the other major surface of the substrate and the first electrode.

With this arrangement, in parallel with the charge supply step of supplying the charge of the one polarity to the substrate, the voltage of the other polarity is applied to the first electrode. In this way, the charge of the one polarity supplied to the substrate can be attracted to the other major surface of the substrate, and consequently, the charge of the one polarity can be accumulated within the substrate.

After the first voltage application step, the second voltage application step of applying the voltage of the other polarity to the first electrode while keeping the state where the ground connection of the substrate is released is performed. In parallel with the second voltage application step, the drying step of removing the liquid from the one major surface of the substrate is performed.

The substrate is insulated from the surroundings, and thus the flowing out of the charge of the one polarity accumulated within the substrate to the outside of the substrate is prevented. In this state, the voltage of the one polarity is applied to the first electrode, and thus the charge of the one polarity accumulated within the substrate repels the first electrode so as to be collected on the one major surface of the substrate. Hence, electrical polarization occurs in the patterns, and thus the charge of the one polarity is collected on the individual patterns, with the result that the individual patterns are charged to the one polarity. In this way, a repulsive force (coulomb force) is exerted between adjacent patterns.

On the other hand, when a liquid surface is present between adjacent patterns, the surface tension of the liquid is exerted on the position of a boundary between the liquid surface and the patterns. In other words, an attractive force (surface tension) is exerted between adjacent patterns. However, the attractive force (surface tension) is cancelled out by the repulsive force (coulomb force) resulting from the charging of the patterns. Hence, while the force exerted on the patterns is being reduced, the liquid can be removed from the one major surface of the substrate. In this way, it is possible to dry the substrate while effectively suppressing the collapse of the patterns.

In a preferred embodiment of the invention, the substrate processing apparatus further includes a ground connection unit for providing a ground connection to the substrate held in the substrate holding unit and that can switch between the provision of the ground connection of the substrate and the release of the ground connection.

With this arrangement, it is possible to easily switch between the state where the substrate is grounded and the state where the ground connection of the substrate is released.

The substrate processing apparatus may further include a solid dielectric member that is arranged between the other major surface of the substrate held in the substrate holding unit and the first electrode so as to be opposite the other major surface of the substrate. In this case, it is possible to easily realize a configuration in which the dielectric member is interposed between the other major surface of the substrate and the first electrode.

The solid dielectric member may include a contact surface which makes contact with the other major surface of the substrate. In this case, even when the substrate is contact-supported by the electrode, it is possible to reliably interpose the dielectric member between the other major surface of the substrate and the first electrode. Since the distance between the electrode and the other major surface of the substrate can be kept constant, it is possible to highly accurately control the amount of charge of the one polarity accumulated on the other major surface of the substrate or the amount of charge of the one polarity collected on the one major surface of the substrate.

The substrate processing apparatus may further include an insulating liquid supply unit for supplying, to the one major surface of the substrate, an insulating liquid whose resistivity is equal to or more than the resistivity of pure water.

With this arrangement, the liquid present on the one major surface of the substrate is the insulating liquid, and thus in the second voltage application step, the flowing out of the charge of the one polarity accumulated in the substrate through the liquid present on the one major surface of the substrate can be suppressed or prevented. In this way, in the second voltage application step, a larger amount of charge of the one polarity can be collected on the one major surface of the substrate. Hence, it is possible to increase the repulsive force (coulomb force) exerted between adjacent patterns.

The insulating liquid may include a low surface tension liquid whose surface tension is lower than the surface tension of the pure water. In this case, the surface tension exerted between adjacent patterns is reduced, and thus it is possible to further suppress the collapse of the patterns.

The substrate processing apparatus may further include a first distance changing unit for changing a distance between the first electrode and the other major surface of the substrate.

With this arrangement, it is possible to change the distance between the first electrode and the other major surface of the substrate. In this way, it is possible to adjust the amount of charge of the one polarity collected on the one major surface of the substrate. Consequently, it is possible to adjust the magnitude of the repulsive force (coulomb force) generated between adjacent patterns.

The substrate processing apparatus may further include a second electrode that is arranged on the one major surface of the substrate with a predetermined distance left therebetween and a second power supply device for applying a voltage to the second electrode. In this case, the controller may control the second power supply device so as to further perform, in parallel with the second voltage application step, a third voltage application step of applying a voltage of the other polarity to the second electrode.

With this arrangement, the voltage of the other polarity is applied to the second electrode which is opposite the one major surface of the substrate with the predetermined distance left therebetween, and thus in the second voltage application step, a large amount of charge of the one polarity can be collected on the one major surface of the substrate.

The voltage of the other polarity is applied to the second electrode which is opposite the one major surface of the substrate with the predetermined distance left therebetween, and thus it is possible to facilitate polarization within the patterns.

Hence, it is possible to increase the repulsive force (coulomb force) exerted between adjacent patterns.

The substrate processing apparatus may further include a second distance changing unit for changing a distance between the second electrode and the one major surface of the substrate.

With this arrangement, the distance between the second electrode and the one major surface of the substrate is changed, and thus it is possible to adjust the amount of charge of the one polarity collected on the one major surface of the substrate. In this way, it is possible to adjust the magnitude of the repulsive force (coulomb force) generated between adjacent patterns.

The substrate processing apparatus may further include a plurality of holding pins which contact-support the circumferential edge portion of the substrate and which include a conductive pin formed with a conductive material and an insulating pin formed with an insulating material and a holding pin movement unit for moving the holding pins. In this case, the controller may control the holding pin movement unit so as to perform a first substrate holding step of supporting, in parallel with the charge supply step, the substrate by the holding pins including at least the one conductive pin and a second substrate holding step of supporting, in parallel with the second voltage application step, the substrate by a plurality of the insulating pins without use of the conductive pin.

With this arrangement, in the first substrate holding step, the substrate is supported by the holding pins including at least the one conductive pin. Hence, in the charge supply step, the charge of the one polarity can also be supplied through the conductive pin to the substrate. In the second substrate holding step, the substrate is supported only with the insulating pin. Hence, the substrate can be kept in a state where the ground connection of the substrate is released.

The substrate processing apparatus may further include a conductive liquid supply unit for supplying a conductive liquid to the one major surface of the substrate and a power supply which for applying a voltage to the conductive liquid supplied from the conductive liquid supply unit to the substrate. In this case, the controller may control the conductive liquid supply unit and the power supply so as to perform the charge supply step by providing the charge of the one polarity to the conductive liquid while supplying the conductive liquid to the substrate.

With this arrangement, the charge of the one polarity provided to the conductive liquid is supplied through the conductive liquid to the substrate which makes contact with the conductive liquid. As described above, with the relatively simple method, it is possible to provide the charge of the one polarity to the substrate.

The above-described objects, features and effects in the present invention or still other objects, features and effects will be more clarified by the description of preferred embodiments which will be discussed below with reference to accompanying drawings.

BRIEF DESCRIPTION OF DRAWINGS

FIGS. 4A and 4B are enlarged cross-sectional views showing a configuration in the vicinity of a movable pin included in the spin chuck, and FIGS. 4A and 4B show a change in the state of the movable pin included in a first movable pin group as a first opening permanent magnet is raised and lowered.

FIGS. 5A and 5B are enlarged cross-sectional views showing a configuration in the vicinity of a movable pin included in the spin chuck, and FIGS. 5A and 5B show a change in the state of the movable pin included in a second movable pin group as a second opening permanent magnet is raised and lowered.

DESCRIPTION OF EMBODIMENTS

Figure 1:
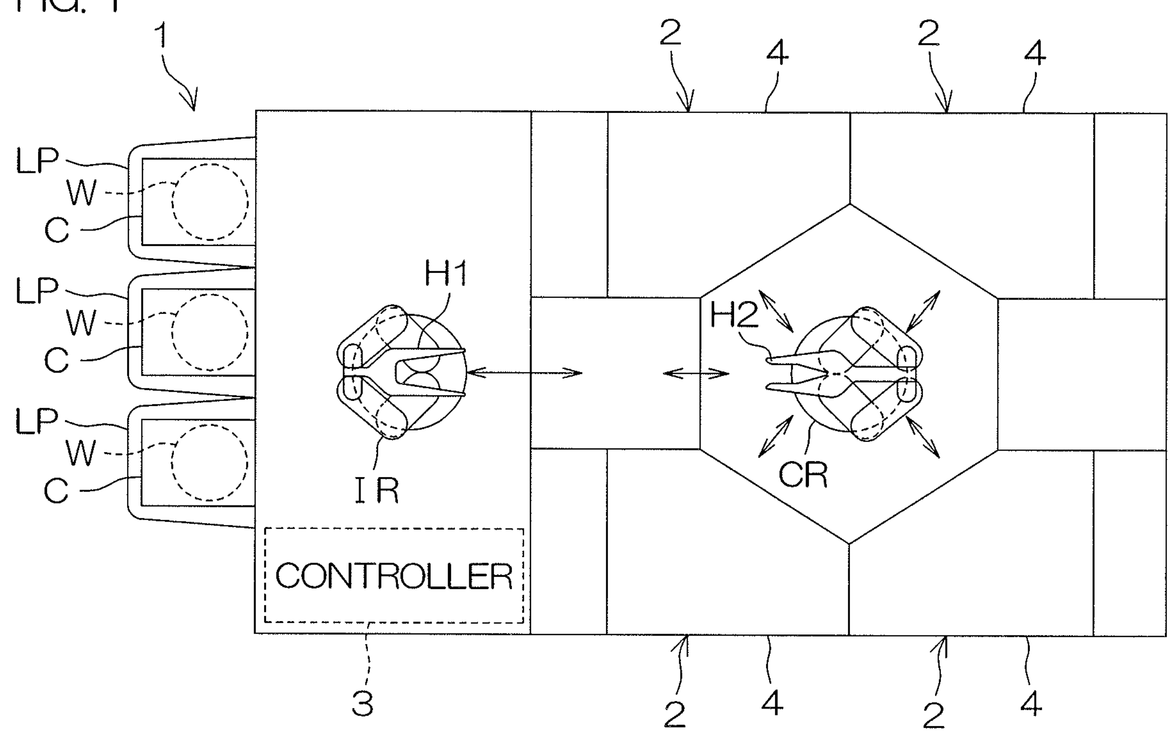
FIG. 1 is a schematic plan view for illustrating the internal layout of a substrate processing apparatus according to a first preferred embodiment of the present invention.
Figure 2:
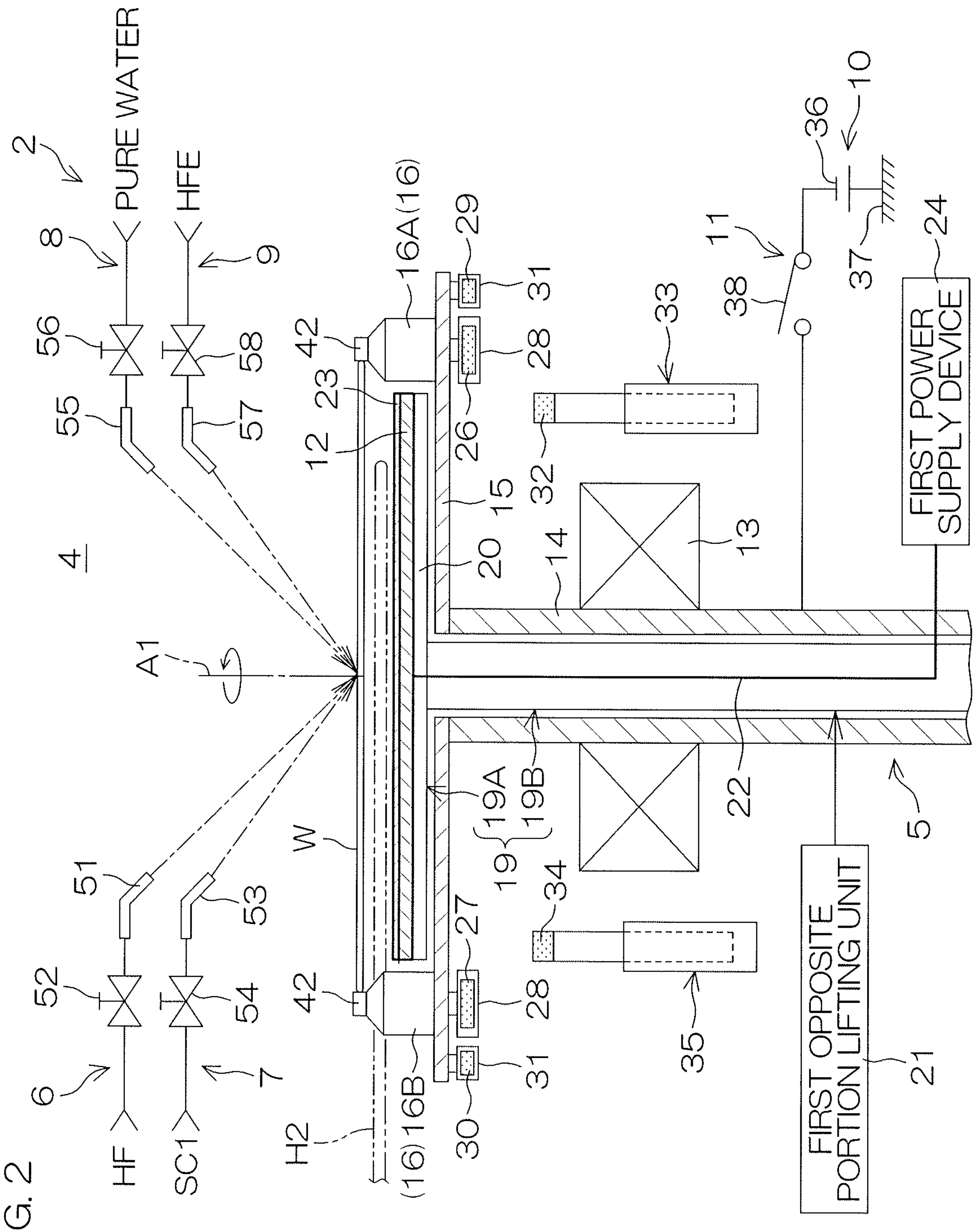
FIG. 2 is a schematic cross-sectional view for illustrating an example of the configuration of a processing unit included in the substrate processing apparatus.
Figure 3:
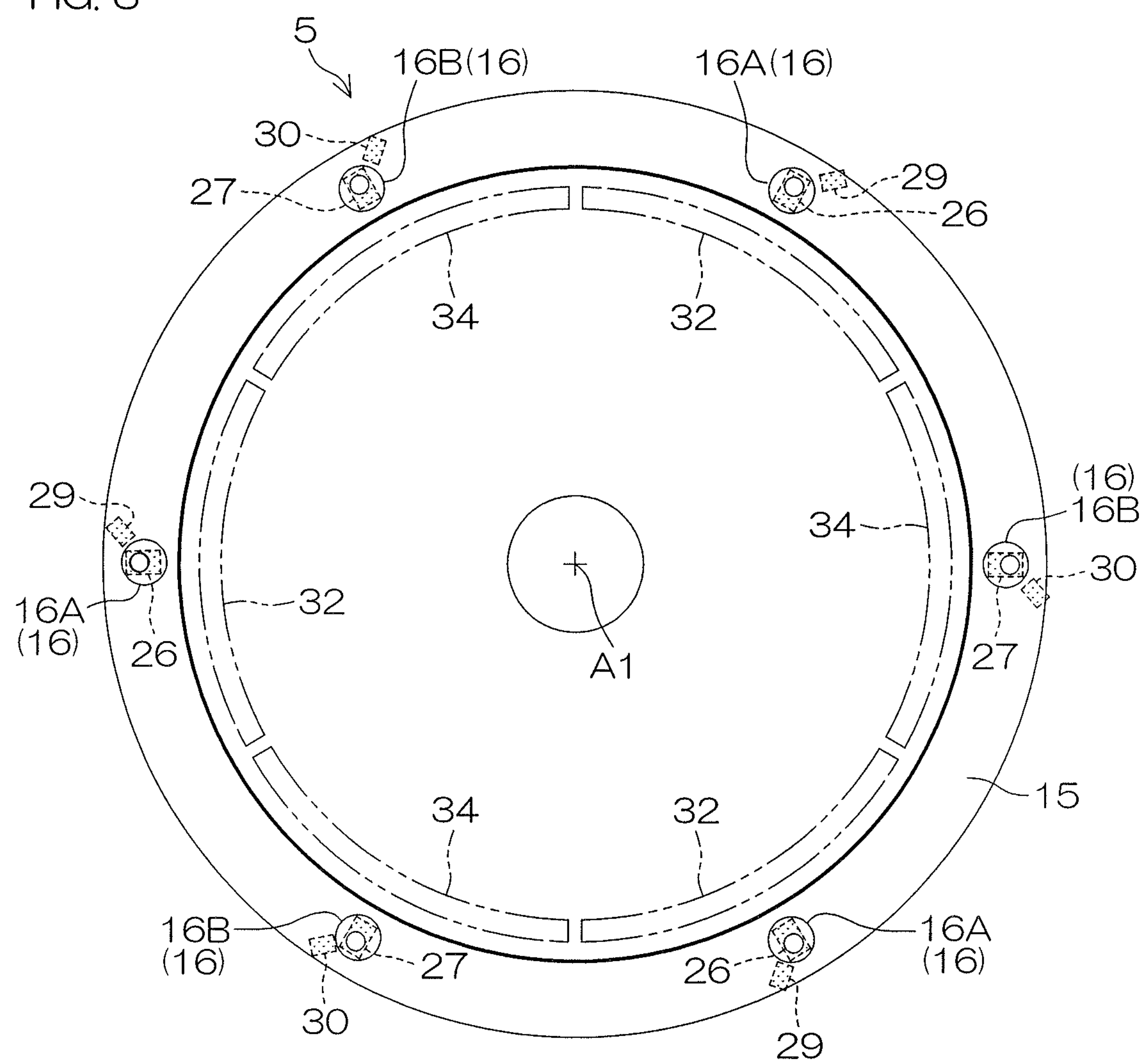
FIG. 3 is a plan view for illustrating a more specific configuration of a spin chuck included in the substrate processing apparatus.

FIG. 1 is a schematic plan view for illustrating the internal layout of a substrate processing apparatus 1 according to a first preferred embodiment of the present invention. FIG. 2 is a schematic cross-sectional view for illustrating an example of the configuration of a processing unit included in the substrate processing apparatus. FIG. 3 is a plan view for illustrating a more specific configuration of a spin chuck 5. FIGS. 4A and 4B are enlarged cross-sectional views showing a configuration in the vicinity of a holding pin 16 included in the spin chuck 5. FIGS. 5A and 5B are enlarged cross-sectional views showing the configuration in the vicinity of the holding pin 16 included in the spin chuck 5.

The substrate processing apparatus 1 is a single substrate processing type device which processes disk-shaped substrates W such as a semiconductor wafer one by one with a processing liquid or a processing gas. The substrate processing apparatus 1 includes a plurality of processing units 2 which process the substrates W with the processing liquid, load ports LP on which carriers C that store the substrates W to be processed in the processing units 2 are placed, transfer robots IR and CR which transfer the substrates W between the load ports LP and the processing units 2 and a controller 3 which controls the substrate processing apparatus 1. The transfer robot IR uses, between the carriers C and the substrate transfer robot CR, a hand H1 so as to transfer the substrates W. The substrate transfer robot CR uses, between the transfer robot IR and the processing units 2, a hand H2 so as to transfer the substrates W. The processing units 2 have, for example, the same configuration.

FIG. 2 is a schematic cross-sectional view for illustrating an example of the configuration of the processing unit 2.

The processing unit 2 includes a box-shaped chamber 4 which has an internal space, the spin chuck (substrate holding unit) 5 which holds one substrate W in a horizontal posture within the chamber 4 and which rotates the substrate W about a vertical rotation axis A1 that passes through the center of the substrate W, a first chemical liquid supply unit 6 which supplies a first chemical liquid (for example, an HF) to the upper surface (one major surface) of the substrate W held in the spin chuck 5, a second chemical liquid supply unit 7 which supplies a second chemical liquid (for example, an SC1 (ammonia hydrogen peroxide mixture)) to the upper surface of the substrate W, a pure water supply unit 8 which supplies pure water (for example, deionized water) serving as a rinse liquid to the upper surface of the substrate W, an insulating liquid supply unit 9 which supplies, to the upper surface of the substrate W, an HFE (hydrofluoroether) serving as an example of an insulating liquid that has a resistivity equal to or more than the resistivity of pure water and that has a surface tension lower than that of pure water, a charge supply unit 10 which supplies a charge (in the preferred embodiment, a negative charge) of one of a positive polarity and a negative polarity to the substrate W held in the spin chuck 5, a ground connection unit 11 which provides a ground connection to the substrate W held in the spin chuck 5, a first electrode 12 which is arranged through a dielectric member on the lower surface (the other major surface) of the substrate W held in the spin chuck 5, a first power supply device 24 which applies a voltage to the first electrode 12 and a tubular processing cup (unillustrated) which surrounds the spin chuck 5.

The configuration of the spin chuck 5 will be described with reference to FIGS. 2 to 5B.

As shown in FIG. 2, the spin chuck 5 includes a spin base 15 which can be rotated about the rotation axis A1 along a vertical direction. A metallic rotation shaft 14 which serves as an orbital shaft is fixed to the lower surface of the rotation center of the spin base 15. The rotation shaft 14 is a hollow shaft, extends along the vertical direction and is configured to rotate about the rotation axis A1 by receiving a driving force from a spin motor (drying unit) 13.

As shown in FIG. 2, the spin chuck 5 further includes a plurality of (in the preferred embodiment, six) holding pins 16 which are provided at substantially regular intervals on a circumferential edge portion of the upper surface of the spin base 15 along a circumferential direction. The individual holding pins 16 hold the substrate W horizontally at a substrate holding height a certain distance apart upward from the spin base 15 which has a substantially horizontal upper surface. In the preferred embodiment, all of the holding pins 16 included in the spin chuck 5 are movable pins in which a contact portion (an upper shaft portion 42 in FIG. 4A and the like) that makes contact with the circumferential edge portion of the substrate W can be moved.

As shown in FIG. 3, the individual holding pins 16 are arranged at regular intervals on the circumferential edge portion of the upper surface of the spin base 15 along the circumferential direction. The six holding pins 16 are set such that in each common group of three holding pins 16 which are not adjacent to each other, the magnetic pole directions of corresponding drive permanent magnets 26 and 27 are the same. In other words, the six holding pins 16 include three holding pins (insulating pins, hereinafter referred to as first holding pins 16A are used as first holding pins 16A) 16A included in a first movable pin group and three holding pins (conductive pins, hereinafter referred to as second holding pins 16B are used as second holding pins 16B) 16B included in a second movable pin group. The magnetic pole direction of the first drive permanent magnets 26 corresponding to the three first holding pins 16A differs from the magnetic pole direction of the second drive permanent magnets 27 corresponding to the three second holding pin 16B with respect to a direction orthogonal to a rotation axis A2. The first holding pins 16A and the second holding pins 16B are alternately arranged in the circumferential direction of the spin base 15. When focusing on the first movable pin group, the three first holding pins 16A are arranged at regular intervals (at intervals of 120°). When focusing on the second movable pin group, the three second holding pins 16B are arranged at regular intervals (at intervals of 120°).

As shown in FIGS. 4A to 5B, each of the holding pins 16 includes a lower shaft portion 41 which is coupled to the spin base 15 and the upper shaft portion 42 which is integrally formed with the upper end of the lower shaft portion 41, and the lower shaft portion 41 and the upper shaft portion 42 each are formed in the shape of a cylinder. The upper shaft portion 42 is provided eccentrically from the center axis of the lower shaft portion 41. A front surface which connects together the upper end of the lower shaft portion 41 and the lower end of the upper shaft portion 42 forms a tapered surface 43 which descends from the upper shaft portion 42 toward the circumferential surface of the lower shaft portion 41.

The first holding pin 16A is a so-called insulating pin which is formed with an insulating material. In the preferred embodiment, at least one of the lower shaft portion 41, the upper shaft portion 42, the tapered surface 43 and a support shaft 45 are formed with an insulating material. In particular, the upper shaft portion 42 which makes contact with the circumferential edge portion of the substrate W is preferably formed with an insulating material.

The second holding pin 16B is a so-called insulating conductive pin which is formed with a conductive material. All of the lower shaft portion 41, the upper shaft portion 42, the tapered surface 43, the support shaft 45 and a bearing 44 is formed with a conductive material.

As shown in FIGS. 4A to 5B, each of the holding pins 16 is coupled to the spin base 15 such that the lower shaft portion 41 can be rotated about the rotation axis A2 which is coaxial with the center axis thereof. More specifically, on the lower end portion of the lower shaft portion 41, the support shaft 45 is provided which is supported with respect to the spin base 15 through the bearing 44. A magnet holding member 28 which holds the first drive permanent magnet 26 or the second drive permanent magnet 27 is coupled to the lower end of the support shaft 45. For example, the first and second drive permanent magnets 26 and 27 are arranged such that the magnetic pole direction is directed in a direction orthogonal to the rotation axis A2 of the holding pin 16. The first drive permanent magnet 26 is a drive permanent magnet corresponding to the first holding pin 16A. The second drive permanent magnet 27 is a drive permanent magnet corresponding to the second holding pin 16B. The first drive permanent magnet 26 and the second drive permanent magnet 27 are provided so as to have the same magnetic pole directions opposite to each other with respect to the direction orthogonal to the rotation axis A2 in a state where an external force is not applied to the holding pins 16 corresponding to the drive permanent magnets 26 and 27. The first drive permanent magnets 26 and the second drive permanent magnets 27 are alternately arranged with respect to the circumferential direction of the spin base 15.

In the spin base 15, the same number of closing permanent magnets 29 and 30 as the holding pins 16 are provided. The closing permanent magnets 29 and 30 are provided so as to respectively correspond to the holding pins 16, and are arranged adjacent to the corresponding holding pins 16. In the preferred embodiment, as shown in FIG. 3, the closing permanent magnets 29 and 30 are arranged around the holding pins 16 so as to be displaced in a direction away from the rotation axis A1 with respect to the center position of the holding pins 16 in plan view. The closing permanent magnets 29 and 30 are stored in magnet holding members 31 provided adjacent to the corresponding magnet holding members 28.

The closing permanent magnets 29 and 30 include three first closing permanent magnets 29 corresponding to the first holding pins 16A and three second closing permanent magnets 30 corresponding to the second holding pins 16B. In other words, the first closing permanent magnets 29 correspond to the first drive permanent magnets 26, and the second closing permanent magnets 30 correspond to the second drive permanent magnets 27. The first closing permanent magnets 29 and the second closing permanent magnets 30 are alternately arranged with respect to the circumferential direction of the spin base 15. The first closing permanent magnets 29 and the second closing permanent magnets 30 are provided such that they cannot be raised and lowered with respect to the spin base 15.

As described previously, the first drive permanent magnet 26 and the second drive permanent magnet 27 are provided so as to have the same magnetic pole directions opposite to each other with respect to the direction orthogonal to the rotation axis A2. The first closing permanent magnets 29 and the second closing permanent magnets 30 are provided so as to apply magnetic forces to the corresponding drive permanent magnets 26 and 27 and to thereby bias the upper shaft portions 42 of the corresponding holding pins 16 to holding positions. Hence, the first closing permanent magnet 29 and the second closing permanent magnet 30 are also provided so as to have the same magnetic pole directions opposite to each other with respect to the direction orthogonal to the rotation axis A2.

The first drive permanent magnet 26 receives an attractive magnetic force from the first closing permanent magnet 29 so as to move the upper shaft portion 42 to the holding position close to the rotation axis A1. In other words, the first holding pin 16A is biased by the attractive magnetic force of the first closing permanent magnet 29 to the holding position.

The second drive permanent magnet 27 receives an attractive magnetic force from the second closing permanent magnet 30 so as to move the upper shaft portion 42 to the holding position close to the rotation axis A1. In other words, the second holding pin 16B is biased by the attractive magnetic force of the second closing permanent magnet 30 to the holding position. Hence, when the drive permanent magnets 26 and 27 do not receive attractive magnetic forces from opening permanent magnets 32 and 34 which will be described below, the holding pins 16 are located in opening positions away from the rotation axis A1.

As shown in FIG. 2, below the spin base 15, the first opening permanent magnets 32 and the second opening permanent magnets 34 are provided. The magnetic pole directions of the first opening permanent magnet 32 and the second opening permanent magnet 34 are both along an up/down direction but are opposite to each other. When the upper surface of the first opening permanent magnet 32 has, for example, an N pole, the upper surface of the second opening permanent magnet 34 has an S pole which is the opposite polarity.

As shown in FIG. 3, in the preferred embodiment, three first opening permanent magnets 32 and three second opening permanent magnets 34 are provided. The three first opening permanent magnets 32 and the three second opening permanent magnets 34 are alternately arranged, in plan view, with respect to the circumferential direction of the spin base 15.

As shown in FIG. 3, the three first opening permanent magnets 32 are formed in the shape of arcs about the rotation axis A1, and are arranged at the same height and spaced in the circumferential direction of the spin base 15. The three first opening permanent magnets 32 have the same specifications and are arranged at regular intervals in the circumferential direction on the circumference which is coaxial with the rotation axis A1. The individual first opening permanent magnets 32 are arranged along a plane (horizontal plane) orthogonal to the rotation axis A1.

As shown in FIG. 3, the length (angle) of each of the first opening permanent magnets 32 in the circumferential direction is about 60°. A first lifting unit 33 which raises or lowers the first opening permanent magnets 32 at one time is coupled to the first opening permanent magnets 32. The first lifting unit 33 includes, for example, a cylinder which is provided so as to be expandable in the up/down direction, and is supported by the cylinder. The first lifting unit 33 may be formed with an electric motor. The first lifting unit 33 may individually raise and lower the first opening permanent magnets 32.

The first opening permanent magnet 32 is a magnet which generates an attractive magnetic force with respect to the first drive permanent magnet 26 so as to bias, with the attractive magnetic force, the first holding pin 16A to the opening position. In a state where the first opening permanent magnet 32 is arranged in an upper position in which the magnetic pole is close to the first drive permanent magnet 26 in the up/down direction and where the first opening permanent magnet 32 is opposite the first drive permanent magnet 26 in a lateral direction, the magnetic force (attractive magnetic force) acts between the first opening permanent magnet 32 and the first drive permanent magnet 26.

As shown in FIG. 3, the three second opening permanent magnets 34 are formed in the shape of arcs about the rotation axis A1, and are arranged at the same height and spaced in the circumferential direction of the spin base 15. The three second opening permanent magnets 34 have the same specifications and are arranged at regular intervals in the circumferential direction on the circumference which is coaxial with the rotation axis A1. The individual second opening permanent magnets 34 are arranged along a plane (horizontal plane) orthogonal to the rotation axis A1.

As shown in FIG. 3, the length (angle) of each of the second opening permanent magnets 34 in the circumferential direction is about 60°. A second lifting unit 35 which raises or lowers the second opening permanent magnets 34 at one time is coupled to the second opening permanent magnets 34. The second lifting unit 35 includes, for example, a cylinder which is provided so as to be expandable in the up/down direction, and is supported by the cylinder. The second lifting unit 35 may be formed with an electric motor. The second lifting unit 35 may individually raise and lower the second opening permanent magnets 34.

The second opening permanent magnet 34 is a magnet which generates an attractive magnetic force with respect to the second drive permanent magnet 27 so as to bias, with the attractive magnetic force, the second holding pin 16B to the opening position. In a state where the second opening permanent magnet 34 is arranged in an upper position in which the magnetic pole is close to the second drive permanent magnet 27 in the up/down direction and where the second opening permanent magnet 34 is opposite the second drive permanent magnet 27 in a lateral direction, the magnetic force (attractive magnetic force) acts between the second opening permanent magnet 34 and the second drive permanent magnet 27.

As shown in FIG. 2, the first opening permanent magnet 32 and the second opening permanent magnet 34 are raised and lowered with the first lifting unit 33 and the second lifting unit 35, respectively. Hence, the first opening permanent magnet 32 and the second opening permanent magnet 34 can be raised and lowered independently of each other.

As shown in FIG. 2, the charge supply unit 10 includes a switch 38 and a power supply 36 (direct-current power supply). The rotation shaft 14 is connected through the switch 38 to the power supply 36. The power supply 36 is connected to the switch 38 so as to be able to apply, to the rotation shaft 14, a direct-current voltage of one of a positive polarity and a negative polarity (for example, a negative polity).

As described previously, the second holding pin 16B is formed with a conductive material, and the spin base 15 and the bearing 44 are formed with a metallic material. Hence, the second holding pin 16B is electrically connected to the metallic rotation shaft 14 through a conductive path which passes through the spin base 15 and the bearing 44. The second holding pin 16B contact-supports the circumferential edge portion of the substrate W, and the rotation shaft 14 is connected through the switch 38 to the power supply 36. Hence, when the switch 38 is brought into a conductive state, the direct-current voltage of one polarity (negative polity) from the power supply 36 is applied from the rotation shaft 14 through the conductive path to the substrate W via the second holding pin 16B. In this way, the charge (negative charge) of the one polarity is supplied to the substrate W. In other words, the charge supply unit 10 includes, in addition to the switch 38, the power supply 36 and the like, the second holding pins 16B, the rotation shaft 14, the spin base 15 and the bearings 44.

As shown in FIG. 2, the ground connection unit 11 switches between a state where the substrate W held in the spin chuck 5 is grounded and a state where the ground connection of the substrate W is released. The ground connection unit 11 includes a ground structure 37 and the switch 38. In the preferred embodiment, the ground structure 37 also serves as a ground for the power supply 36, and the switch 38 functions not only as part of the charge supply unit 10 but also as part of the ground connection unit 11.

In the spin chuck 5, a structure which grounds the substrate W is only the ground structure 37, and no other structure is provided. Hence, when the switch 38 is brought into an open state, the application of the direct-current voltage from the power supply 36 to the substrate W is stopped, and moreover, the conductive state of the rotation shaft 14 (the spin base 15) and the ground structure 37 is released, with the result that the ground connection of the substrate W is removed.

As shown in FIG. 2, the processing unit 2 further includes an opposite member 19 which is opposite the lower surface (the other major surface) of the substrate W. The opposite member 19 includes a disk-shaped first opposite portion 19A which is arranged between the substrate W held in the spin chuck 5 and the spin base 15 and a support portion 19B which supports the first opposite portion 19A in a horizontal posture. The first opposite portion 19A includes an upper surface which is flat and circular, a lower surface which is flat and circular and an outer circumferential surface which has a smaller diameter than the substrate W.

In the preferred embodiment, the first opposite portion 19A includes a main body portion 20 which is held in a horizontal posture and which is formed in the shape of a disk, the first electrode 12 which is arranged on the upper surface of the main body portion 20 and which is formed in the shape of a plate and a solid dielectric member 23 which covers the upper surface of the first electrode 12 and which is formed in the shape of a thin film. In other words, the solid dielectric member 23 forms the upper surface of the first opposite portion 19A.

The first electrode 12 of the first opposite portion 19A is formed with a conductive material such as a metal. The first electrode 12 includes a pair of a positive pole and a negative pole. A voltage applied to the first electrode 12 falls within, for example, a range of minus several kilovolts to plus serval kilovolts. The radius of the first electrode 12 is smaller than that of the substrate W. A difference between the radius of the first electrode 12 and the radius of the substrate W is small.

The solid dielectric member 23 of the first opposite portion 19A is prepared with a synthetic resin (for example, polyimide, PVC (poly-vinyl chloride) or PVA (polyvinyl alcohol)) or an insulating material such as ceramic. The outside diameter of the solid dielectric member 23 is smaller than that of the substrate W. A difference between the radius of the solid dielectric member 23 and the radius of the substrate W is small. As described above, the difference between the radius of the solid dielectric member 23 and the radius of the substrate W is small, and thus the upper surface of the solid dielectric member 23 is opposite a substantially entire region of the lower surface of the substrate W.

The main body portion 20 may be formed with the same material as the solid dielectric member 23 or may be formed with a material other than the material.

The support portion 19B extends downward from the center portion of the first opposite portion 19A along the rotation axis A1, and is fixed to the lower surface of the first opposite portion 19A. The support portion 19B may be formed integrally with the main body portion 20 or may be a member different from the main body portion 20. The support portion 19B is inserted into the spin base 15 and the rotation shaft 14. The support portion 19B does not make contact with the spin base 15 and the rotation shaft 14. The support portion 19B is provided such that the support portion 19B cannot be rotated with respect to the chamber 4 and that the support portion 19B can be raised and lowered with respect to the chamber 4. In other words, even when the spin chuck 5 is rotated, the opposite member 19 is not rotated. Hence, when the spin chuck 5 rotates the substrate W, the substrate W and the opposite member 19 are relatively rotated about the rotation axis A1.

Figure 12A:
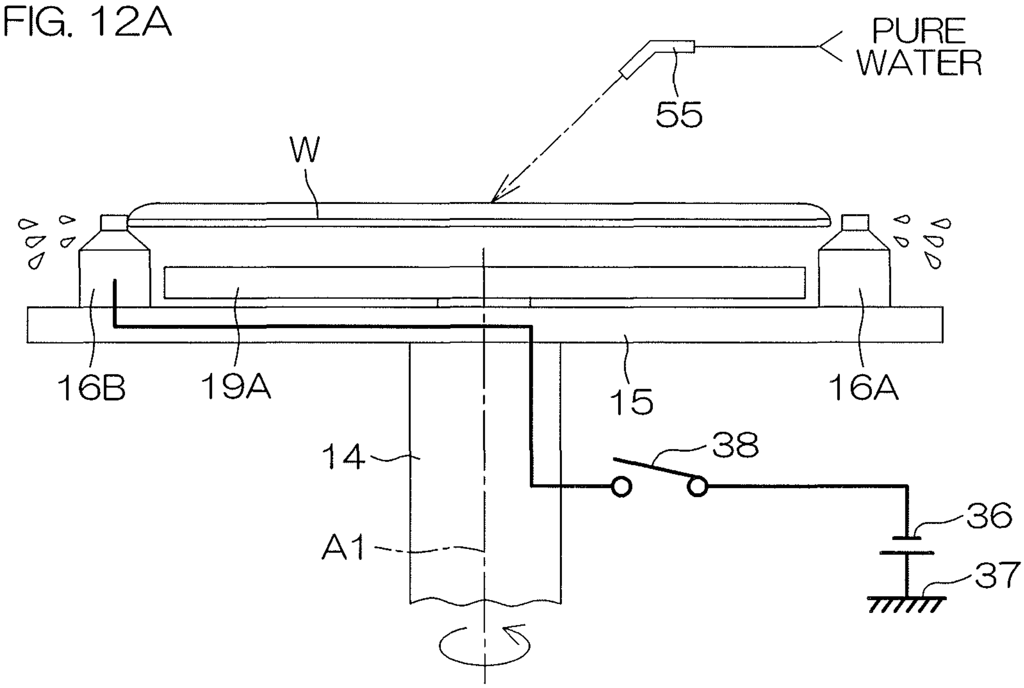
FIGS. 12A and 12B are schematic views for illustrating the first substrate processing example.

As shown in FIG. 2, the processing unit 2 further includes a first opposite portion lifting unit (first distance changing unit) 21 which is coupled to the first opposite portion 19A through the support portion 19B. The first opposite portion lifting unit 21 raises and lowers the first opposite portion 19A between an upper position (position shown in FIG. 12B and the like) in which the upper surface of the first opposite portion 19A is close to the lower surface of the substrate W and a lower position (position shown in FIG. 12A and the like) in which the upper surface of the first opposite portion 19A is away from the lower surface of the substrate W.

In a state where the first opposite portion 19A is arranged in the upper position, the upper surface of the first opposite portion 19A (the upper surface of the solid dielectric member 23) is arranged below the substrate W grasped by the holding pins 16 so as to be parallel to and opposite the lower surface of the substrate W. In this state, the upper surface of the first opposite portion 19A is close to the lower surface of the substrate W grasped by the holding pins 16. In other words, the first electrode 12 is arranged on the lower surface of the substrate W through the solid dielectric member 23 and air which is a dielectric material. In this state, the outer circumferential surface of the first opposite portion 19A is surrounded by the holding pins 16.

As shown in FIG. 2, the first power supply device 24 applies a direct-current voltage to the first electrode 12. The first power supply device 24 is connected through a wire 22 to the first electrode 12. Part of the wire 22 is arranged within the first opposite portion 19A and the support portion 19B. The first power supply device 24 is connected to an electrode application power supply (unillustrated, a power supply separate from the power supply 36). The voltage of the power supply is applied to the first electrode 12 through the first power supply device 24 and the wire 22.

The first power supply device 24 includes an on/off portion which switches between the application of the voltage to the first electrode 12 and the stop thereof, a voltage changing portion which changes the magnitude of the voltage applied to the first electrode 12 and a polarity changing portion which changes the polarity of the voltage applied to the first electrode 12 between a positive polarity and a negative polarity.

As shown in FIG. 2, the first chemical liquid supply unit 6 includes a first chemical liquid nozzle 51. The first chemical liquid nozzle 51 is, for example, a straight nozzle which discharges a liquid in a continuous flow state, and is fixedly arranged above the spin chuck 5 with its discharge port directed toward the center portion of the upper surface of the substrate W. The first chemical liquid from a first chemical liquid supply source is supplied to the first chemical liquid nozzle 51 through a first chemical liquid valve 52. When the first chemical liquid valve 52 is opened, the first chemical liquid in the continuous flow state supplied to the first chemical liquid nozzle 51 is discharged from the discharge port set at the tip end of the first chemical liquid nozzle 51. When the first chemical liquid valve 52 is closed, the discharge of the first chemical liquid to the first chemical liquid nozzle 51 is stopped.

As shown in FIG. 2, the second chemical liquid supply unit 7 includes a second chemical liquid nozzle 53. The second chemical liquid nozzle 53 is, for example, a straight nozzle which discharges a liquid in a continuous flow state, and is fixedly arranged above the spin chuck 5 with its discharge port directed toward the center portion of the upper surface of the substrate W. The second chemical liquid from a second chemical liquid supply source is supplied to the second chemical liquid nozzle 53 through a second chemical liquid valve 54. When the second chemical liquid valve 54 is opened, the second chemical liquid in the continuous flow state supplied to the second chemical liquid nozzle 53 is discharged from the discharge port set at the tip end of the second chemical liquid nozzle 53. When the second chemical liquid valve 54 is closed, the discharge of the second chemical liquid to the second chemical liquid nozzle 53 is stopped.

As shown in FIG. 2, the pure water supply unit 8 includes a pure water nozzle 55. The pure water nozzle 55 is, for example, a straight nozzle which discharges a liquid in a continuous flow state, and is fixedly arranged above the spin chuck 5 with its discharge port directed toward the center portion of the upper surface of the substrate W. The pure water from a pure water supply source is supplied to the pure water nozzle 55 through a pure water valve 56. When the pure water valve 56 is opened, the pure water in the continuous flow state supplied to the pure water nozzle 55 is discharged from the discharge port set at the tip end of the pure water nozzle 55. When the pure water valve 56 is closed, the discharge of the pure water to the pure water nozzle 55 is stopped.

As shown in FIG. 2, the insulating liquid supply unit 9 includes an insulating liquid nozzle 57. The insulating liquid nozzle 57 is, for example, a straight nozzle which discharges a liquid in a continuous flow state, and is fixedly arranged above the spin chuck 5 with its discharge port directed toward the center portion of the upper surface of the substrate W. The insulating liquid (HFE) from an insulating liquid supply source is supplied to the insulating liquid nozzle 57 through an insulating liquid valve 58. When the insulating liquid valve 58 is opened, the insulating liquid in the continuous flow state supplied to the insulating liquid nozzle 57 is discharged from the discharge port set at the tip end of the insulating liquid nozzle 57. When the insulating liquid valve 58 is closed, the discharge of the insulating liquid to the insulating liquid nozzle 57 is stopped.

The first chemical liquid nozzle 51, the second chemical liquid nozzle 53, the pure water nozzle 55 and the insulating liquid nozzle 57 are respectively not necessarily fixedly arranged with respect to the spin chuck 5, and for example, a so-called scan nozzle form may be adopted in which the nozzle is attached to an arm that can swing within a horizontal plane above the spin chuck 5 and in which the position of the upper surface of the substrate W that is reached by the processing liquid is scanned by the swinging of the arm.

As shown in FIGS. 4A to 5B, the holding pin 16 includes the upper shaft portion 42 in a position which is eccentric from the rotation axis A2. In other words, a center axis B of the upper shaft portion 42 is deviated from the rotation axis A2. Hence, by the rotation of the lower shaft portion 41, the upper shaft portion 42 is displaced between the opening position (see FIGS. 4A and 5A which will be described later) in which (the center axis B) is away from the rotation axis A1 and the holding position (see FIGS. 4B and 5B which will be described later) in which (the center axis B) is close to the rotation axis A1. The upper shaft portion 42 of the holding pin 16 is biased to the opening position by the elastic pressing force of an elastic pressing member (unillustrated) such as a spring. In a state where the holding pin 16 is located in the opening position, a predetermined gap is defined between the holding pin 16 and the circumferential end surface of the substrate W.

FIG. 4A shows a state where the first opening permanent magnet 32 is in the lower position, and FIG. 4B shows a state where the first opening permanent magnet 32 is in the upper position. FIG. 5A shows a state where the second opening permanent magnet 34 is in the lower position, and FIG. 5B shows a state where the second opening permanent magnet 34 is in the upper position.

Even in a state where the angular positions of the first opening permanent magnet 32 and the first drive permanent magnet 26 are aligned, when as shown in FIG. 4A, the first opening permanent magnet 32 is in the lower position, a magnetic force from the first opening permanent magnet 32 does not act on the first drive permanent magnet 26. Hence, the first holding pin 16A is located in the holding position. In this state, the first drive permanent magnet 26 is arranged such that, for example, the N pole is directed inward in the radial direction of the spin base 15 and that the S pole is directed outward in the radial direction of the spin base 15.

In the state shown in FIG. 4, the first opening permanent magnet 32 is raised so as to be arranged in the upper position. The upper surface of the first opening permanent magnet 32 is moved close to the first drive permanent magnet 26, and thus an attractive magnetic force is generated in the first drive permanent magnet 26, with the result that an attractive force is generated between the first drive permanent magnet 26 and the first opening permanent magnet 32. Ina state where the first opening permanent magnet 32 is arranged in the upper position, the magnitude of the attractive magnetic force exerted on the first drive permanent magnet 26 significantly exceeds that of the attractive magnetic force from the first closing permanent magnet 29, and thus the upper shaft portion 42 is moved from the holding position in which the upper shaft portion 42 is close to the rotation axis A1 to the opening position in which the upper shaft portion 42 is away from the rotation axis A1 (see FIG. 2). In this way, the first holding pin 16A is biased to the opening position. In this state, as shown in FIG. 4B, the first drive permanent magnet 26 is arranged such that, for example, the S pole is directed inward in the radial direction of the spin base 15 and that the N pole is directed outward in the radial direction of the spin base 15.

Even in a state where the angular positions of the second opening permanent magnet 34 and the second drive permanent magnet 27 are aligned, when as shown in FIG. 5A, the second opening permanent magnet 34 is in the lower position, a magnetic force from the second opening permanent magnet 34 does not act on the second drive permanent magnet 27. Hence, the second holding pin 16B is located in the holding position. In this state, the second drive permanent magnet 27 is arranged such that, for example, the S pole is directed inward in the radial direction of the spin base 15 and that the N pole is directed outward in the radial direction of the spin base 15.

In the state shown in FIG. 5A, the second opening permanent magnet 34 is raised so as to be arranged in the upper position. The upper surface of the second opening permanent magnet 34 is moved close to the second drive permanent magnet 27, and thus an attractive magnetic force is generated in the second drive permanent magnet 27, with the result that an attractive force is generated between the second drive permanent magnet 27 and the second opening permanent magnet 34. In a state where the second opening permanent magnet 34 is arranged in the upper position, the magnitude of the attractive magnetic force exerted on the second drive permanent magnet 27 significantly exceeds that of the attractive magnetic force from the second closing permanent magnet 30, and thus the upper shaft portion 42 is moved from the holding position in which the upper shaft portion 42 is close to the rotation axis A1 to the opening position in which the upper shaft portion 42 is away from the rotation axis A1 (see FIG. 2). In this way, the second holding pin 16B is biased to the opening position. In this state, as shown in FIG. 5B, the second drive permanent magnet 27 is arranged such that, for example, the N pole is directed inward in the radial direction of the spin base 15 and that the S pole is directed outward in the radial direction of the spin base 15.

Figure 6A:
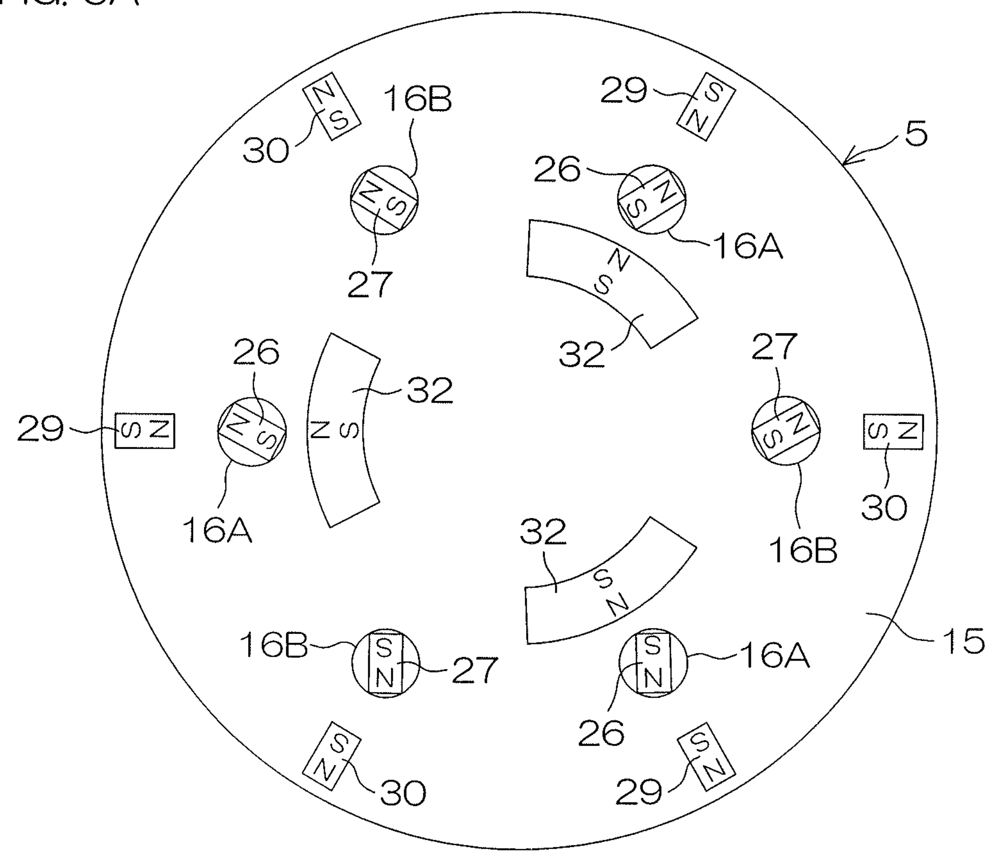
FIG. 6A is a schematic view showing the state of the first movable pin group and the second movable pin group.
Figure 6B:
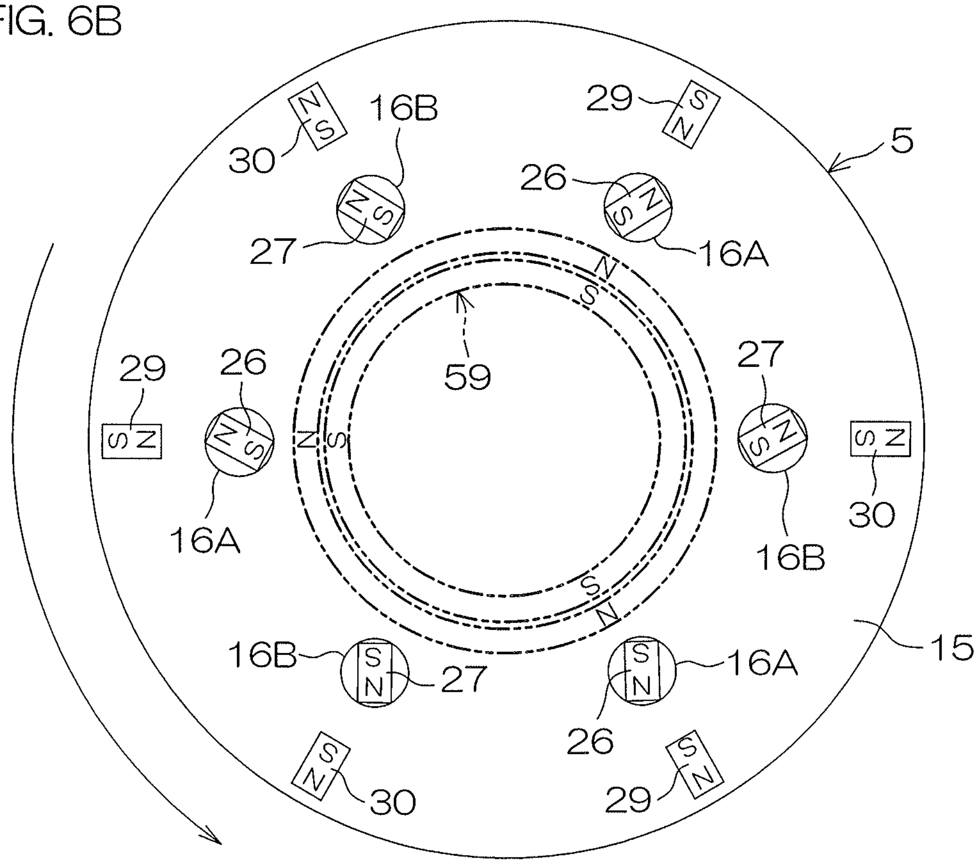
FIGS. 6B and 6C are schematic views showing the state of the first movable pin group and the second movable pin group.
Figure 6C:
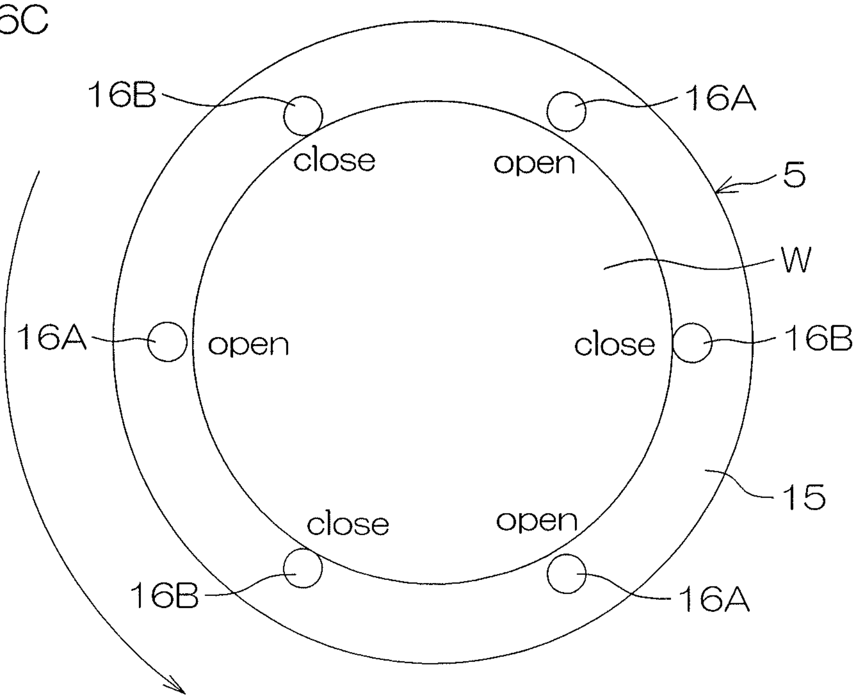
Figure 7A:
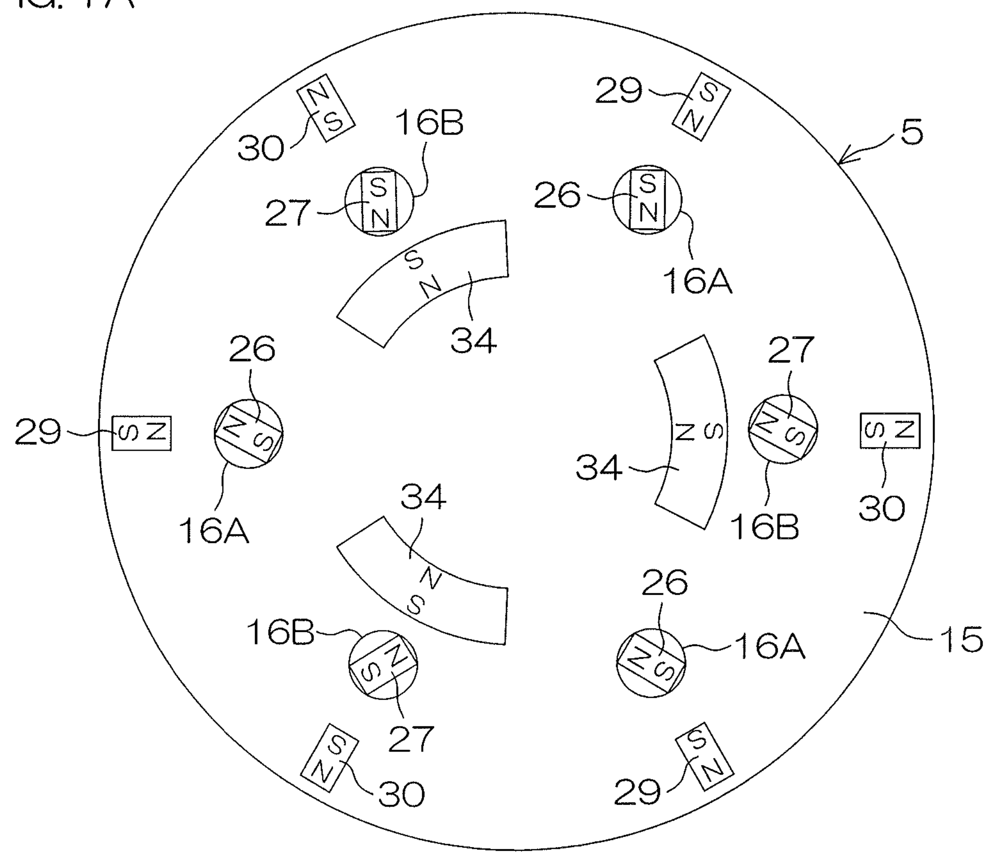
FIG. 7A is a schematic view showing the state of the first movable pin group and the second movable pin group.
Figure 7B:
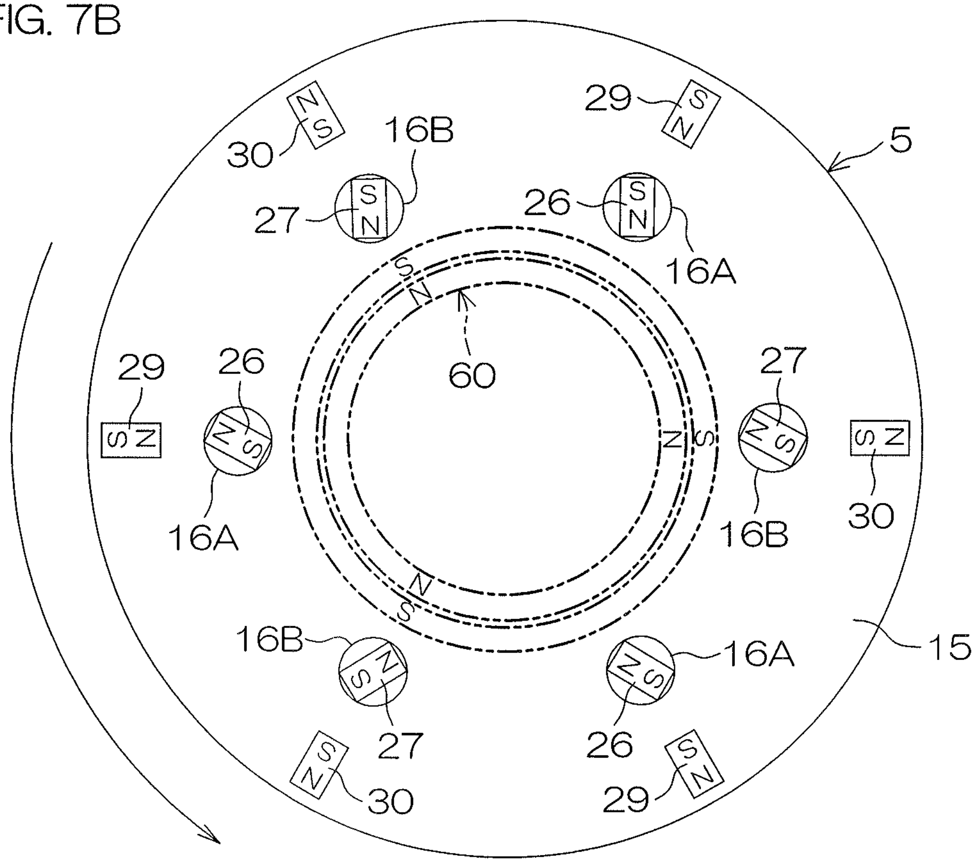
FIGS. 7B and 7C are schematic views showing the state of the first movable pin group and the second movable pin group.
Figure 7C:
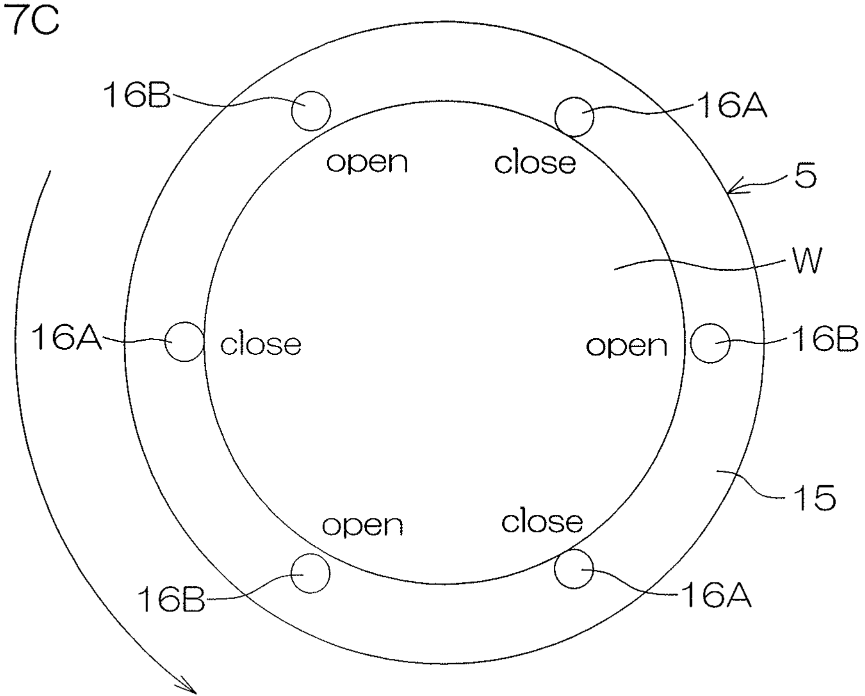

FIGS. 6A to 6C and FIGS. 7A to 7C are schematic views showing the states of the first movable pin group and the second movable pin group. FIGS. 6A, 6B, 7A and 7B show the opening permanent magnets 32 and 34 and the states of the opening permanent magnets 32 and 34, and FIGS. 6C and 7C show the conditions of opening and closing of the holding pins 16.

As described previously, the opening permanent magnets 32 and 34 are arranged in the circumferential direction of the spin base 15 at regular intervals of 60°, and the holding pins 16 are also arranged at regular intervals of 60°. Hence, as shown in FIGS. 6A and 7A, it is possible to create an initial state where the angular positions of the first opening permanent magnets 32 and the first drive permanent magnets 26 are aligned and where the angular positions of the second opening permanent magnets 34 and the second drive permanent magnets 27 are aligned.

FIGS. 6A to 6C show a state where the first opening permanent magnets 32 are arranged in the upper position and where the second opening permanent magnets 34 are arranged in the lower position. In this case, in a state where as shown in FIG. 6A, the spin base 15 is in the initial state and is also in a stationary state, the three first holding pins 16A are arranged in the opening position (open), and the three second holding pins 16B are arranged in the holding position (close).

A state where the spin base 15 is rotated in the state shown in FIG. 6A will be considered. The rotational speed of the spin base 15 is assumed to be a liquid processing speed (for example, about 1000 rpm). In the state of rotation of the spin base 15, a magnetic field generation region 59 (see FIG. 6B) is defined in an annular region through which the drive permanent magnets 26 and 27 that are rotated as the spin base 15 is rotated are passed. The length (angle) of the magnetic field generation region 59 in the circumferential direction is longer than the length (angle) of the corresponding first opening permanent magnet 32 in the circumferential direction. Since the length (angle) of the first opening permanent magnet 32 in the circumferential direction is 60°, and moreover, the three first opening permanent magnets 32 are provided in the circumferential direction of the spin base 15, when the substrate W is rotated at the liquid processing speed (for example, about 1000 rpm), the magnetic field generation region 59 (see FIG. 6B) which is annular in the entire circumference is defined in the annular region through which the drive permanent magnets 26 and 27 that are rotated as the spin base 15 is rotated are passed.

Since the magnetic field generation region 59 (see FIG. 6B) is annular in the entire circumference, regardless of the posture of rotation of the spin base 15, the attractive magnetic forces from the first opening permanent magnets 32 act on the first drive permanent magnets 26. Hence, in the state of rotation of the spin base 15, as shown in FIG. 6C, the three first holding pins 16A are arranged in the opening position (open). The three second holding pins 16B are naturally arranged in the holding position (close). Here, the substrate W is supported by the three second holding pins 16B so as to be satisfactorily rotated.

FIGS. 7A to 7C show a state where the second opening permanent magnets 34 are arranged in the upper position and where the first opening permanent magnets 32 are arranged in the lower position. In this case, in a state where as shown in FIG. 7A, the spin base 15 is in the initial state and is also in a stationary state, the three second holding pins 16B are arranged in the opening position (open), and the three first holding pins 16A are arranged in the holding position (close).

A state where the spin base 15 is rotated in the state shown in FIG. 7A will be considered. The rotational speed of the spin base 15 is assumed to be the liquid processing speed (for example, about 1000 rpm). In the state of rotation of the spin base 15, a magnetic field generation region 60 (see FIG. 7B) is defined in the annular region through which the drive permanent magnets 26 and 27 that are rotated as the spin base 15 is rotated are passed. The length (angle) of the magnetic field generation region 60 in the circumferential direction is longer than the length (angle) of the corresponding second opening permanent magnet 34 in the circumferential direction. Since the length (angle) of the second opening permanent magnet 34 in the circumferential direction is 60°, and moreover, the three second opening permanent magnets 34 are provided in the circumferential direction of the spin base 15, when the substrate W is rotated at the liquid processing speed (for example, about 1000 rpm), the magnetic field generation region 60 (see FIG. 7B) which is annular in the entire circumference is defined in the annular region through which the drive permanent magnets 26 and 27 that are rotated as the spin base 15 is rotated are passed.

Since the magnetic field generation region 60 (see FIG. 7B) is annular in the entire circumference, regardless of the posture of rotation of the spin base 15, the attractive magnetic forces from the second opening permanent magnets 34 act on the second drive permanent magnets 27. Hence, in the state of rotation of the spin base 15, as shown in FIG. 7C, the three second holding pins 16B are arranged in the opening position (open). The three first holding pins 16A are naturally arranged in the holding position (close). Here, the substrate W is supported by the three first holding pins 16A so as to be satisfactorily rotated.

As described above, in the state of rotation of the substrate W, the state where the first opening permanent magnets 32 are arranged in the upper position and where the second opening permanent magnets 34 are arranged in the lower position (see FIGS. 6A to 6C) and the state where the second opening permanent magnets 34 are arranged in the upper position and where the first opening permanent magnets 32 are arranged in the lower position (see FIGS. 7A to 7C) are switched, and thus it is possible to switch between a state (second substrate holding step) where the substrate W is contact-supported by the three first holding pins 16A and a state (first substrate holding step) where the substrate W is contact-supported by the three second holding pins 16B.

Figure 8A:
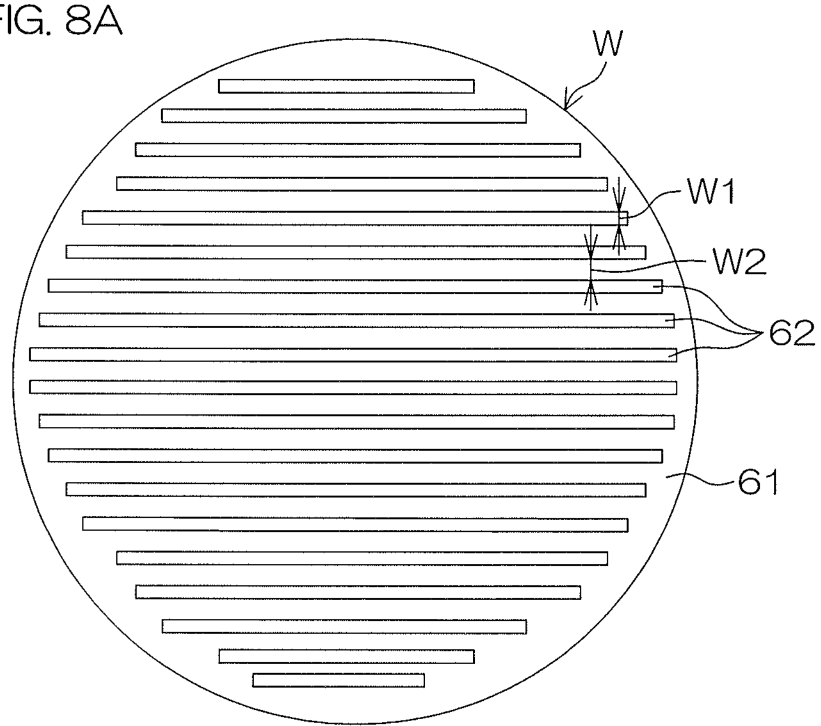
FIG. 8A is a schematic plan view for illustrating an example of a substrate to be processed.
Figure 8B:
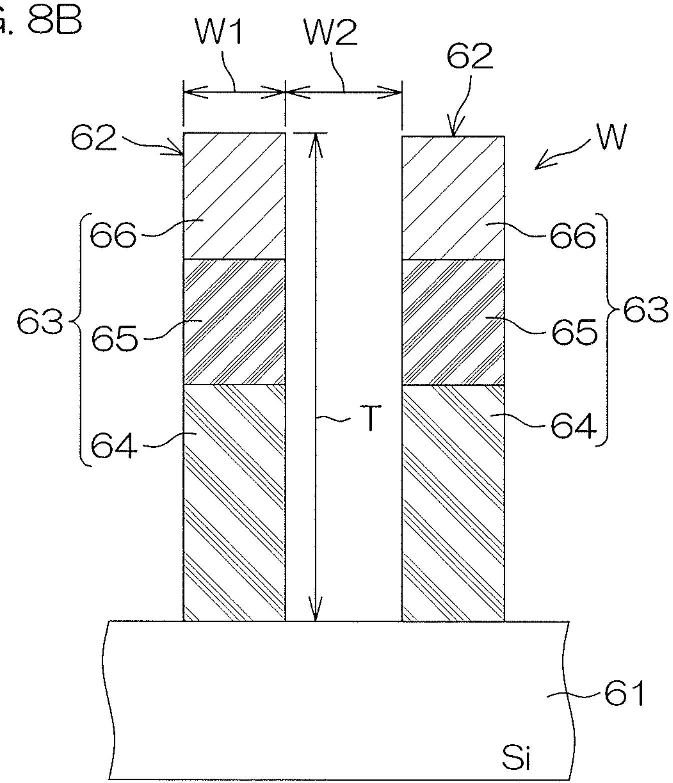
FIG. 8B is a schematic cross-sectional view of part thereof.

FIG. 8A is a schematic plan view for illustrating an example of the substrate W to be processed, and FIG. 8B is a schematic cross-sectional view of part thereof. The substrate W is a substrate in which fine thin film patterns (patterns) 62 are defined on a silicon (Si) substrate 61 (an example of a semiconductor substrate). The thin film patterns 62 may be defined, for example, such that a line width W1 is about 10 nm to 45 nm and that a distance W2 between adjacent patterns is about 10 nm to several micrometers. In actuality, when the silicon substrate 61 on which the thin film patterns 62 having such small dimensions are defined is visually checked, although the thin film patterns 62 having the dimensions shown in FIGS. 8A and 8B cannot be confirmed, for ease of description, FIG. 8A shows an enlarged view of the thin film patterns 62 defined on the substrate W.

The thin film pattern 62 includes at least an insulating film. More specifically, the thin film pattern 62 may be formed of a multilayer film 63. For example, the multilayer film 63 may be arranged by stacking, sequentially from the side of the silicon substrate 61, a first insulating film 64, a second insulating film 65 and a conductive film 66 in layers. The first insulating film 64 and the second insulating film 65 may be silicon oxide films. The conductive film 66 may be an amorphous silicon film into which an impurity for resistance reduction is introduced or may be a metallic film (for example, a metallic wiring film).

The film thickness T of the multilayer film 63 which defines the thin film pattern 62 is, for example, about 50 nm to 5 μm. In the multilayer film 63, for example, an aspect ratio (ratio of the film thickness T to the line width W1) may be about 5 to 500.

Figure 9:
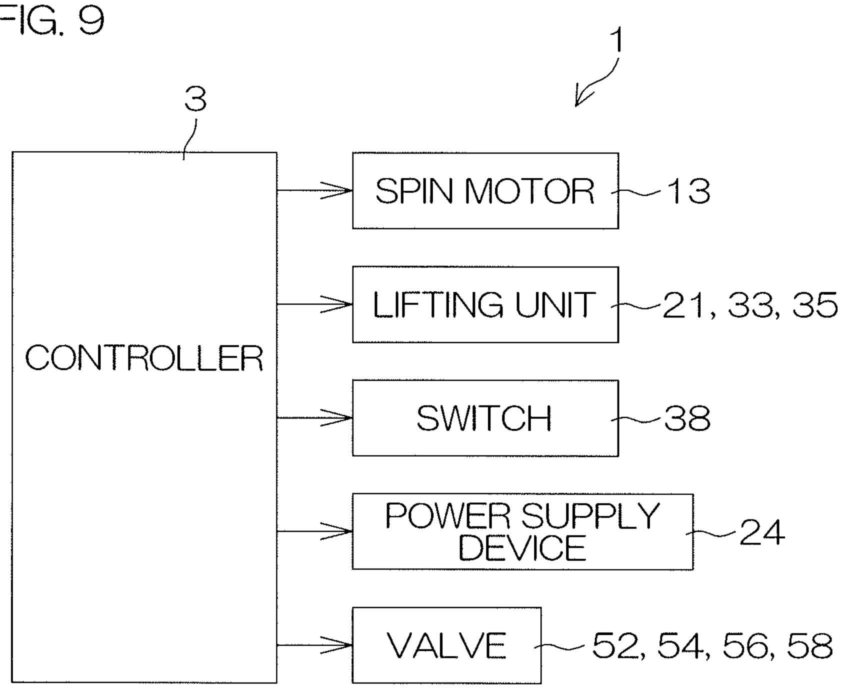
FIG. 9 is a block diagram for illustrating the electrical configuration of a main portion of the substrate processing apparatus.

FIG. 9 is a block diagram for illustrating the electrical configuration of a main portion of the substrate processing apparatus 1.

The controller 3 is formed with, for example, a microcomputer. The controller 3 includes an arithmetic unit such as a CPU, a fixed memory device, a storage unit such as a hard disk drive and an input/output unit. In the storage unit, programs are stored which are executed by the arithmetic unit.

As control targets, the spin motor 13, the first opposite portion lifting unit 21, the first lifting unit 33, the second lifting unit 35, the switch 38, the first power supply device 24 and the like are connected to the controller 3. The controller 3 controls, according to predetermined programs, the operations of the spin motor 13, the first lifting unit 33, the second lifting unit 35, the first opposite portion lifting unit 21 and the like. The controller 3 also opens and closes the switch 38 according to a predetermined program. In the preferred embodiment, by the opening and closing of the switch 38, the direct-current voltage of the one polarity (for example, a negative polarity) is applied to the substrate W, and a state where the substrate W is grounded and a state where the application of the voltage to the substrate W is stopped and where the ground connection of the substrate W is released are switched. The controller 3 also controls, according to predetermined programs, the first power supply device 24 so as to switch between the application of the voltage to the first electrode 12 (see FIG. 2) and the stop thereof, to change the magnitude of the voltage applied to the first electrode 12 and to change the polarity of the voltage applied to the first electrode 12 between a positive polarity and a negative polarity. Furthermore, the controller 3 opens and closes, according to predetermined programs, the first chemical liquid valve 52, the second chemical liquid valve 54, the pure water valve 56, the insulating liquid valve 58 and the like.

Figure 10:
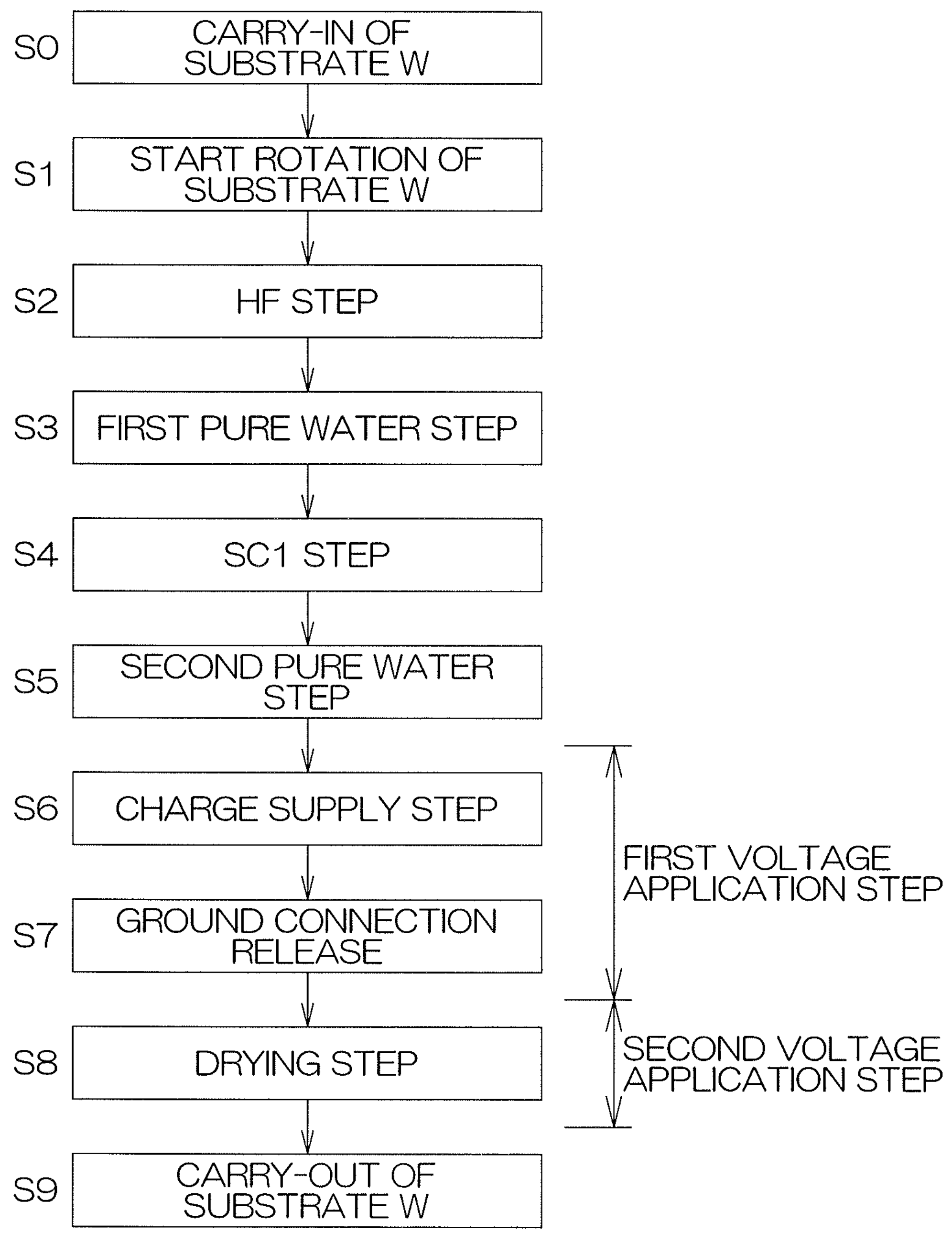
FIG. 10 is a flowchart for illustrating a first substrate processing example which is performed by the processing unit.
Figure 11:
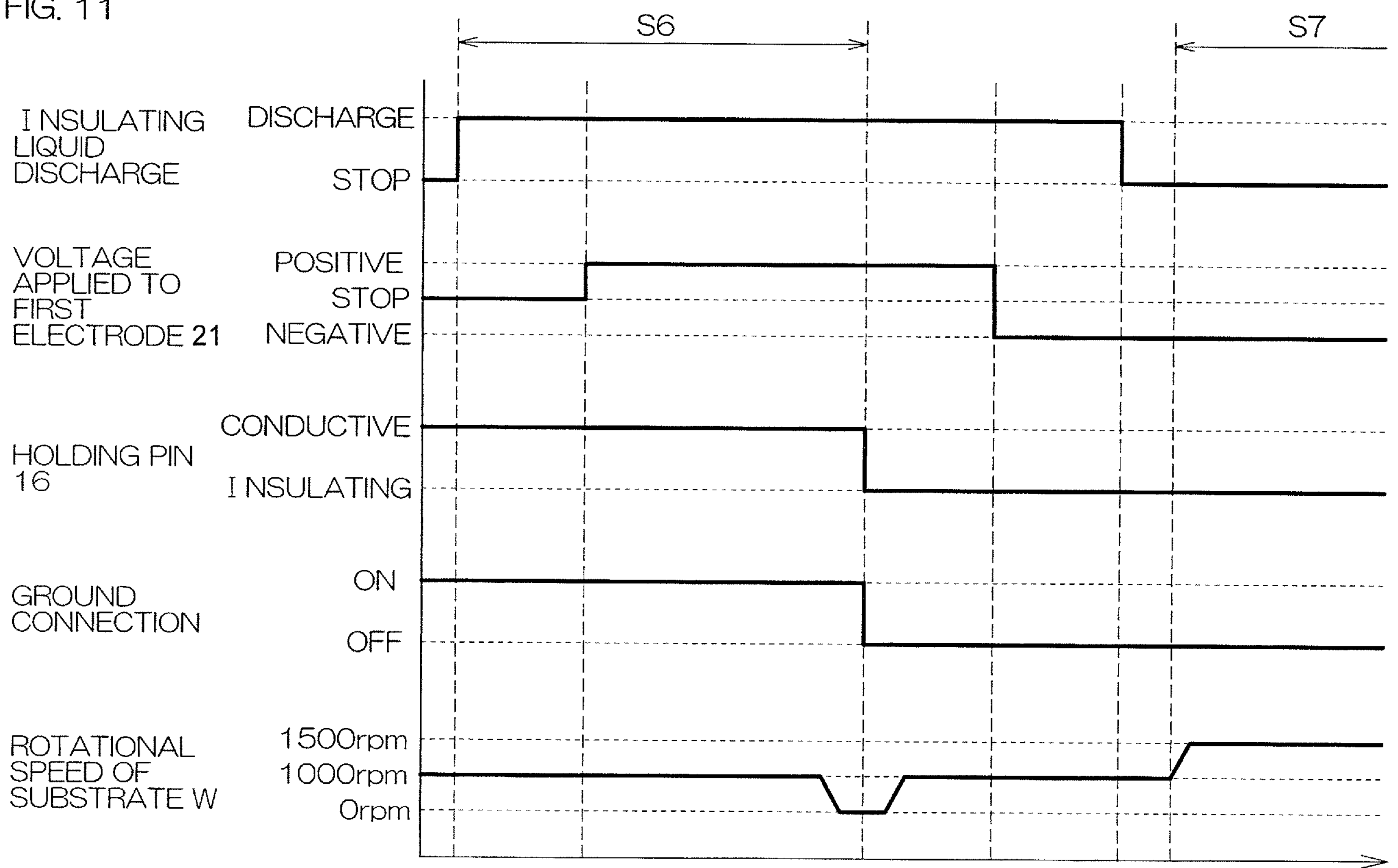
FIG. 11 is a time chart for illustrating the first substrate processing example.

FIG. 10 is a flowchart for illustrating a first substrate processing example which is performed by the processing unit 2. FIG. 11 is a time chart for illustrating the first substrate processing example. FIGS. 12A to 12D are schematic views for illustrating the first substrate processing example. FIGS. 13A and 13B are respectively schematic cross-sectional views for illustrating the states of the front surface of the substrate W in steps shown in FIGS. 12B and 12C. FIG. 13C is a schematic cross-sectional view for illustrating the state of the front surface of the substrate in a drying step shown in FIG. 12D.

The first substrate processing example performed by the processing unit 2 is a washing processing or an etching processing. The first substrate processing example will be described below with reference to FIGS. 1 to 5B and FIGS. 8A to 11. FIGS. 12A to 12D and FIGS. 13A to 13C will be referenced as necessary.

When the first substrate processing example is performed by the processing unit 2, an unprocessed substrate W is carried into the chamber 4 (step S0 in FIG. 10). On the front surface of the substrate W (the surface defined with the thin film patterns 62), the thin film patterns 62 (see FIGS. 8A and 8B) are defined.

Specifically, the controller 3 makes the hand H2 of the substrate transfer robot CR holding the substrate W enter the interior of the chamber 4. In this way, the substrate W is delivered to the spin chuck 5 with its front surface directed upward. Thereafter, the substrate W is held by the spin chuck 5 (substrate holding step). Here, the substrate W is not contact-supported by all of the six holding pins 16, but the substrate W is contact-supported by the three second holding pins 16B (conductive pins). Specifically, the controller 3 arranges the first opening permanent magnets 32 in the upper position and arranges the second opening permanent magnets 34 in the lower position (see FIGS. 6A to 6C), and thus substrate W can be contact-supported by the three second holding pins 16B (conductive pins).

After the substrate W is grasped by the three second holding pins 16B (insulating conductive pins), the controller 3 starts the rotation of the substrate W by the spin motor 13 (step S1 in FIG. 1). The substrate W is raised up to a predetermined liquid processing speed (within a range of about 10 to 1200 rpm, for example, about 1000 rpm), and is kept at the liquid processing speed.

Then, the controller 3 performs a first chemical liquid step (that is, an HF step, step S2 in FIG. 10) of using the first chemical liquid (for example, the HF) so as to process the upper surface of the substrate W. Specifically, the controller 3 opens the first chemical liquid valve 52 so as to discharge the first chemical liquid from the first chemical liquid nozzle 51 toward the center portion of the upper surface of the substrate W. The first chemical liquid supplied to the center portion of the upper surface of the substrate W receives a centrifugal force generated by the rotation of the substrate W so as to flow on the upper surface of the substrate W toward the circumferential edge portion of the substrate W. In this way, the first chemical liquid spreads over the entire region of the upper surface of the substrate W, and thus the entire region of the upper surface of the substrate W is processed by the first chemical liquid.

When a predetermined period elapses after the start of discharge of the first chemical liquid, the first chemical liquid step (S2) is completed. Specifically, the controller 3 closes the first chemical liquid valve 52 so as to stop the discharge of the first chemical liquid from the first chemical liquid nozzle 51.

Then, the controller 3 performs a first pure water step (step S3 in FIG. 10) of washing away the first chemical liquid adhered to the upper surface of the substrate W. Specifically, the controller 3 opens the pure water valve 56 so as to discharge the pure water from the pure water nozzle 55 toward the center portion of the upper surface of the substrate W. The pure water supplied to the center portion of the upper surface of the substrate W receives the centrifugal force generated by the rotation of the substrate W so as to flow on the upper surface of the substrate W toward the circumferential edge portion of the substrate W. In this way, the pure water spreads over the entire region of the upper surface of the substrate W so as to wash away the first chemical liquid adhered to the upper surface of the substrate W in the entire region of the upper surface of the substrate W.

When a predetermined period elapses after the start of discharge of the pure water, the first pure water step (S3) is completed. Specifically, the controller 3 closes the pure water valve 56 so as to stop the discharge of the pure water from the pure water nozzle 55.

Then, the controller 3 performs a second chemical liquid step (that is, an SC1 step, step S4 in FIG. 10) of using the second chemical liquid (for example, the SC1) so as to process the upper surface of the substrate W. Specifically, the controller 3 opens the second chemical liquid valve 54 so as to discharge the second chemical liquid from the second chemical liquid nozzle 53 toward the center portion of the upper surface of the substrate W. The second chemical liquid supplied to the center portion of the upper surface of the substrate W receives the centrifugal force generated by the rotation of the substrate W so as to flow on the upper surface of the substrate W toward the circumferential edge portion of the substrate W. In this way, the second chemical liquid spreads over the entire region of the upper surface of the substrate W, and thus the entire region of the upper surface of the substrate W is processed by the second chemical liquid.

When a predetermined period elapses after the start of discharge of the second chemical liquid, the second chemical liquid step (S4) is completed. Specifically, the controller 3 closes the second chemical liquid valve 54 so as to stop the discharge of the second chemical liquid from the second chemical liquid nozzle 53.

Then, the controller 3 performs a second pure water step (step S5 in FIG. 10, see FIG. 12A) of washing away the second chemical liquid adhered to the upper surface of the substrate W. Specifically, the controller 3 opens the pure water valve 56 so as to discharge the pure water from the pure water nozzle 55 toward the center portion of the upper surface of the substrate W. The pure water supplied to the center portion of the upper surface of the substrate W receives the centrifugal force generated by the rotation of the substrate W so as to flow on the upper surface of the substrate W toward the circumferential edge portion of the substrate W. In this way, the pure water spreads over the entire region of the upper surface of the substrate W so as to wash away the second chemical liquid adhered to the upper surface of the substrate W in the entire region of the upper surface of the substrate W.

When a predetermined period elapses after the start of discharge of the pure water, the second pure water step (S5) is completed. Specifically, the controller 3 closes the pure water valve 56 so as to stop the discharge of the pure water from the pure water nozzle 55.

In the preferred embodiment, the controller 3 then performs an insulating liquid film holding step of holding a liquid film 71 (see FIG. 12B and the like) of the insulating liquid on the upper surface of the substrate W. Specifically, the controller 3 opens the insulating liquid valve 58 while keeping the rotation of the substrate W at the liquid processing speed so as to discharge the insulating liquid from the insulating liquid nozzle 57 toward the center portion of the upper surface of the substrate W. The insulating liquid supplied to the center portion of the upper surface of the substrate W receives the centrifugal force generated by the rotation of the substrate W so as to flow on the upper surface of the substrate W toward the circumferential edge portion of the substrate W. In this way, on the upper surface of the substrate W, the liquid film 71 of the insulating liquid covering the entire region of the upper surface of the substrate W is held.

After the liquid film 71 of the insulating liquid is held on the upper surface of the substrate W, the controller 3 also performs a charge supply step (step S6 in FIG. 10) of supplying the charge (negative charge) of the one polarity to the substrate W. The controller 3 performs, in parallel with the charge supply step (S6), a first voltage application step of applying the voltage of the other polarity (for example, a positive polarity) to the first electrode 12.

Figure 12B:
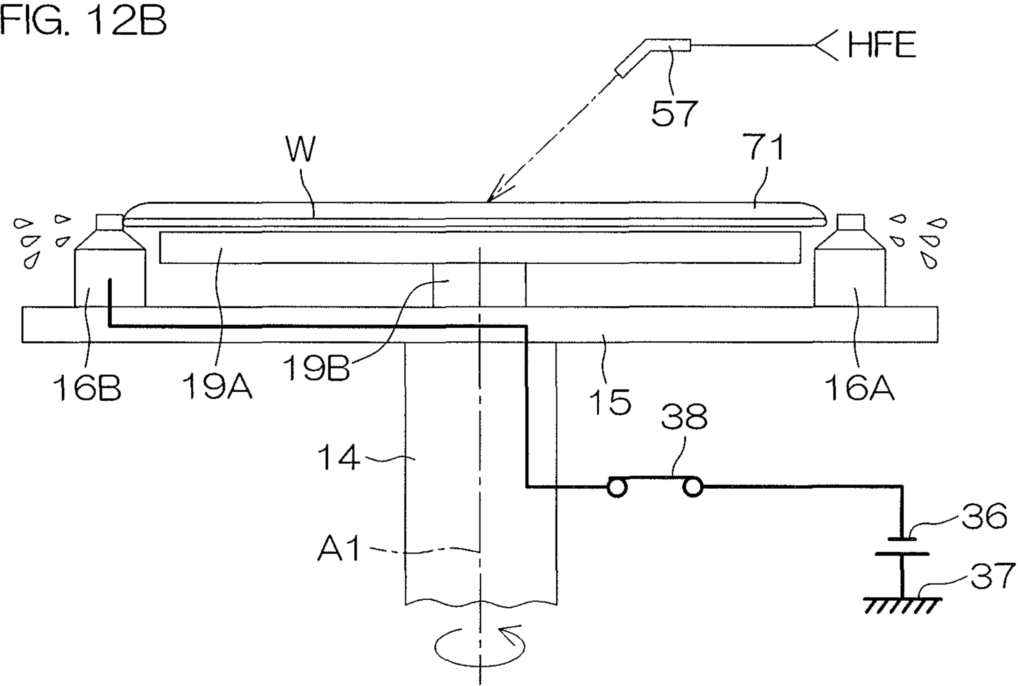
Figure 13A:
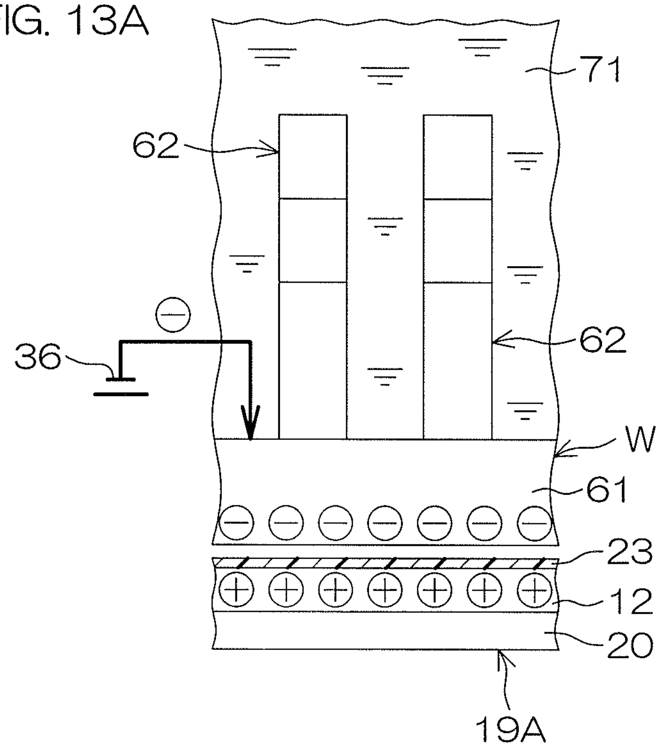
FIGS. 13A and 13B are respectively schematic cross-sectional views for illustrating the states of the front surface of the substrate in steps shown in FIGS. 12B and 12C.
Figure 13B:
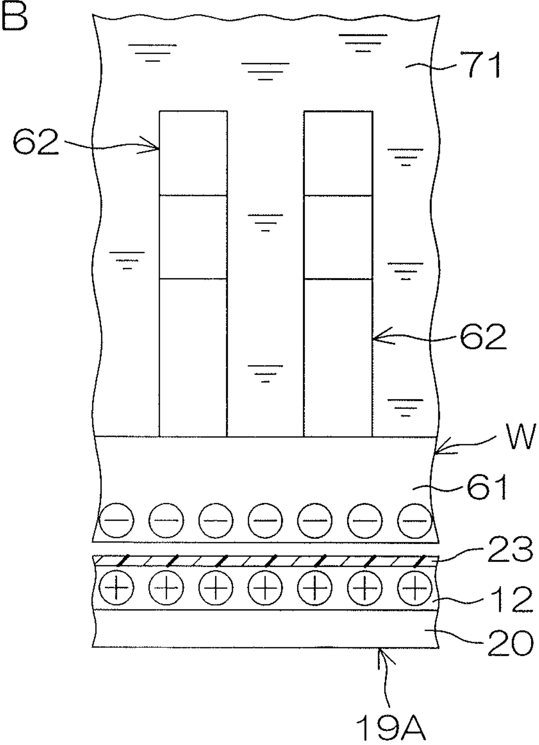
Figure 13C:
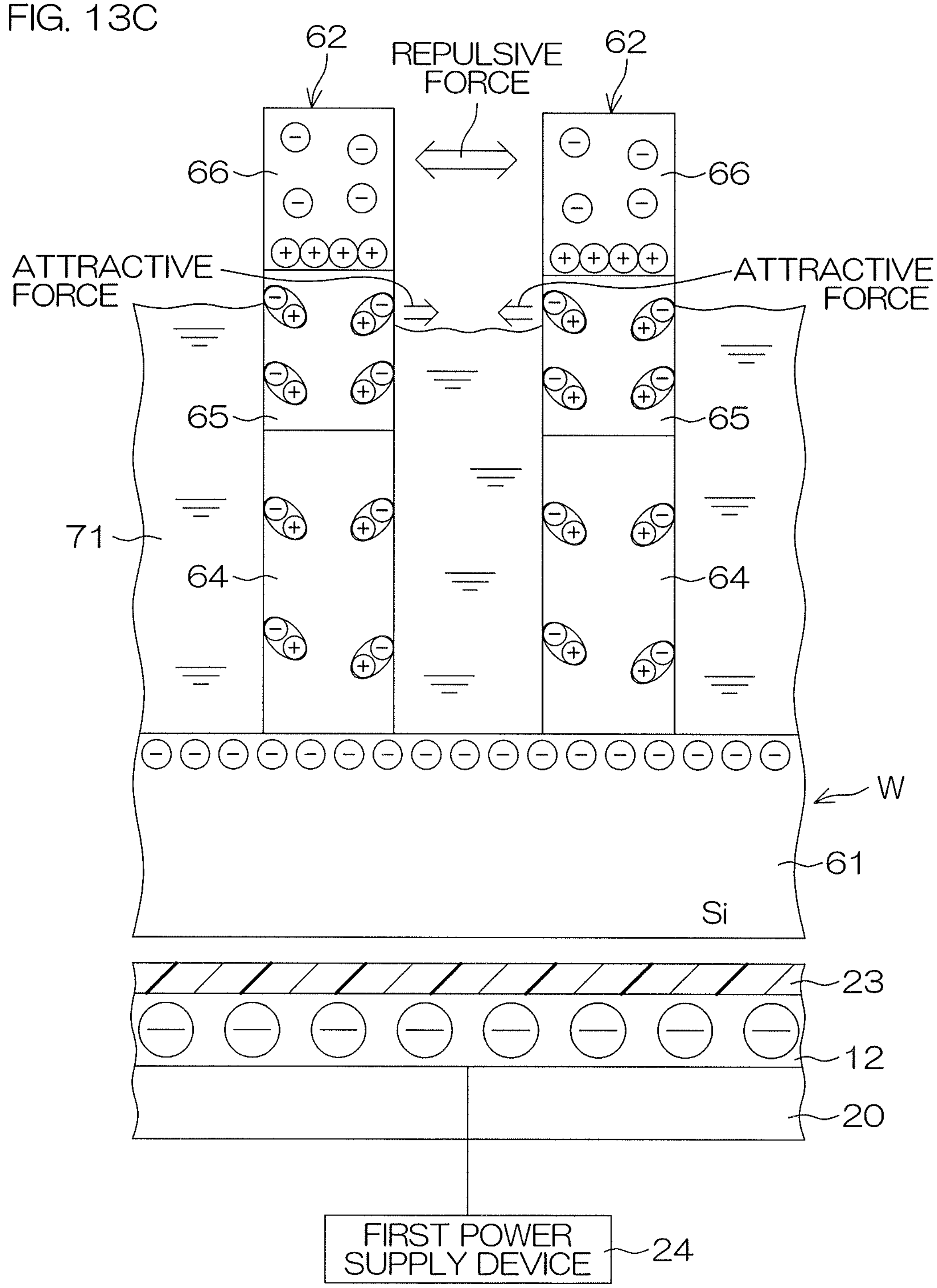
FIG. 13C is a schematic cross-sectional view for illustrating the state of the front surface of the substrate in a drying step shown in FIG. 12D.

Specifically, the controller 3 controls the first opposite portion lifting unit 21 so as to raise the first opposite portion 19A that has been arranged in the lower position and to arrange it in the upper position (position shown in FIG. 12B and the like). The controller 3 also switches the switch 38 from the current open state to the conductive state (see FIG. 12B). In this way, the direct-current voltage of the one polarity (negative polarity) from the power supply 36 is applied to the silicon substrate 61 through the rotation shaft 14, the spin base 15 and the second holding pin 16B. In this way, the charge (negative charge) of the one polarity is supplied to the silicon substrate 61.

In parallel with the first voltage application step, a direct-current voltage of the other polarity (positive polarity) is applied to the first electrode 12. Hence, as shown in FIG. 13A, the charge (negative charge) of the one polarity supplied from the power supply 36 to the silicon substrate 61 is attracted to the lower surface of the silicon substrate 61 arranged on the first electrode 12 through the dielectric member.

Since the liquid film 71 of the insulating liquid is held on the upper surface of the silicon substrate 61, the entire thin film patterns 62 are immersed in the liquid film 71 of the insulating liquid serving as the insulating liquid. Hence, it is possible to suppress or prevent the flowing out of the charge (negative charge) of the one polarity supplied to the silicon substrate 61 through the liquid film on the upper surface of the silicon substrate 61. In this way, in the first voltage application step, a larger amount of charge (negative charge) of the one polarity can be accumulated within the silicon substrate 61.

When a predetermined period elapses after the switch 38 is switched to the conductive state, the controller 3 controls the spin motor 13 so as to stop the rotation of the substrate W. After the rotation of the substrate W is stopped, the controller 3 switches the switch 38 from the current conductive state to the open state. In this way, as shown in FIG. 13B, the supply of the charge (negative charge) of the one polarity from the power supply 36 to the substrate W is stopped.

Figure 12C:
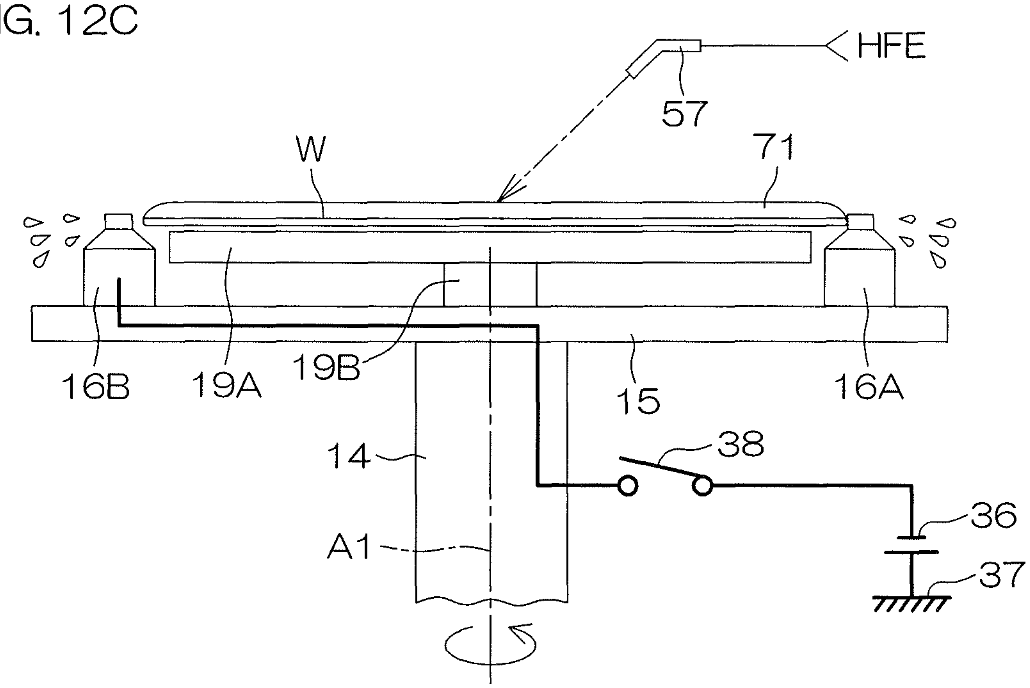
FIGS. 12C and 12D are schematic views for illustrating the first substrate processing example and show a step subsequent to FIG. 12B.

The switch 38 is switched to the open state, and thus the conductive state of the rotation shaft 14 (the spin base 15) and the ground structure 37 is released (step S7 in FIG. 10, see FIG. 12C).

In synchronization with the release of the ground connection, the controller 3 controls the first and second lifting units 33 and 35 so as to switch from the state where the substrate W is contact-supported by the three second holding pins 16B (conductive pins) to the state where the substrate W is contact-supported by the three first holding pins 16A (insulating pins) (see FIG. 12C). In this way, the conductive state of the substrate W (that is, the silicon substrate 61) and the spin base 15 (the rotation shaft 14) is released.

As described above, the conductive state of the rotation shaft 14 (the spin base 15) and the ground structure 37 is released, the conductive state of the substrate W (that is, the silicon substrate 61) and the spin base 15 (the rotation shaft 14) is released and thus the ground connection of the substrate W (that is, the silicon substrate 61) is released.

After the substrate W is grasped by the three first holding pins 16A (insulating pins), the controller 3 controls the spin motor 13 so as to restart the rotation of the substrate W. The substrate W is raised up to the liquid processing speed and is kept at the liquid processing speed.

When a predetermined period elapses after the rotational speed of the substrate W reaches the liquid processing speed, the controller 3 switches the polarity of the voltage applied to the first electrode 12 from the other polarity (positive polarity) to the one polarity (negative polarity). In other words, the controller 3 performs a second voltage application step of applying the voltage of the one polarity (negative polarity) to the first electrode 12. In other words, in the second voltage application step, while the state where the ground connection of the substrate W is released is being kept, the direct-current voltage is applied to the first electrode 12.

In this case, the liquid film 71 of the insulating liquid is held on the upper surface of the substrate W, and thus the liquid which enters between adjacent thin film patterns 62 is the insulating liquid. Hence, it is possible to prevent the charge (negative charge) of the one polarity accumulated within the silicon substrate 61 from flowing out through the liquid film on the upper surface of the substrate W. In this way, in the second voltage application step, a larger amount of charge (negative charge) of the one polarity can be collected on the upper surface of the silicon substrate 61.

When a predetermined period elapses after the switching of the polarity of the voltage applied to the first electrode 12, the controller 3 closes the insulating liquid valve 58 so as to stop the discharge of the insulation liquid from the insulating liquid nozzle 57. In this way, the supply of the insulation liquid to the upper surface of the substrate W is stopped.

For a while after the stop of discharge of the insulating liquid, the rotational speed of the substrate W is kept at the liquid processing speed. In this state, the centrifugal force generated in the substrate W is received, and consequently, the insulating liquid on the upper surface of the substrate W is discharged to the outside of the substrate W, so that the thickness of the liquid film 71 of the insulating liquid on the substrate W is reduced. However, the thickness of the liquid film 71 of the insulating liquid is kept such that the upper surface thereof is higher than the upper end of the thin film pattern 62. In other words, even in this case, the insulating liquid enters between adjacent thin film patterns 62.

Figure 12D:
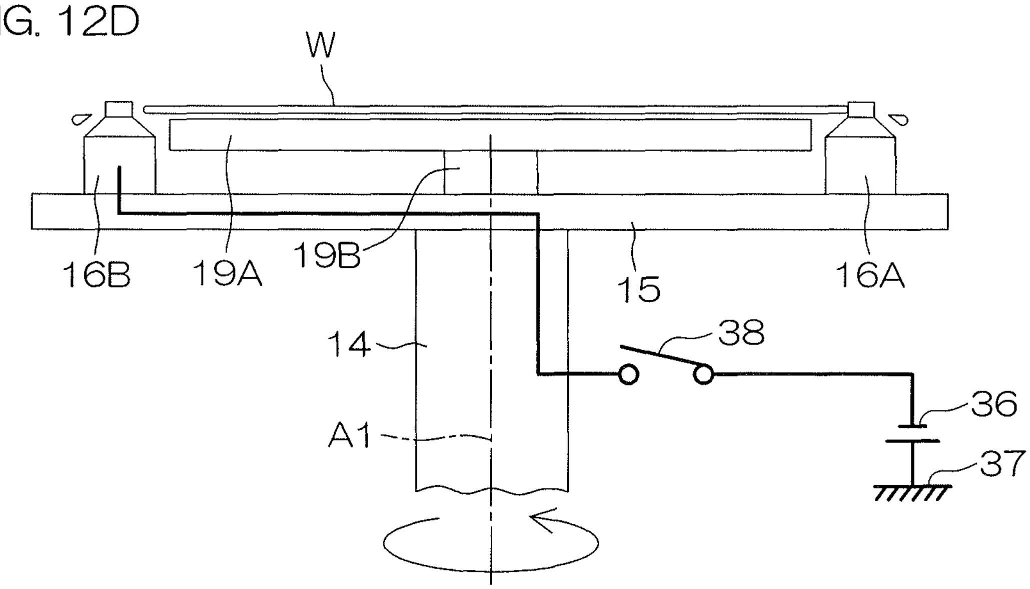

When a predetermined period elapses after the stop of discharge of the insulating liquid, the controller 3 performs a step of dying the substrate W (step S8 in FIG. 10: drying step) while keeping the application of the voltage of the one polarity (negative polarity) to the first electrode 12. Specifically, the controller 3 controls the spin motor 13 so as to accelerate, as shown in FIG. 12D, the substrate W up to a spin dry speed (for example, about 1500 rpm) which is higher than the liquid processing speed and to rotate the substrate W at the spin dry speed. In this way, a large centrifugal force is applied to the insulating liquid on the substrate W, and thus the insulating liquid adhered to the substrate W is spun off to the surrounding of the substrate W. In this way, the insulating liquid is removed from the substrate W, and thus the substrate W is dried.

When a predetermined period elapses after the start of the high-speed rotation of the substrate W, the controller 3 controls the spin motor 13 so as to stop the rotation of the substrate W by the spin chuck 5. The controller 3 also controls the first opposite portion lifting unit 21 so as to lower the first opposite portion 19A that has been arranged in the upper position toward the lower position.

Thereafter, the controller 3 controls the first lifting unit 33 so as to arrange, in the upper position, the first opening permanent magnets 32 that has been arranged in the lower position. In this way, the three first holding pins 16A (insulating pins) are moved from the holding position to the opening position. Hence, all of the holding pins 16 are provided in the opening position, and thus the grasping of the substrate W is released. Thereafter, the substrate W is carried out of the interior of the chamber 4 (step S9 in FIG. 10).

As shown in FIG. 13C, in the drying step (S8), the insulating liquid enters between adjacent thin film patterns 62. In the process in which the insulating liquid is removed, an attractive force is exerted between adjacent thin film patterns 62 due to the surface tension of the insulating liquid.

On the other hand, the voltage of the one polarity (negative polarity) is applied to the first electrode 12. In this way, the charge (negative charge) of the one polarity accumulated within the silicon substrate 61 repels the first electrode 12 so as to be collected on the upper surface of the silicon substrate 61.

A large amount of charge (negative charge) of the one polarity is collected on the upper surface of the silicon substrate 61, and consequently, polarization occurs in the insulating films 64 and 65 forming the thin film patterns 62. As a result, thereof, the upper surface of these is charged to the one polarity (negative polarity).

The charge (negative charge) of the one polarity is induced to the upper surface of the conductive film 66. The phenomenon as described above occurs in the individual thin film patterns 62, and thus between the tip end portions of adjacent thin film patterns 62, a repulsive force (coulomb force) is generated. The repulsive force cancels out the attractive force generated by the surface tension of the insulating liquid, and thus it is possible to suppress or prevent the collapse of the thin film patterns 62 in the drying step (S8).

Moreover, the insulating liquid which is used as the insulating liquid in the preferred embodiment is the HFE whose surface tension is lower than that of the pure water. The insulating liquid whose surface tension is low is used, and thus it is possible to more effectively suppress or prevent the collapse of the thin film patterns 62 in the drying step (S8).

As described above, in the first preferred embodiment, in parallel with the charge supply step (S6) of supplying the charge (negative charge) of the one polarity to the substrate W, the voltage of the other polarity (positive polarity) is applied to the first electrode 12. In this way, the charge (negative charge) of the one polarity supplied to the substrate W can be attracted to the lower surface of the substrate W, and consequently, the charge (negative charge) of the one polarity can be accumulated within the substrate W.

After the first voltage application step, while the state where the ground connection of the substrate W is released is being kept, the second voltage application step of applying a voltage of the other polarity (positive polarity) to the first electrode 12 is performed. In parallel with the second voltage application step, the drying step (S8) of removing the insulating liquid from the upper surface of the substrate W is performed.

In this state, the voltage of the one polarity (negative polarity) is applied to the first electrode 12, and thus the charge (negative charge) of the one polarity accumulated within the substrate W repels the first electrode 12 so as to be collected on the upper surface of the substrate W. Hence, electrical polarization occurs in the thin film patterns 62, and thus as shown in FIG. 13C, the charge (negative charge) of the one polarity is collected on (the tip end portions of) the individual thin film patterns 62, with the result that (the tip end portions of) the individual thin film patterns 62 are charged to the one polarity (negative polarity). In this way, a repulsive force (coulomb force) is exerted between adjacent thin film patterns 62.

On the other hand, when a liquid surface is present between adjacent thin film patterns 62 included in the thin film patterns 62, the surface tension of the liquid is exerted on the position of a boundary between the liquid surface and the thin film patterns 62. In other words, an attractive force (surface tension) is exerted between the adjacent thin film patterns 62. However, the attractive force (surface tension) is cancelled out by the repulsive force (coulomb force) resulting from the charging of the thin film patterns 62. Hence, while the force exerted on the thin film patterns 62 is being reduced, the insulating liquid can be removed from the upper surface of the substrate W. In this way, it is possible to dry the substrate W while effectively suppressing the collapse of the thin film patterns 62.

Figure 14:
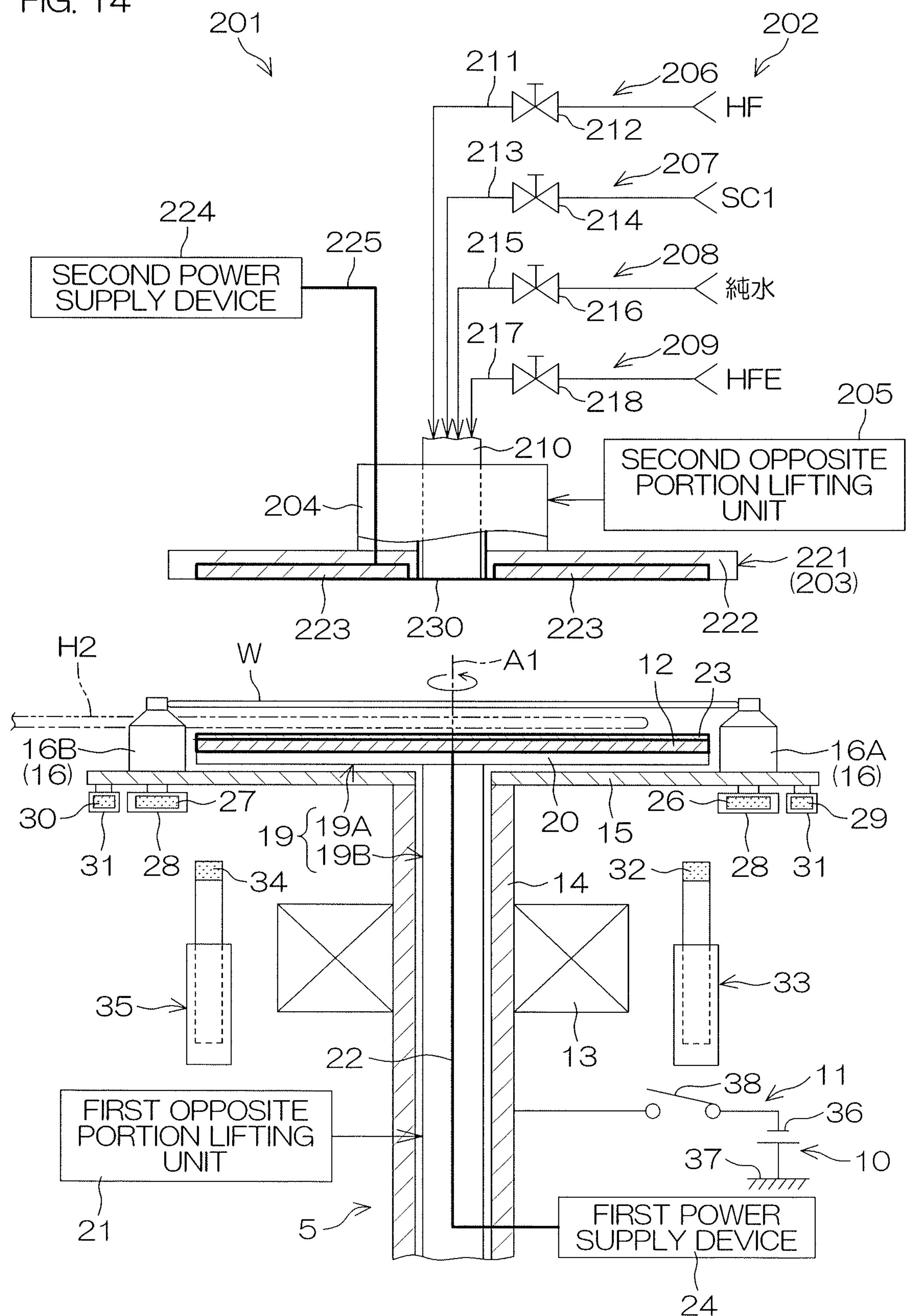
FIG. 14 is a schematic cross-sectional view for illustrating an example of the configuration of a processing unit which is included in a substrate processing apparatus according to a second preferred embodiment of the present invention.

FIG. 14 is a schematic cross-sectional view for illustrating an example of the configuration of a processing unit 202 which is included in a substrate processing apparatus 201 according to a second preferred embodiment of the present invention.

In the second preferred embodiment, the same portions as in the first preferred embodiment (preferred embodiment shown in FIGS. 1 to 13) described above are identified with the same reference numerals as in FIGS. 1 to 13, and the description thereof will be omitted.

The processing unit 202 mainly differs from the processing unit 2 in that a shielding plate 203 which is opposite the upper surface of the substrate W held by the spin chuck 5 is provided.

The shielding plate 203 is arranged above the spin chuck 5. The shielding plate 203 is supported in a horizontal posture by a support shaft 204 which extends in the up/down direction. The shielding plate 203 is formed in the shape of a disk whose outside diameter is larger than that of the substrate W.

The shielding plate 203 includes a second opposite portion 221 which is held in a horizontal posture and which is formed in the shape of a disk. The second opposite portion 221 is formed in the shape of the disk whose outside diameter is smaller than that of the substrate W. The center axis of the second opposite portion 221 is arranged on the rotation axis A1. The second opposite portion 221 is arranged above the substrate W. The lower surface of the second opposite portion 221 which is opposite the substrate W is parallel to the upper surface of the substrate W, and is opposite a substantially entire region of the upper surface of the substrate W. A lower end portion of a center nozzle 210 is arranged within a through-hole which penetrates the center portion of the second opposite portion 221 in the up/down direction.

The processing unit 202 further includes a second opposite portion lifting unit (second distance changing unit) 205 which is coupled through the support shaft 204 to the second opposite portion 221. The processing unit 202 may include a shielding plate rotating unit which rotates the shielding plate 203 about the center line of the shielding plate 203. The second opposite portion lifting unit 205 raises and lowers the second opposite portion 221 between a close position (position shown in FIG. 17) in which the lower surface of the second opposite portion 221 is close to the upper surface of the substrate W and a retraction position (position shown in FIG. 14) which is provided above the close position.

The second opposite portion 221 includes a main body portion 222 which is held in a horizontal posture and which is formed in the shape of a disk and a second electrode 223 which is arranged on the lower surface of the main body portion 222 and which is formed in the shape of a plate. In other words, the second electrode 223 forms the lower surface of the second opposite portion 221.

The second electrode 223 includes a pair of a positive pole and a negative pole. A voltage applied to the second electrode 223 is, for example, several kilovolts. The second electrode 223 is annular. The outside diameter of the second electrode 223 is smaller than that of the substrate W. A difference between the radius of the second electrode 223 and the radius of the substrate W is small. As described above, the difference between the radius of the second electrode 223 and the radius of the substrate W is small, and thus the upper surface of the second electrode 223 is opposite a substantially entire region of the lower surface of the substrate W. In a state where the second opposite portion 221 is arranged in the close position, the lower surface of the second electrode 223 is opposite the upper surface of the substrate W (that is, the upper end portions of the thin film patterns 62 (see FIG. 18A and the like)) through a small distance.

A solid dielectric member which covers the entire region of the lower surface of the second electrode 223, which is equivalent to the solid dielectric member 23 and which is formed in the shape of a thin film, may be arranged on the lower surface of the second electrode 223.

The processing unit 202 further includes a second power supply device 224 which applies a voltage to the second electrode 223. The second power supply device 224 applies the direct-current voltage of the other polarity (positive polarity) to the second electrode 223. The second power supply device 224 is connected through a wire 225 to the second electrode 223. The second power supply device 224 is connected to an electrode application power supply (unillustrated, a power supply separate from the power supply 36). The voltage of the power supply is applied to the second electrode 223 through the second power supply device 224 and the wire 225.

The second power supply device 224 includes an on/off portion which switches between the application of the voltage to the second electrode 223 and the stop thereof, a voltage changing portion which changes the magnitude of the voltage applied to the second electrode 223 and a polarity changing portion which changes the polarity of the voltage applied to the second electrode 223 between a positive polarity and a negative polarity.

The processing unit 2 further includes a center nozzle 210 which discharges the processing liquid downward through a center discharge port 230 that is opened in the center portion of the lower surface of the shielding plate 203. A discharge port of the center nozzle 210 which discharges the processing liquid is arranged within a through-hole that penetrates the center portion of the shielding plate 203 in the up/down direction. The discharge port of the center nozzle 210 is arranged above the center discharge port 230. The center nozzle 210 is raised and lowered together with the shielding plate 203 in the vertical direction.

The processing unit 2 further includes a first chemical liquid supply unit 206 which supplies the first chemical liquid to the center discharge port 230, a second chemical liquid supply unit 207 which supplies the second chemical liquid to the center discharge port 230, a pure water supply unit 208 which supplies the pure water to the center discharge port 230 and an insulating liquid supply unit 209 which supplies the insulating liquid (HFE) to the center discharge port 230. The first chemical liquid supply unit 206, the second chemical liquid supply unit 207, the pure water supply unit 208 and the insulating liquid supply unit 209 are respectively used instead of the first chemical liquid supply unit 6, the second chemical liquid supply unit 7, the pure water supply unit 8 and the insulating liquid supply unit 9 in the first preferred embodiment.

The first chemical liquid supply unit 206 includes a first chemical liquid pipe 211 which supplies the first chemical liquid to the center nozzle 210 and a first chemical liquid valve 212 which opens and closes the first chemical liquid pipe 211.

The second chemical liquid supply unit 207 includes a second chemical liquid pipe 213 which supplies the second chemical liquid to the center nozzle 210 and a second chemical liquid valve 214 which opens and closes the second chemical liquid pipe 213.

The pure water supply unit 208 includes a pure water pipe 215 which supplies the pure water to the center nozzle 210 and a pure water valve 216 which opens and closes the pure water pipe 215.

The insulating liquid supply unit 209 includes an insulating liquid pipe 217 which supplies the insulating liquid to the center nozzle 210 and an insulating liquid valve 218 which opens and closes the insulating liquid pipe 217.

When in a state where the second chemical liquid valve 214, the pure water valve 216 and the insulating liquid valve 218 are closed, the first chemical liquid valve 212 is opened, the first chemical liquid is supplied to the center nozzle 210, and the first chemical liquid is discharged downward from the center discharge port 230.

When in a state where the first chemical liquid valve 212, the pure water valve 216 and the insulating liquid valve 218 are closed, the second chemical liquid valve 214 is opened, the second chemical liquid is supplied to the center nozzle 210, and the second chemical liquid is discharged downward from the center discharge port 230.

When in a state where the first chemical liquid valve 212, the second chemical liquid valve and the insulating liquid valve 218 are closed, the pure water valve 216 is opened, the pure water is supplied to the center nozzle 210, and the pure water is discharged downward from the center discharge port 230.

When in a state where the first chemical liquid valve 212, the second chemical liquid valve and the pure water valve 216 are closed, the insulating liquid valve 218 is opened, the insulating liquid is supplied to the center nozzle 210, and the insulating liquid is discharged downward from the center discharge port 230.

Figure 15:
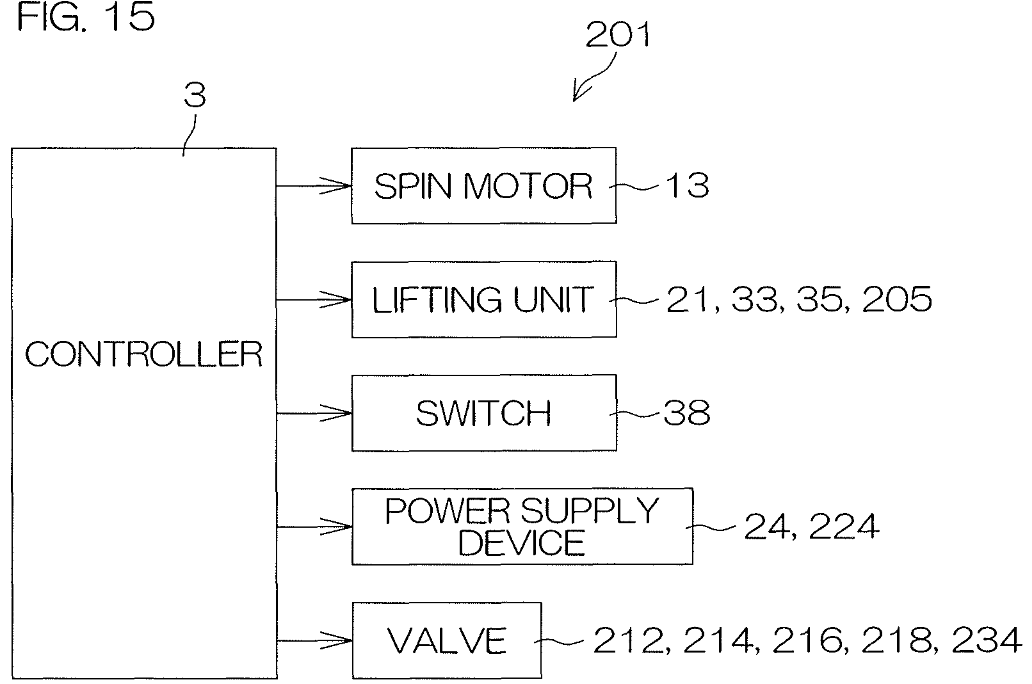
FIG. 15 is a block diagram for illustrating the electrical configuration of a main portion of the substrate processing apparatus.

FIG. 15 is a block diagram for illustrating the electrical configuration of a main portion of the substrate processing apparatus 201.

Only portions different from FIG. 9 will be described with reference to FIG. 15. As control targets, the second opposite portion lifting unit 205, the second power supply device 224 and the like are connected to the controller 3. The controller 3 controls the operations of the second opposite portion lifting unit 205 and the like according to predetermined programs. The controller 3 also controls, according to predetermined programs, the second power supply device 224 so as to switch between the application of the voltage to the second electrode 223 (see FIG. 14) and the stop thereof, to change the magnitude of the voltage applied to the second electrode 223 and to change the polarity of the voltage applied to the second electrode 223 between a positive polarity and a negative polarity. Furthermore, the controller 3 opens and closes, according to predetermined programs, the first chemical liquid valve 212, the second chemical liquid valve 214, the pure water valve 216, the insulating liquid valve 218 and the like.

Figure 16:
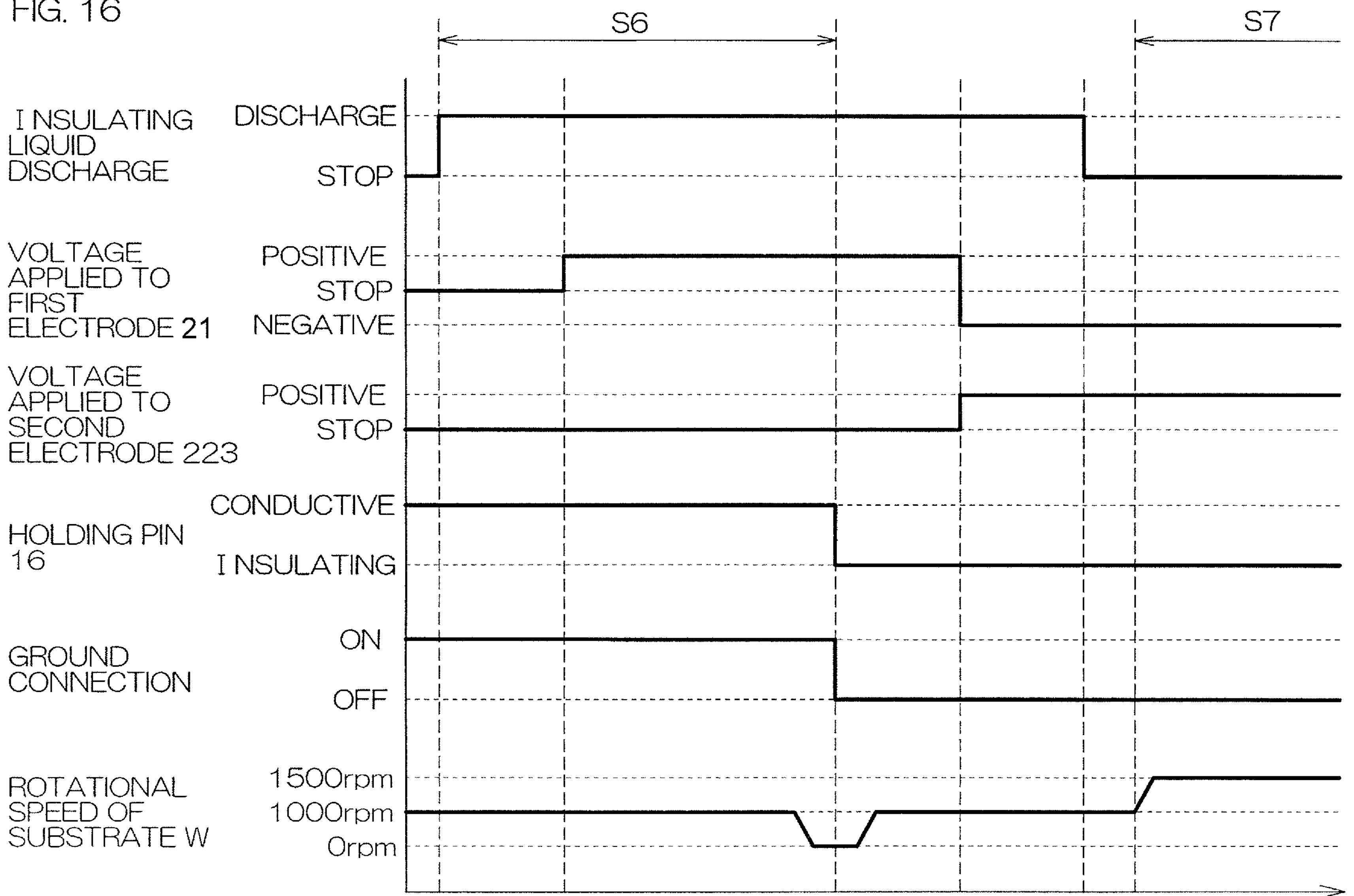
FIG. 16 is a time chart for illustrating a second substrate processing example which is performed by the processing unit.
Figure 17:
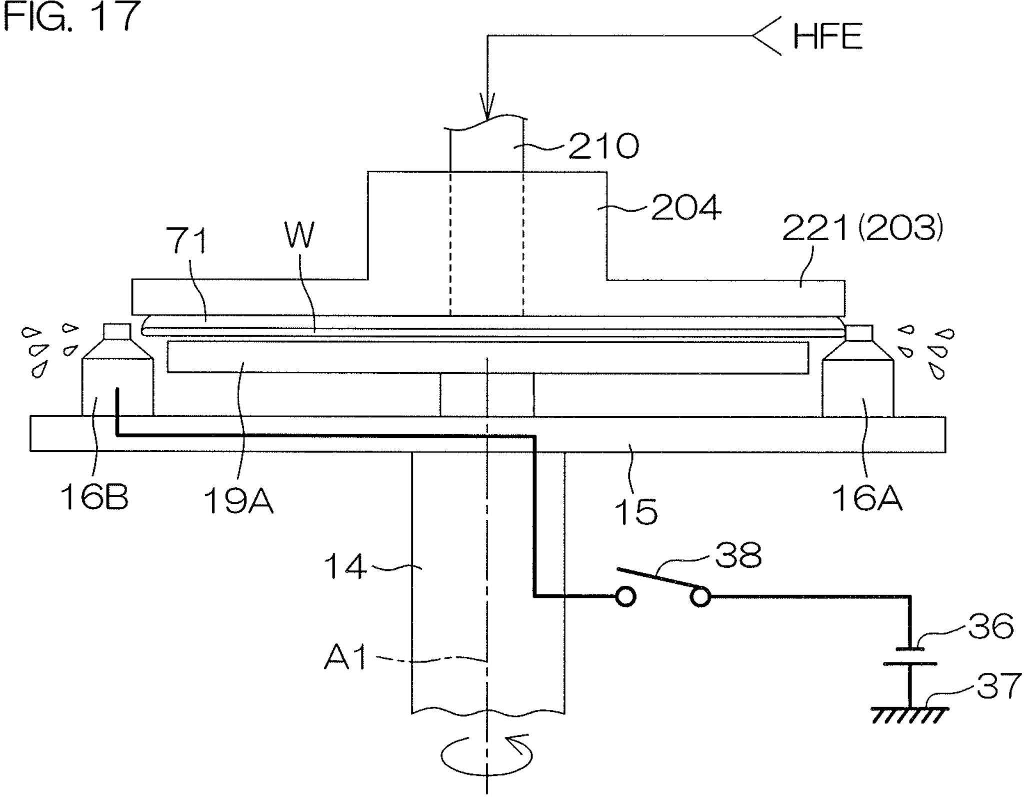
FIG. 17 is a schematic view for illustrating the second substrate processing example.
Figure 18:
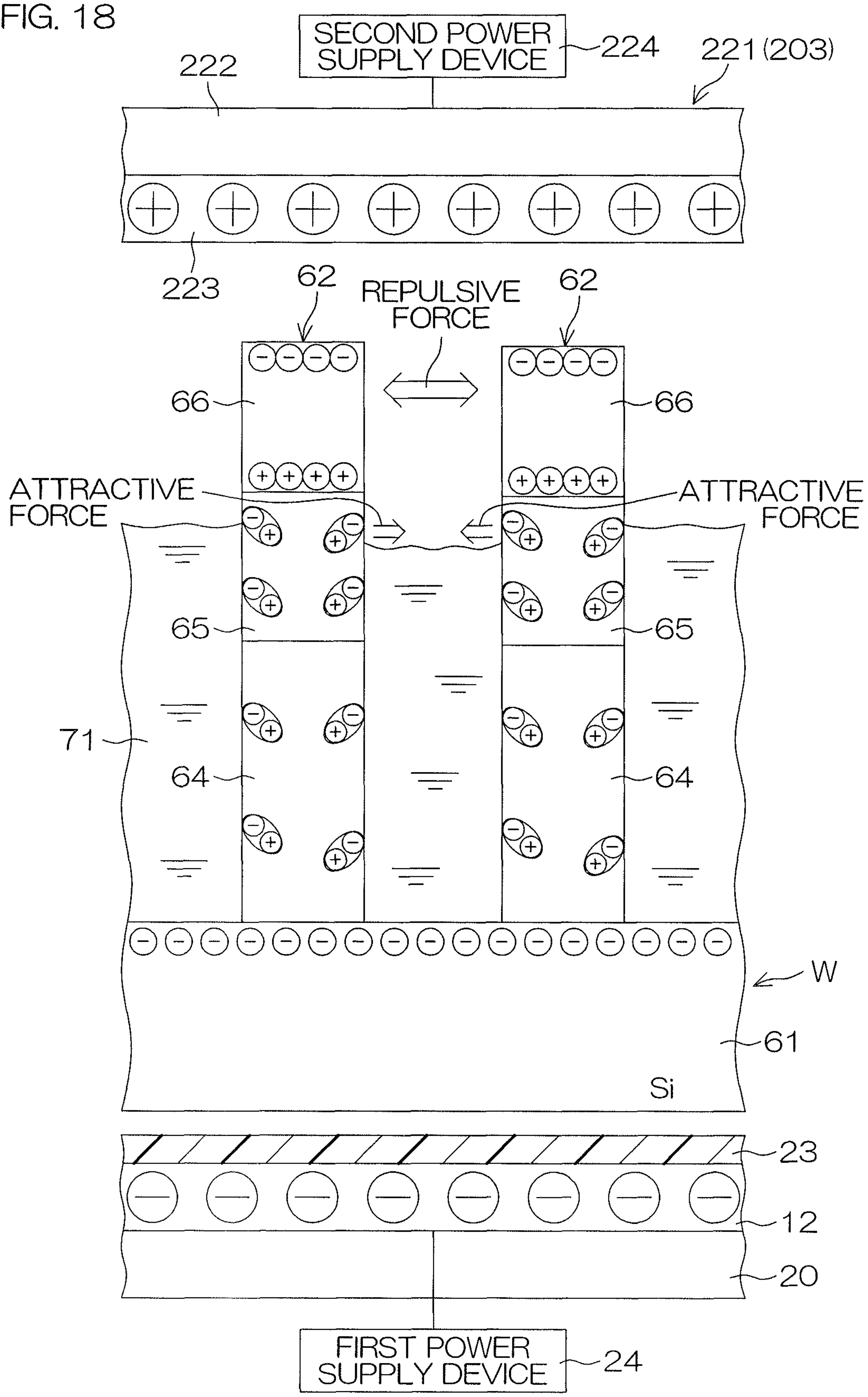
FIG. 18 is a schematic cross-sectional view for illustrating the state of the front surface of the substrate in the drying step.

FIG. 16 is a time chart for illustrating a second substrate processing example which is performed by the processing unit 202. FIG. 17 is a schematic view for illustrating the second substrate processing example. FIG. 18 is a schematic cross-sectional view for illustrating the state of the front surface of the substrate W in the drying step (S8).

The second substrate processing example performed by the processing unit 202 is a washing processing or an etching processing as in the first substrate processing example. The second substrate processing example will be described below with reference to FIGS. 14 to 16. FIGS. 17 and 18 will be referenced as necessary.

The second substrate processing example overlaps the first substrate processing example in many points. Hence, in the discussion of the second substrate processing example, only portions different from the first substrate processing example will be described.

In the individual steps from the carry-in (S0 in FIG. 10) of the substrate W to the release (S7 in FIG. 10) of the ground connection of the substrate W, the second substrate processing example differs from the first substrate processing example in that the processing liquids (the first chemical liquid, the second chemical liquid, the pure water and the insulating liquid) to the upper surface of the substrate Ware discharged from the center nozzle 210, and the second substrate processing example is substantially the same as the first substrate processing example except those points.

After the release (S7 in FIG. 10) of the ground connection of the substrate W, the rotation of the substrate W is started. The substrate W is raised up to the liquid processing speed and is kept at the liquid processing speed.

As shown in FIG. 16, a predetermined period elapses after the rotational speed of the substrate W reaches the liquid processing speed, the controller 3 switches the polarity of the voltage applied to the first electrode 12 from the other polarity (positive polarity) to the one polarity (negative polarity).

The controller 3 also controls the second opposite portion lifting unit 205 so as to arrange the second opposite portion 221 in the close position as shown in FIGS. 17 and 18. The controller 3 further controls the second power supply device 224 so as to apply the direct-current voltage of the other polarity (positive polarity) to the second electrode 223 as shown in FIG. 17.

In other words, in the second preferred embodiment, in parallel with the second voltage application step, the voltage of the other polarity (positive polarity) is applied to the second electrode 223 (third voltage application step).

Then, the controller 3 dries the substrate W while keeping the application of the voltage of the one polarity (negative polarity) to the first electrode 12 and applying the voltage of the other polarity (positive polarity) to the second electrode 223 (which corresponds to step S8 in FIG. 10). When a predetermined period elapses after the start of the high-speed rotation of the substrate W, the controller 3 controls the spin motor 13 so as to stop the rotation of the substrate W by the spin chuck 5. The controller 3 also controls the first opposite portion lifting unit 21 so as to lower the first opposite portion 19A that has been arranged in the upper position toward the lower position, and controls the second opposite portion lifting unit 205 so as to raise the second opposite portion 221 arranged in the close position toward the retraction position.

Thereafter, the controller 3 controls the first lifting unit 33 so as to release the grasping of the substrate W. Then, the substrate W is carried out of the chamber 4 (which corresponds to step S9 in FIG. 10).

In the second preferred embodiment, in addition to the actions and effects described in the first preferred embodiment, the following actions and effects are achieved.

Specifically, the voltage of the other polarity (positive polarity) is applied to the second electrode 223, and thus a large amount of charge (negative charge) of the one polarity can be collected on the upper surface of the substrate W (silicon substrate 61 (see FIG. 18A and the like)). The drying step (S8) is performed while the voltage of the other polarity (positive polarity) is being applied to the second electrode 223, and thus the polarization which occurs in the insulating films 64 and 65 can be facilitated. Furthermore, a larger amount of charge of the one polarity (negative polarity) can be induced to the upper surface of the conductive film 66. In this way, the repulsive force (coulomb force) exerted between adjacent thin film patterns 62 can be increased. Hence, it is possible to suppress or prevent the collapse of the thin film patterns 62 in the drying step (S8) much more effectively.

Figure 19:
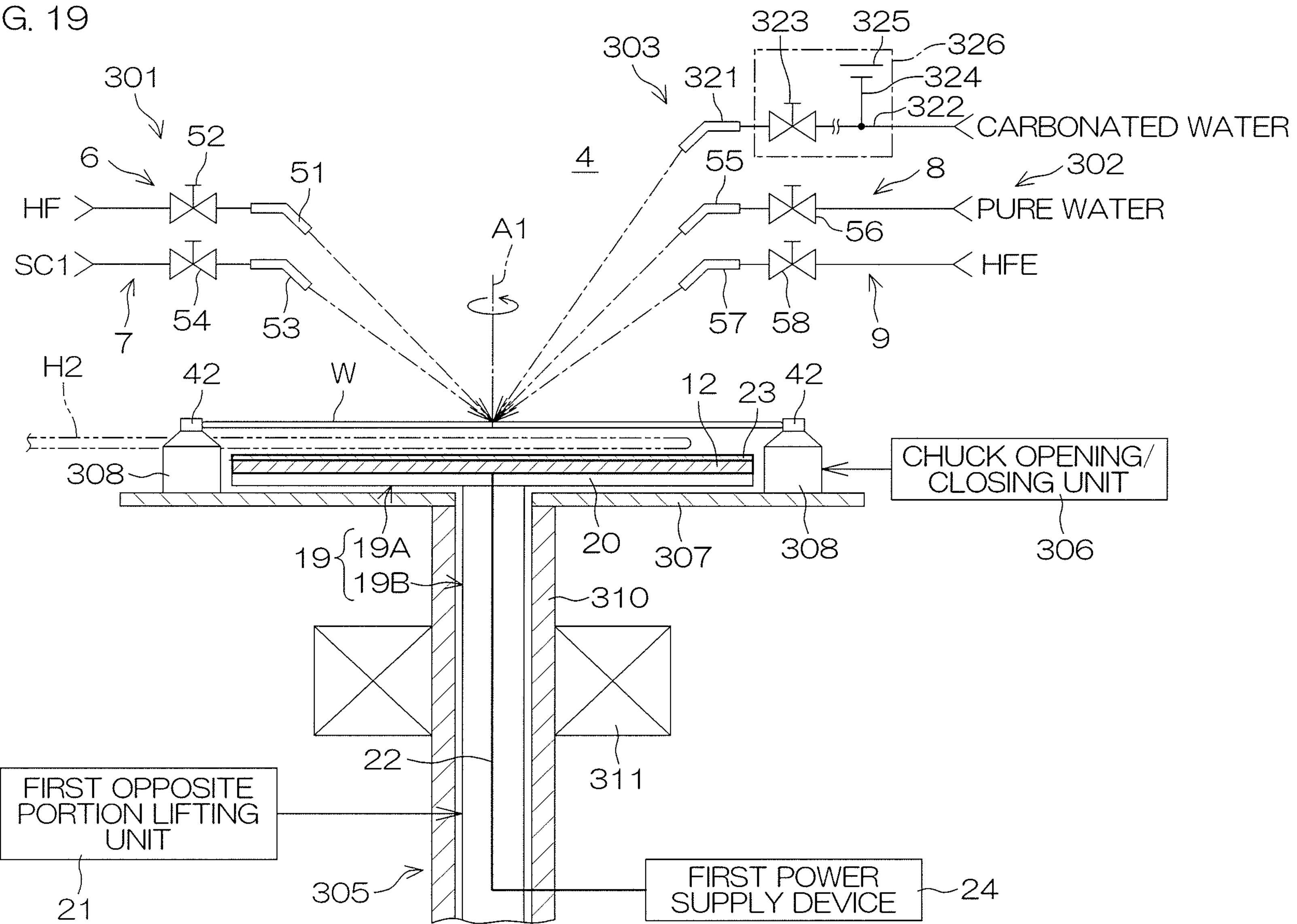
FIG. 19 is a schematic cross-sectional view for illustrating an example of the configuration of a processing unit which is included in a substrate processing apparatus according to a third preferred embodiment of the present invention.

FIG. 19 is a schematic cross-sectional view for illustrating an example of the configuration of a processing unit 302 which is included in a substrate processing apparatus 301 according to a third preferred embodiment of the present invention.

In the third preferred embodiment, the same portions as in the first preferred embodiment (preferred embodiment shown in FIGS. 1 to 13) described above are identified with the same reference numerals as in FIGS. 1 to 13, and the description thereof will be omitted.

The processing unit 302 mainly differs from the processing unit 2 in that as the substrate holding unit, instead of the spin chuck 5, a spin chuck 305 is provided. There is also a difference in that the processing unit 302 further includes a conductive liquid supply unit 303 that supplies, to the upper surface of the substrate W, a conductive liquid (for example, carbonated water) whose resistivity is less than that of the pure water. The processing unit 302 also differs from the processing unit 2 in that the processing unit 302 neither includes the charge supply unit 10 nor the ground connection unit 11.

The spin chuck 305 includes a spin base 307 which is held in a horizontal posture and which is formed in the shape of a disk, a plurality of (for example, six) chuck pins 308 which are protruded upward from the circumferential edge portion of the upper surface of the spin base 307 and a chuck opening/closing unit 309 which opens and closes the chuck pins 308 between a closed position in which the chuck pins 308 grasp the substrate W and an opened position in which the grasping of the substrate W by the chuck pins 308 is released. In each of the chuck pins 308, a portion which makes contact with the substrate W is formed of an insulating material. In other words, the chuck pins 308 are so-called insulating pins which do not have conductivity. In a state where the substrate W is supported by the chuck pins 308, the ground connection of the substrate W is released.

The spin chuck 305 further includes a rotation shaft 310 which extends downward from the center portion of the spin base 307 along the rotation axis A1 and a spin motor (drying unit) 311 which rotates the rotation shaft 310 so as to rotate the spin base 307 and the chuck pins 308 about the rotation axis A1. The controller 3 controls the spin motor 311 so as to rotate the substrate W about the rotation axis A1.

The rotation shaft 310 is a hollow shaft, extends along the vertical direction, and is configured to rotate about the rotation axis A1 by receiving a driving force from the spin motor 311. The spin base 307 and the support portion 19B of the opposite member 19 of the rotation shaft 310 are inserted.

The conductive liquid supply unit 303 includes a conductive liquid nozzle 321. The conductive liquid nozzle 321 is, for example, a straight nozzle which discharges a liquid in a continuous flow state, and is fixedly arranged above the spin chuck 305 with its discharge port directed toward the center portion of the upper surface of the substrate W. A conductive liquid pipe 322 through which the conductive liquid from a conductive liquid supply source is supplied is connected to the conductive liquid nozzle 321. Partway through the conductive liquid pipe 322, a conductive liquid valve 323 is interposed which switches between the discharge of the conductive liquid from the conductive liquid nozzle 321 and the stop of supply thereof. When the conductive liquid valve 323 is opened, the conductive liquid in the continuous flow state supplied from the conductive liquid pipe 322 to the conductive liquid nozzle 321 is discharged from a discharge port set at the lower end of the conductive liquid nozzle 321. When the conductive liquid valve 323 is closed, the discharge of the conductive liquid to the conductive liquid nozzle 321 is stopped.

In the conductive liquid pipe 322, a conductive portion is present on the upstream side of the conductive liquid valve 323, and the direct-current voltage of the one polarity (negative polarity) is supplied from a power supply 325 to the conductive portion through a wire 324. When the voltage from the power supply 325 is supplied to the conductive portion of the conductive liquid pipe 322, the charge (negative charge) of the one polarity is provided to the conductive liquid flowing through the conductive liquid pipe 322.

The conductive liquid nozzle 321 is not necessarily fixedly arranged with respect to the spin chuck 305, and for example, a so-called scan nozzle form may be adopted in which the nozzle is attached to an arm that can swing within a horizontal plane above the spin chuck 305 and in which the position of the upper surface of the substrate W that is reached by the processing liquid is scanned by the swinging of the arm.

Figure 20:
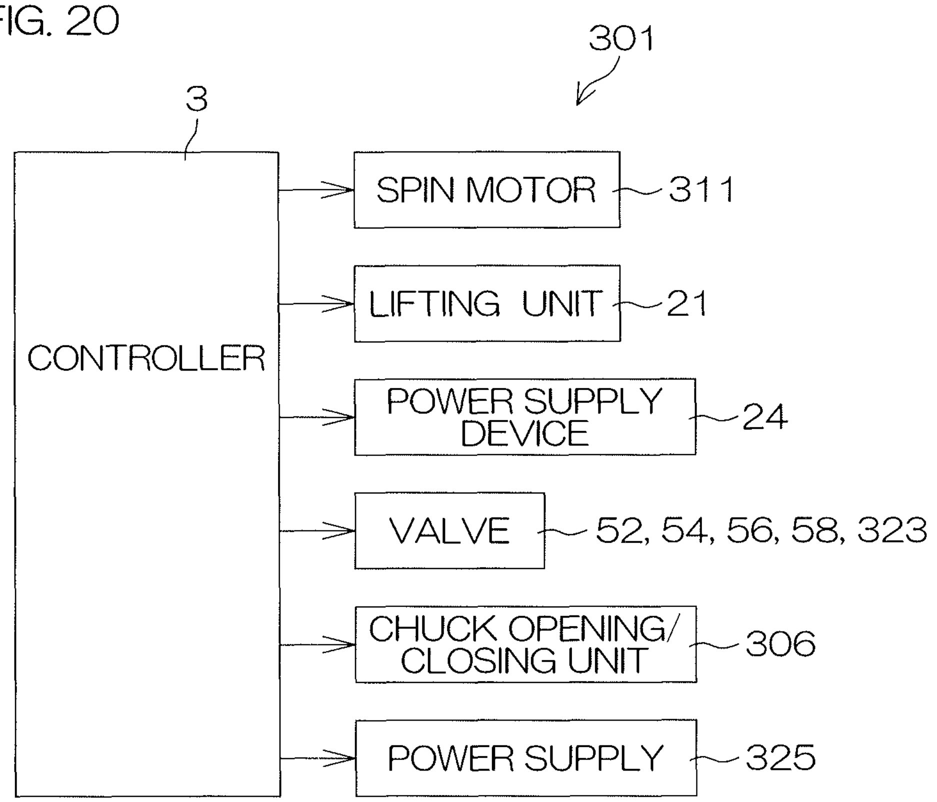
FIG. 20 is a block diagram for illustrating the electrical configuration of a main portion of the substrate processing apparatus.

FIG. 20 is a block diagram for illustrating the electrical configuration of a main portion of the substrate processing apparatus 301.

As control targets, the spin motor 311, the first opposite portion lifting unit 21, the first power supply device 24, a chuck opening/closing unit 306, the power supply 325 and the like are connected to the controller 3. The controller 3 controls, according to predetermined programs, the operations of the spin motor 311, the first opposite portion lifting unit 21, the chuck opening/closing unit 306 and the like. The controller 3 also controls, according to predetermined programs, the power supply 325 so as to switch between the application of the voltage to the conductive portion of the conductive liquid pipe 322 and the stop thereof, to change the magnitude of the voltage applied to the conductive portion of the conductive liquid pipe 322 and to change the polarity of the voltage applied to the conductive portion of the conductive liquid pipe 322 between a positive polarity and a negative polarity. Furthermore, the controller 3 opens and closes, according to predetermined programs, the first chemical liquid valve 52, the second chemical liquid valve 54, the pure water valve 56, the insulating liquid valve 58, the conductive liquid valve 323 and the like.

Figure 21:
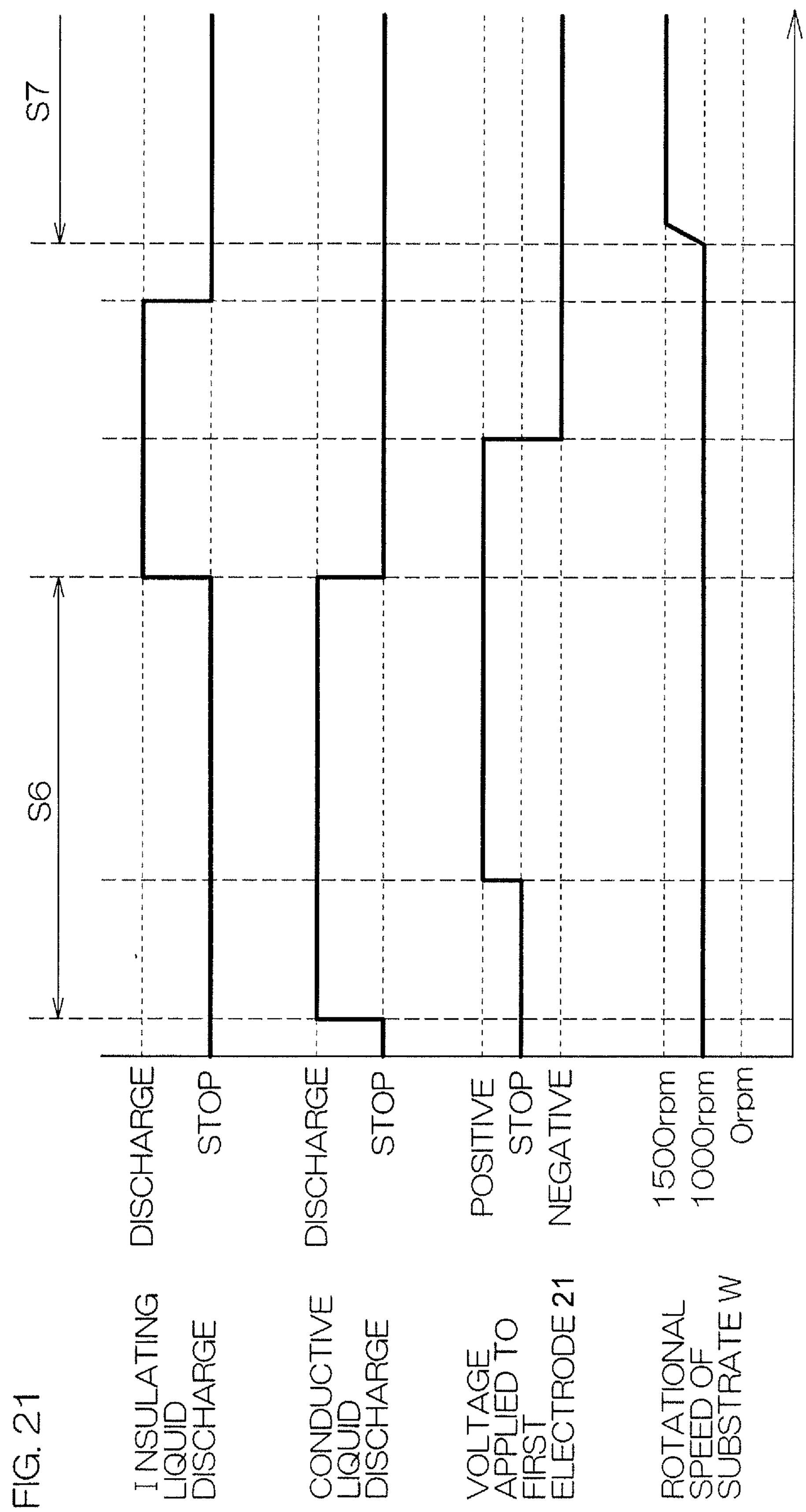
FIG. 21 is a time chart for illustrating a third substrate processing example which is performed by the processing unit.

FIG. 21 is a time chart for illustrating a third substrate processing example which is performed by the processing unit 302.

The third substrate processing example performed by the processing unit 302 is a washing processing or an etching processing as in the first substrate processing example. The third substrate processing example will be described below with reference to FIGS. 19 to 21. FIGS. 22A and 22B and FIGS. 23A and 23B will be referenced as necessary.

The third substrate processing example overlaps the first substrate processing example in many points. Hence, in the discussion of the third substrate processing example, only portions different from the first substrate processing example will be described.

When the third substrate processing example is performed by the processing unit 302, an unprocessed substrate W is carried into the chamber 4 (which corresponds to step S0 in FIG. 10). Specifically, the controller 3 makes the hand H2

(see FIG. 1) of the substrate transfer robot CR (see FIG. 1) holding the substrate W enter the interior of the chamber 4. In this way, the substrate W is delivered to the spin chuck 305 with its front surface directed upward. Thereafter, the controller 3 controls the chuck opening/closing unit 309 so as to control the chuck pins 308 to the closed position. In this way, the substrate W is sandwiched by the chuck pins 308.

After the sandwiching of the substrate W, the controller 3 starts the rotation of the substrate W by the spin motor 311 (which corresponds to step S1 in FIG. 10). The substrate W is raised up to a predetermined liquid processing speed (within a range of about 10 to 1200 rpm, for example, about 1000 rpm), and is kept at the liquid processing speed. Then, the first chemical liquid step (which corresponds to step S2 in FIG. 10) is performed. The individual steps from the first chemical liquid step (S2) to the second pure water step (which corresponds to step S5 in FIG. 10) are equivalent to those in the first substrate processing example.

Figure 22A:
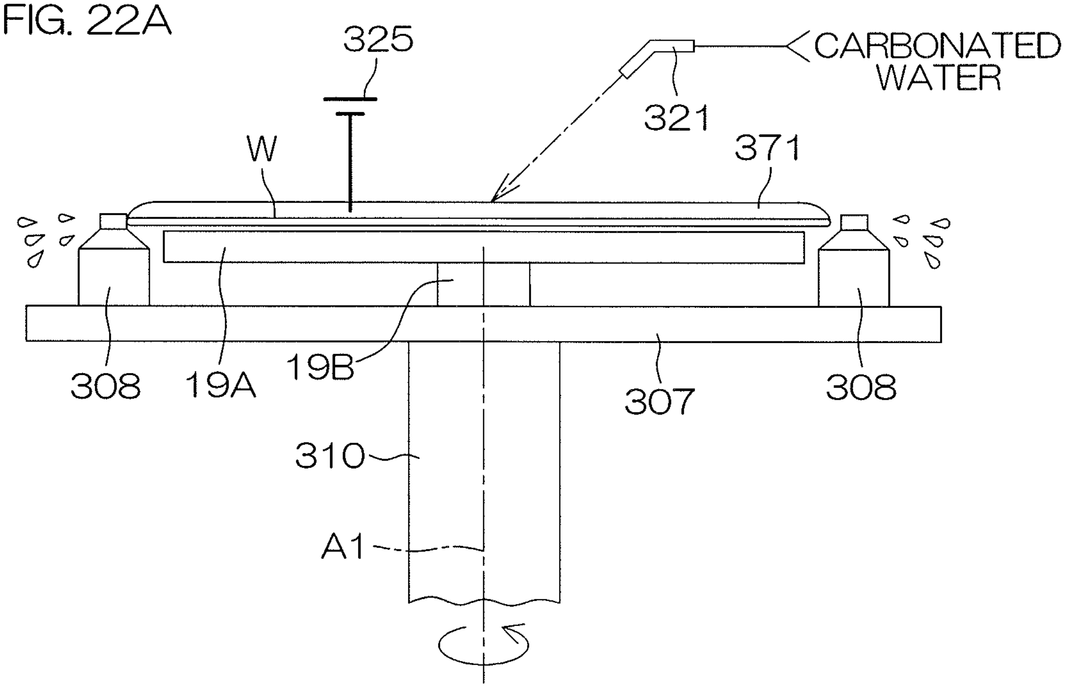
FIGS. 22A and 22B are schematic views for illustrating the third substrate processing example.

After the completion of the second pure water step (S5), the controller 3 performs a conductive liquid film holding step of holding a liquid film 371 (see FIGS. 22A and 23A) of the conductive liquid on the upper surface of the substrate W. Specifically, the controller 3 applies the voltage to the conductive portion of the conductive liquid pipe 322 from the power supply 325 and opens the conductive liquid valve 323 while keeping the rotation of the substrate W at the liquid processing speed. In this way, the conductive liquid which is charged to the one polarity (negative polarity) is discharged to the center portion of the upper surface of the substrate W. The conductive liquid supplied to the center portion of the upper surface of the substrate W receives the centrifugal force generated by the rotation of the substrate W so as to flow on the upper surface of the substrate W toward the circumferential edge portion of the substrate W. In this way, as shown in FIG. 22A, on the upper surface of the substrate W, the liquid film 371 of the conductive liquid covering the entire region of the upper surface of the substrate W is held.

Figure 23A:
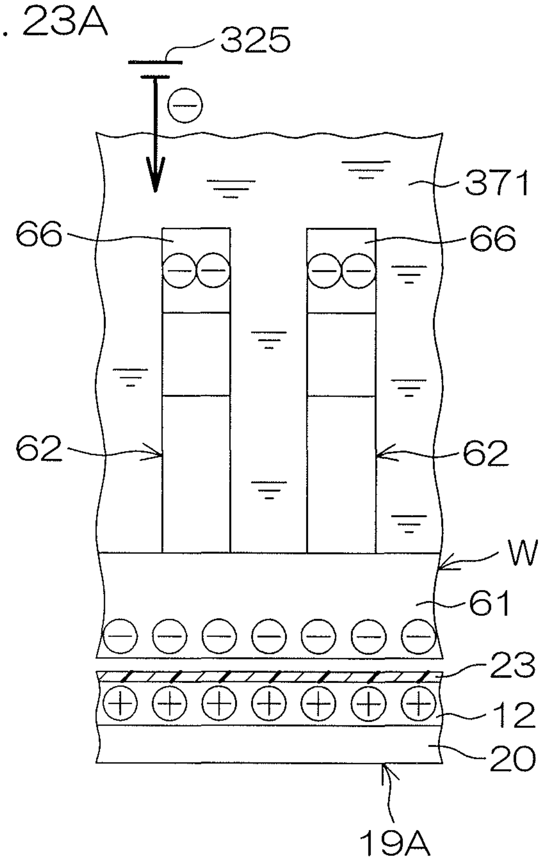
FIGS. 23A and 23B are respectively schematic cross-sectional views for illustrating the states of the front surface of the substrate in steps shown in FIGS. 22B and 22C.
Figure 23B:
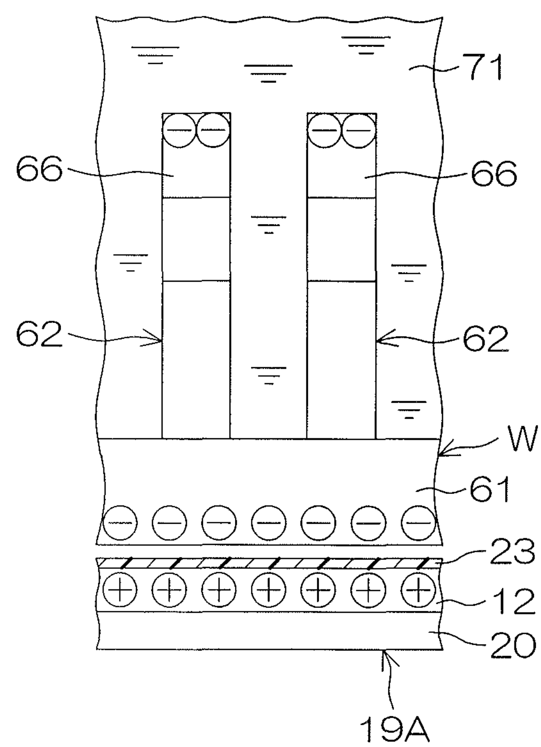

The liquid film 371 of the conductive liquid which is charged to the one polarity (negative polarity) is held on the upper surface of the substrate W, and thus as shown in FIG. 23A, the charge (negative charge) of the one polarity is supplied to the substrate W. In this way, the charge supply step (which corresponds to step S6 in FIG. 10) is performed. In other words, the third substrate processing example differs from the first substrate processing example in the method of the charge supply step (S6). In the third substrate processing example, the conductive liquid valve 323, the wire 324 and the power supply 325 function as the charge supply unit.

In the charge supply step according to the third preferred embodiment, the charge (negative charge) of the one polarity is supplied not only to the silicon substrate 61 but also to the conductive film 66.

As in the charge supply step (S6) according to the first preferred embodiment, in parallel with the first voltage application step, a direct-current voltage of the other polarity (positive polarity) is applied to the first electrode 12. Hence, the charge (negative charge) of the one polarity supplied through the conductive liquid to the silicon substrate 61 is attracted to the lower surface of the silicon substrate 61 arranged on the first electrode 12 through the dielectric member (see FIG. 23A). The charge (negative charge) of the one polarity supplied to the conductive film 66 is also attracted to the side of the lower surface. In this way, in the first voltage application step, a larger amount of charge (negative charge) of the one polarity can be accumulated within the substrate W.

When a predetermined period elapses after the start of discharge of the conductive liquid to the upper surface of the substrate W, the controller 3 closes the conductive liquid valve 323 so as to stop the discharge of the conductive liquid from the conductive liquid nozzle 321. The controller 3 also controls the power supply 325 so as to stop the application of the voltage to the conductive portion of the conductive liquid pipe 322. In this way, the supply of the charge (negative charge) of the one polarity from the power supply 325 to the substrate W is stopped.

Figure 22B:
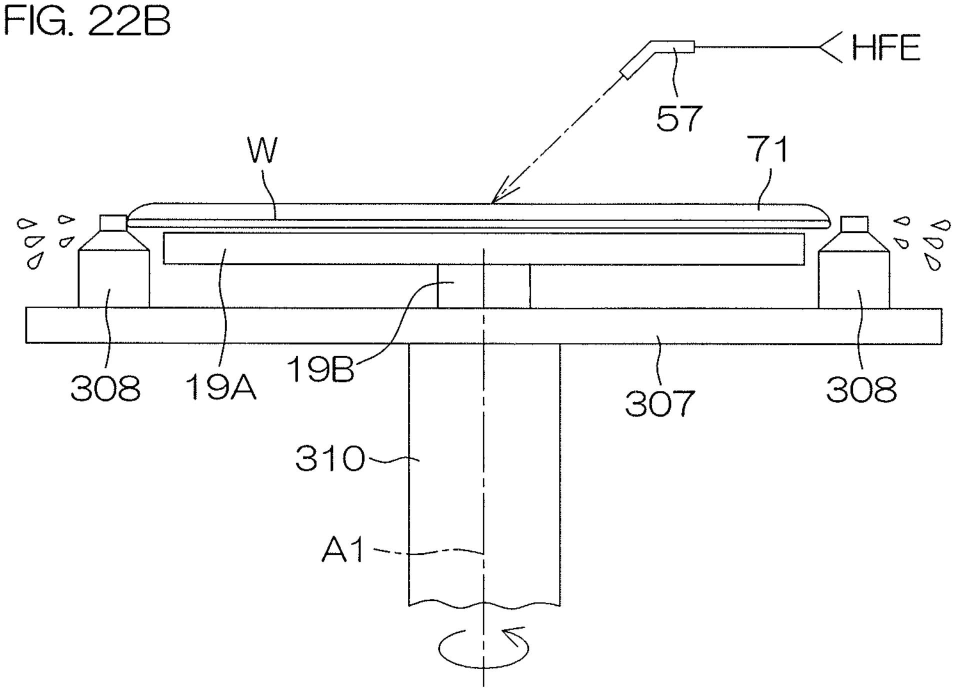

Then, as shown in FIG. 22B, the controller 3 performs the insulating liquid film holding step of holding the liquid film 71 (see FIG. 23B) of the insulating liquid on the upper surface of the substrate W. Specifically, the controller 3 opens the insulating liquid valve 58 while keeping the rotation of the substrate W at the liquid processing speed so as to discharge the insulating liquid from the insulating liquid nozzle 57 toward the center portion of the upper surface of the substrate W. The insulating liquid supplied to the center portion of the upper surface of the substrate W receives the centrifugal force generated by the rotation of the substrate W so as to flow on the upper surface of the substrate W toward the circumferential edge portion of the substrate W. In this way, on the upper surface of the substrate W, the liquid film 71 of the insulating liquid covering the entire region of the upper surface of the substrate W is held.

When a predetermined period elapses after the start of discharge of the insulating liquid to the upper surface of the substrate W, the controller 3 switches the polarity of the voltage applied to the first electrode 12 from the other polarity (positive polarity) to the one polarity (negative polarity) so as to perform the second voltage application step. As described previously, in the state where the substrate W is supported by the chuck pins 308, the ground connection of the substrate W is released. Hence, in the second voltage application step, while the state where the ground connection of the substrate W is released is being kept, the direct-current voltage is applied to the first electrode 12. In this way, in the second voltage application step, a larger amount of charge (negative charge) of the one polarity can be collected on the upper surface of the silicon substrate 61. The charge (negative charge) of the one polarity supplied to the conductive film 66 can also be collected on the upper surface of the silicon substrate 61.

When a predetermined period elapses after the switching of the polarity of the voltage applied to the first electrode 12, the controller 3 closes the insulating liquid valve 58. When a predetermined period elapses after the stop of discharge of the insulating liquid, the drying step is performed. The drying step is equivalent to the drying step in step 8 of FIG. 10.

After the completion of the drying step, the controller 3 controls the spin motor 311 so as to stop the rotation of the substrate W by the spin chuck 305. The controller 3 also controls the chuck opening/closing unit 309 so as to control the chuck pins 308 to the opened position. In this way, the sandwiching of the substrate W is released. Thereafter, the substrate W is carried out of the chamber 4 (which corresponds to step S9 in FIG. 10).

Figure 24:
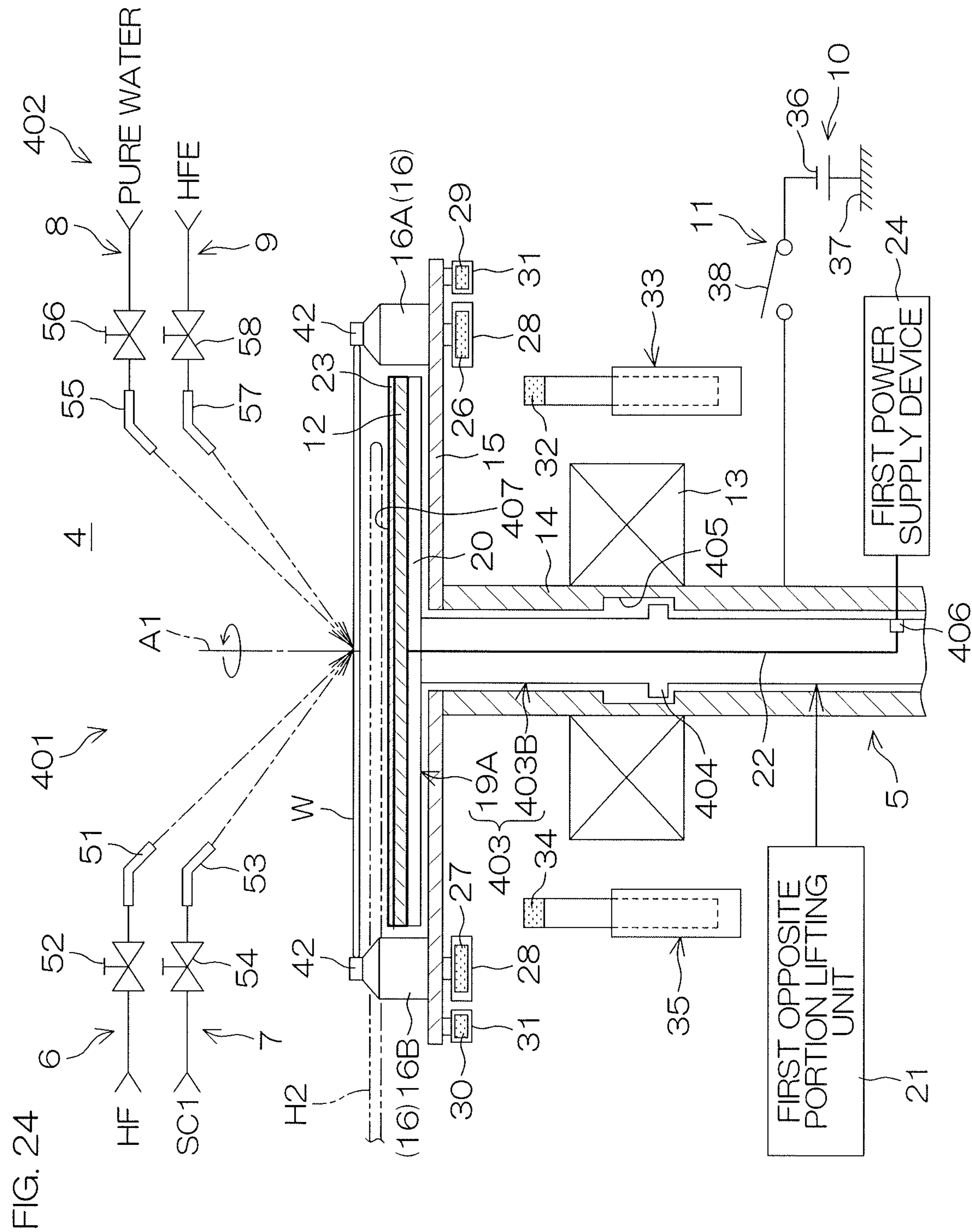
FIG. 24 is a schematic cross-sectional view for illustrating an example of the configuration of a processing unit which is included in a substrate processing apparatus according to a fourth preferred embodiment of the present invention.
Figure 25A:
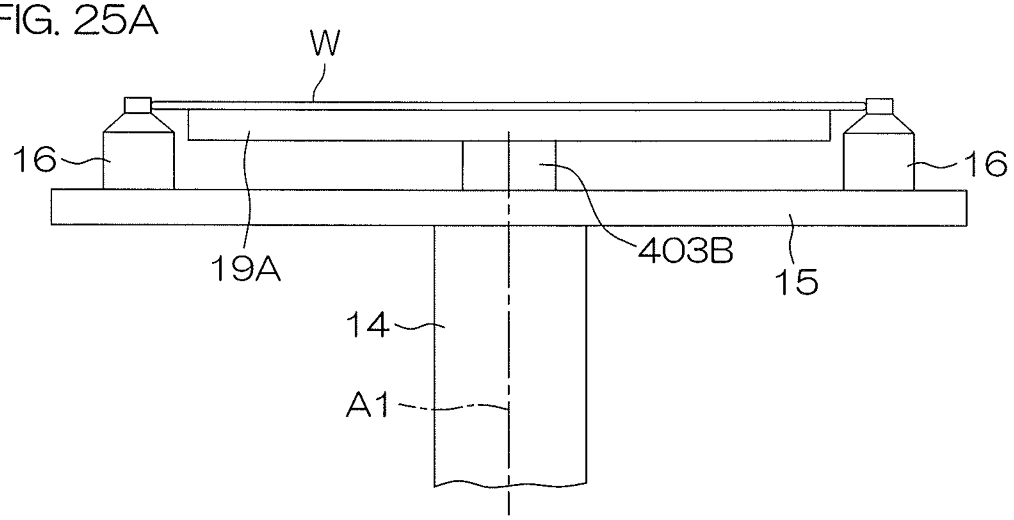
FIGS. 25A and 25B are schematic views for illustrating a substrate processing example which is performed in the processing unit.
Figure 25B:
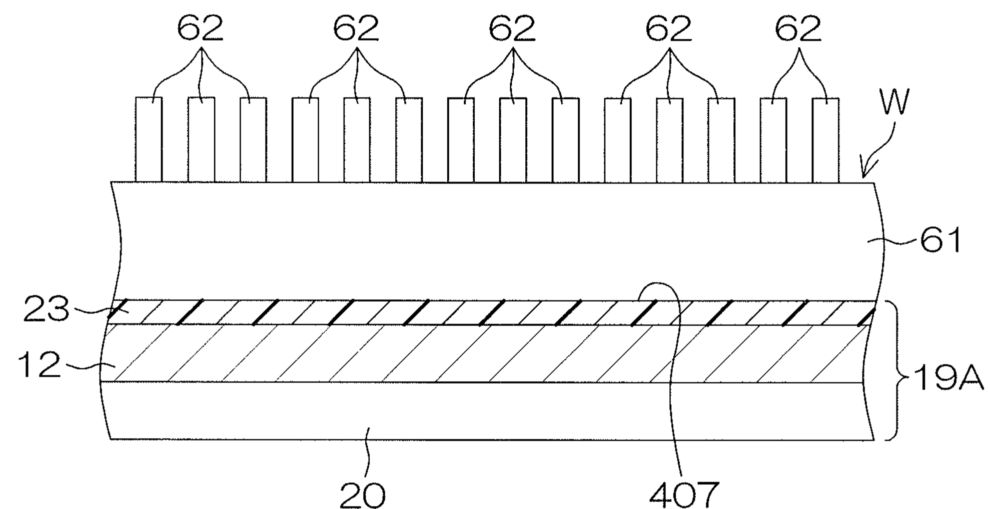

FIG. 24 is a schematic cross-sectional view for illustrating an example of the configuration of a processing unit 402 which is included in a substrate processing apparatus 401 according to a fourth preferred embodiment of the present invention. FIGS. 25A and 25B are schematic views for illustrating a substrate processing example which is performed in the processing unit 402. FIG. 25B shows an enlarged portion in the vicinity of the substrate W shown in FIG. 25A.

In the fourth preferred embodiment, the same portions as in the first preferred embodiment (preferred embodiment shown in FIGS. 1 to 13) described above are identified with the same reference numerals as in FIGS. 1 to 13, and the description thereof will be omitted.

The processing unit 402 mainly differs from the processing unit 2 in that in a state where the substrate W is held by the spin chuck, the upper surface of the first opposite portion 19A can be brought into contact with the lower surface of the substrate W. There is also a difference in that the first opposite portion 19A can be rotated together with the substrate W held in the spin chuck. In other words, in the fourth preferred embodiment, the first opposite portion 19A can be rotated together with the substrate W with the upper surface of the first opposite portion 19A being in contact with the lower surface of the substrate W.

In the fourth preferred embodiment, an opposite member 403 which is used instead of the opposite member 19 includes the first opposite portion 19A which is equivalent to that in the first preferred embodiment and a support portion 403B which supports the first opposite portion 19A in a horizontal posture. The support portion 403B extends downward from the center portion of the first opposite portion 19A along the rotation axis A1, and is fixed to the lower surface of the first opposite portion 19A. The support portion 403B may be formed integrally with the main body portion 20 or may be a member different from the main body portion 20. The support portion 403B is inserted into the spin base 15 and the rotation shaft 14.

The support portion 403B is provided such that the support portion 403B cannot be rotated and can be raised and lowered with respect to the chamber 4. The outer circumference of the support portion 403B is spline-fitted to the inner circumference of the rotation shaft 14. In other words, as the spin chuck 5 is rotated, the opposite member 403 is relatively rotated about the rotation axis A1. Specifically, a female spline portion 405 may be provided in the inner circumference of the rotation shaft 14, and a male spline portion 404 which is fitted to the female spline portion 405 may be defined in the outer circumference of the support portion 403B. The opposite configuration may be adopted. Hence, when the spin chuck 5 rotates the substrate W, the substrate W and the opposite member 403 are relatively rotated about the rotation axis A1.

In the fourth preferred embodiment, a slip ring 406 is interposed partway through the wire 22 which electrically connects the first power supply device 24 and the first electrode 12 together. Hence, even when the opposite member 403 (the first opposite portion 19A and the support portion 403B) is rotated with respect to the spin chuck 5, the voltage can be satisfactorily applied from the first power supply device 24 to the first electrode 12.

The processing example performed by the processing unit 402 differs from the first substrate processing example in that when in the individual steps from the charge supply step (which corresponds to step S6 in FIG. 10) to the drying step (which corresponds to step S8 in FIG. 10), the first opposite portion 19A is in the upper position, as shown in FIGS. 25A and 25B, the upper surface of the first opposite portion 19A (that is, the upper surface of the solid dielectric member 23) makes contact with the lower surface of the substrate W (in FIG. 25A, the case of the charge supply step (S6) is shown). In other words, the upper surface of the solid dielectric member 23 is a contact surface 407 which makes contact with the lower surface of the substrate W. The processing example performed by the processing unit 402 is the same as the first substrate processing example in the other points.

In the preferred embodiment, even when the substrate W is contact-supported by the first electrode 12, the dielectric member can be reliably interposed between the lower surface of the substrate W and the first electrode 12. Since the distance between the first electrode 12 and the lower surface of the substrate W can be kept constant, the amount of charge (negative charge) of the one polarity accumulated on the lower surface of the substrate W or the amount of charge (negative charge) of the one polarity collected on the upper surface of the substrate W can be highly accurately controlled. Hence, the thickness of the solid dielectric member 23 is kept thin, and thus a large amount of charge (negative charge) of the one polarity can be accumulated on the lower surface of the substrate W, and a large amount of charge (negative charge) of the one polarity can be collected on the upper surface of the substrate W.

Figure 26:
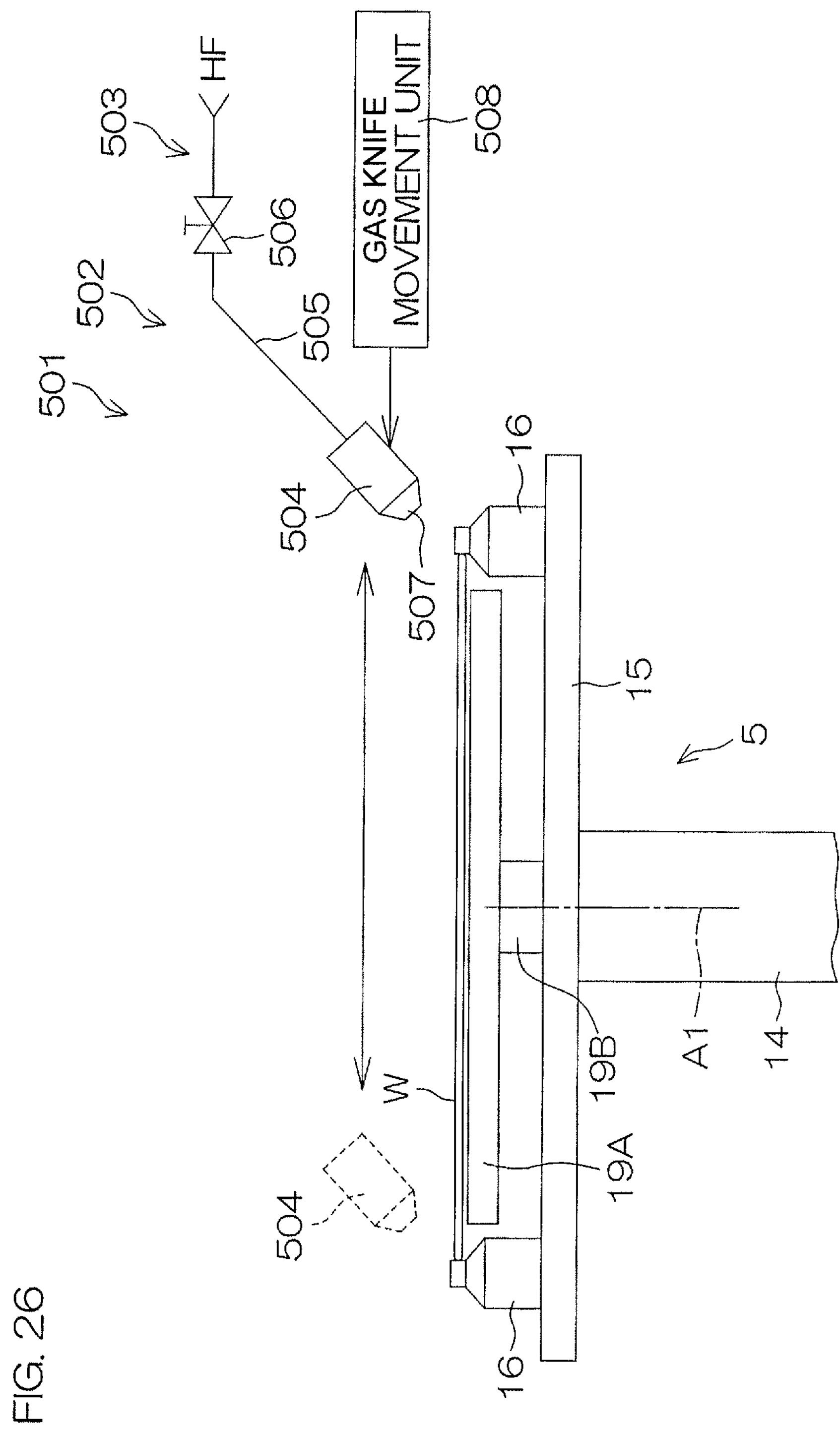
FIG. 26 is a schematic cross-sectional view for illustrating an example of the configuration of a processing unit which is included in a substrate processing apparatus according to a fifth preferred embodiment of the present invention.

FIG. 26 is a schematic cross-sectional view for illustrating an example of the configuration of a processing unit 502 which is included in a substrate processing apparatus 501 according to a fifth preferred embodiment of the present invention.

In the fifth preferred embodiment, the same portions as in the first preferred embodiment (preferred embodiment shown in FIGS. 1 to 13) described above are identified with the same reference numerals as in FIGS. 1 to 13, and the description thereof will be omitted.

The processing unit 502 mainly differs from the processing unit 2 in that the processing unit 502 further includes a gas knife unit (drying unit) 503.

The gas knife unit 503 includes a gas knife nozzle 504 which sprays nitrogen gas serving as an example of an inert gas to the upper surface of the substrate W held in the spin chuck 5, an inert gas pipe 505 which supplies the inert gas to the gas knife nozzle 504 and an inert gas valve 506 which opens and closes the inert gas pipe 505.

The gas knife nozzle 504 includes a slit discharge port 507 which is long in a predetermined one direction which extends in a horizontal direction. The gas knife nozzle 504 discharges the inert gas along the one direction as a band-shaped plot over the entire width of the substrate W in the one direction. The direction in which the inert gas is sprayed from the slit discharge port 507 of the gas knife nozzle 504 may be inclined with respect to the vertical direction.

A gas knife movement unit 508 is connected to the gas knife nozzle 504. The gas knife movement unit 508 horizontally moves the gas knife nozzle 504 in a direction intersecting the one direction (for example, an orthogonal direction).

The processing example performed by the processing unit 502 differs from the first substrate processing example in that in the drying step (which corresponds to step S8 in FIG. 10), instead of spinning off the insulating liquid from the substrate W and thereby drying the substrate W, the inert gas is sprayed to the upper surface of the substrate W so as to remove the insulating liquid from the upper surface of the substrate W, and that thus the upper surface of the substrate W is dried.

Specifically, when a predetermined period elapses after the stop of discharge of the insulating liquid, the controller 3 controls the inert gas valve 506 while keeping the application of the voltage of the one polarity (negative polarity) to the first electrode 12 and keeping the rotation of the substrate W at the liquid processing speed so as to spray the inert gas from the slit discharge port 507. In parallel with the spraying of the inert gas from the slit discharge port 507, the controller 3 controls the gas knife movement unit 508 so as to move the gas knife nozzle 504 horizontally. The gas knife nozzle 504 is moved between an area above an end portion of the substrate Won the side of the one direction and an area above the end portion of the substrate W on the side opposite to the one direction so as to be able to spray the inert gas over the entire region of the upper surface of the substrate W, and thus the insulating liquid is removed from the entire region of the upper surface of the substrate W, with the result that the substrate W is dried.

Although the five preferred embodiments of the invention are described above, the invention can also be embodied in other forms.

For example, in the first to fifth preferred embodiments described above, in parallel with the second voltage application step, the distance between the first electrode 12 and the lower surface of the substrate W may be changed (first distance changing step). The controller 3 controls the first opposite portion lifting unit 21 so as to raise and/or lower the first opposite portion 19A, and thus the change of the distance between the first electrode 12 and the lower surface of the substrate W is realized.

The first electrode 12 is moved close to the lower surface of the substrate W, and thus it is possible to increase the amount of charge (negative charge) of the one polarity collected on the upper surface of the substrate W. Moreover, it is also possible to increase the degree of polarization in the first insulating films 64 and 65 of the thin film pattern 62. On the other hand, the first electrode 12 is moved away from the lower surface of the substrate W, and thus it is possible to reduce the amount of charge (negative charge) of the one polarity collected on the upper surface of the substrate W. Moreover, it is also possible to reduce the degree of polarization in the first insulating films 64 and 65 of the thin film pattern 62. In other words, in parallel with the second voltage application step, the distance between the first electrode 12 and the lower surface of the substrate W is changed, and thus it is possible to adjust the repulsive force (coulomb force) exerted between adjacent thin film patterns 62 (see FIG. 18A and the like).

In the second preferred embodiment described above, in parallel with the third voltage application step (the application of the voltage to the second electrode 223), the distance between the second electrode 223 and the upper surface of the substrate W may be changed (second distance changing step). The controller 3 controls the second opposite portion lifting unit 205 so as to raise and/or lower the second opposite portion 221, and thus the change of the distance between the second electrode 223 and the upper surface of the substrate W is realized.

The second electrode 223 is moved close to the upper surface of the substrate W, and thus it is possible to increase the amount of charge (negative charge) of the one polarity collected on the upper surface of the substrate W. Moreover, it is also possible to increase the degree of polarization in the insulating films 64 and 65 of the thin film pattern 62. On the other hand, the second electrode 223 is moved away from the upper surface of the substrate W, and thus it is possible to reduce the amount of charge (negative charge) of the one polarity collected on the upper surface of the substrate W. Moreover, it is also possible to reduce the degree of polarization in the insulating films 64 and 65 of the thin film pattern 62. In other words, in parallel with the third voltage application step, the distance between the second electrode 223 and the upper surface of the substrate W is changed, and thus it is possible to adjust the repulsive force (coulomb force) exerted between adjacent thin film patterns 62 (see FIG. 18A and the like).

Even in this case, the change of the distance between the first electrode 12 and the lower surface of the substrate W in the second voltage application step and the change of the distance between the second electrode 223 and the upper surface of the substrate W in the third voltage application step may be simultaneously performed.

Although in the description of the first, second, fourth and fifth preferred embodiments, the spin base 15 is metallic, as long as the electrical conductivity between the rotation shaft 14 and the three second holding pins 16B is separately acquired, it is possible to use a (insulating) resin so as to form the spin base.

Although in the description of the first, second, fourth and fifth preferred embodiments, the ground structure 37 serves not only as the ground for the substrate W but also as the ground for the power supply 36, the ground structure 37 may be provided separately of the ground for the power supply 36. In this case, a switch which switches between the state of the ground connection of the substrate W and the state of release thereof may be provided separately of the switch 38.

In the fourth preferred embodiment, by frictional contact between the upper surface (the contact surface 407) of the solid dielectric member 23 and the lower surface of the substrate W, the solid dielectric member 23 may support the lower surface of the substrate W.

Figure 27:
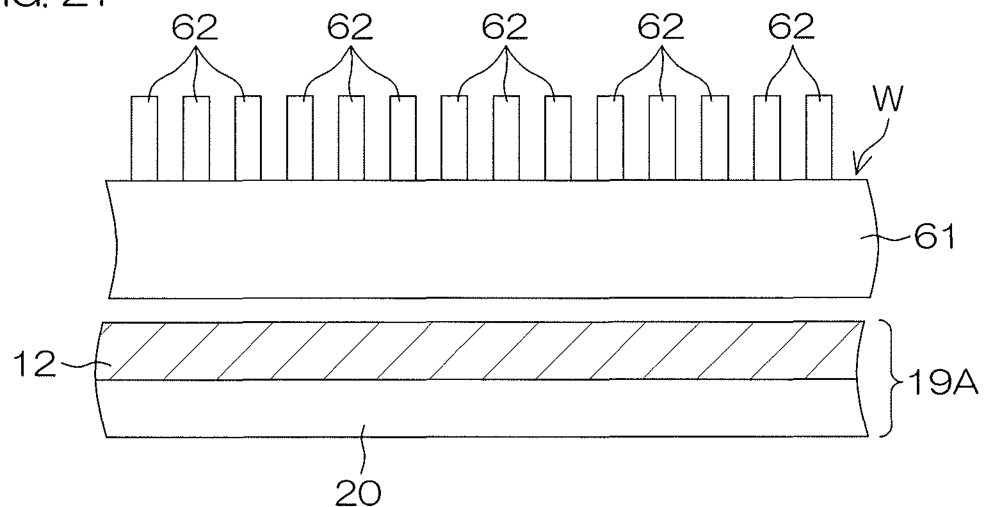
FIG. 27 is a diagram for illustrating a first variation.

In the first to third and fifth preferred embodiments, as shown in FIG. 27, the solid dielectric member 23 can be omitted. In this case, the first electrode 12 forms the upper surface of the first opposite portion 19A. This variation can be applied to only a processing unit in which when the substrate W is held by the spin chuck, the lower surface of the substrate W is prevented from making contact with the upper surface of the first opposite portion 19A.

Although in the description of the first, second, fourth and fifth preferred embodiments, the substrate W is contact-supported by the three second holding pins 16B (conductive pins) from the start of rotation of the substrate W, as long as the substrate W is contact-supported by the three second holding pins 16B at the latest until the start of the charge supply step (S6 in FIG. 10), such a configuration may be adopted. Until the start of the charge supply step (S6 in FIG. 10), the three first holding pins 16A (insulating pins) may contact-support the substrate W or all of the six holding pins 16 may contact-support the substrate W.

In the description of the first to fifth preferred embodiments, during a period after the start of the charge supply step (S6 in FIG. 10) until the start of the drying step (S8 in FIG. 10), except a case where the substrate W is stopped, the rotation of the substrate W is kept at the liquid processing speed. However, in at least part of the period after the start of the charge supply step (S6 in FIG. 10) until the start of the drying step (S8 in FIG. 10), the substrate W may be kept at a paddle speed. The "paddle speed" refers to a speed at which when the substrate W is rotated at the paddle speed, a centrifugal force acting on a liquid on the upper surface of the substrate W is lower than a surface tension acting between the liquid and the upper surface of the substrate W or the centrifugal force is substantially equal to the surface tension. The substrate W is rotated at the paddle speed, and thus the rotation of the substrate W is performed at zero or a low speed, with the result that no centrifugal force or a small centrifugal force alone acts on the liquid film of the liquid. Hence, the liquid stays on the upper surface of the substrate W so as to form the liquid film.

The third preferred embodiment described above may be combined with the second preferred embodiment. The fourth preferred embodiment described above may be combined with the second preferred embodiment and/or the third preferred embodiment. The fifth preferred embodiment described above may be combined with the third preferred embodiment and/or the fourth preferred embodiment.

Although in the above description, as the insulating liquid whose surface tension is lower than that of the pure water, the HFE which is an example of an organic solvent is mentioned as an example, as the insulating liquid as described above, in addition to the HFE, organic solvents such as toluene and acetone can be mentioned.

The insulating liquid supplied from the insulating liquid supply unit 9 to the upper surface of the substrate W is not limited to the insulating liquid whose surface tension is lower than that of the pure water, and an insulating liquid whose surface tension is equivalent to that of the pure water or an insulating liquid whose surface tension is higher than that of the pure water may be used.

Although in the above description, as the insulating liquid, the carbonated water is mentioned as an example, in addition to carbonated water, saline, an electrolyte such as dilute hydrochloric acid and the like can be mentioned.

Although in the above description, the one polarity is a negative polarity, and the other polarity is a positive polarity, the one polarity may be a positive polarity, and the other polarity may be a negative polarity.

Figure 28:
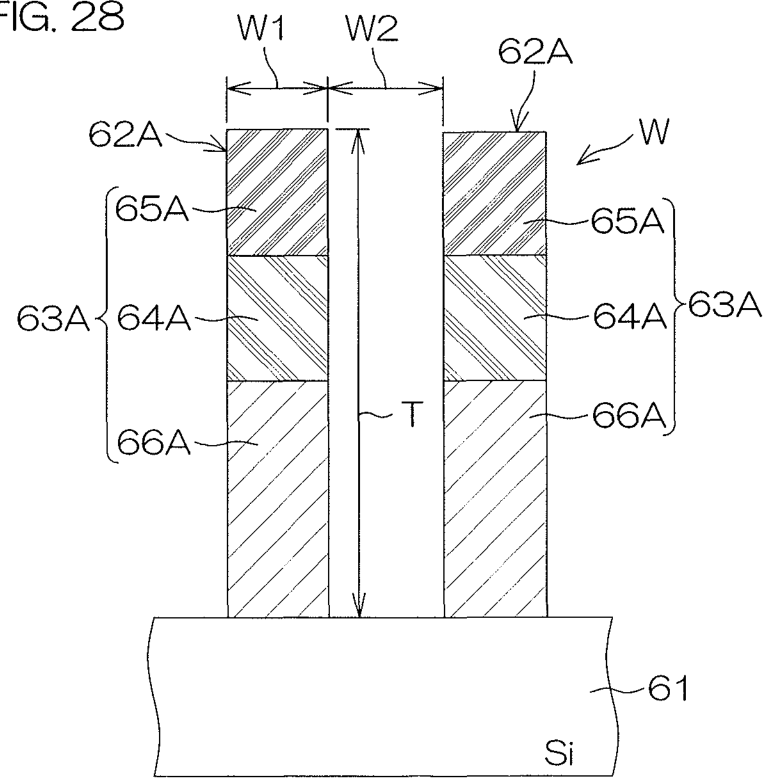
FIG. 28 is a diagram for illustrating a second variation.

The thin film pattern on the front surface of the substrate W to be processed is not limited to the thin film pattern 62 shown in FIGS. 8A and 8B. The multilayer film included in the thin film pattern may include a conductive film as at least part thereof. For example, as shown in FIG. 28, a multilayer film 63A included in a thin film pattern 62A defined on the front surface of the silicon substrate 61 may be arranged by stacking, sequentially from the side of the silicon substrate 61, a conductive film 66A, a first insulating film 64A and a second insulating film 65A in layers.

In the individual substrate processing examples, as the chemical liquid step, the two chemical liquid steps (the first chemical liquid step (S2 in FIG. 10) and the second chemical liquid step (S4 in FIG. 10)) in which the mutually different chemical liquids are used to process the substrate Ware performed. However, the chemical liquid step may be one chemical liquid step or three or more chemical liquid steps. When the chemical liquid step is one chemical liquid step (the first chemical liquid step (S2 in FIG. 10) is omitted), only one pure water step is also performed (the first pure water step (S3 in FIG. 10) is omitted).

Although in the individual preferred embodiments described above, the case where the substrate processing apparatuses 1, 201, 301, 401 and 501 are apparatuses which process the disk-shaped substrate W is described, the substrate processing apparatuses 1, 201, 301, 401 and 501 may be apparatuses which process a polygonal substrate such as a glass substrate for a liquid crystal display device.

Although the preferred embodiments of the present invention are described in detail above, they are simply specific examples which are used to clarify the technical details of the present invention, the present invention should not be interpreted as being limited to these specific examples and the scope of the present invention is limited only by the scope of claims which will be attached.

The present application corresponds to Japanese Patent Application No. 2016-177882 filed with Japan Patent Office on Sep. 12, 2016, and all disclosures of the present application is incorporated herein by reference.

REFERENCE SIGNS LIST

1 Substrate processing apparatus
3 Controller
5 Spin chuck (substrate holding unit)
9 Insulating liquid supply unit
10 Charge supply unit
11 Ground connection unit
12 First electrode
13 Spin motor (drying unit)
16 Holding pin
16A First holding pin (insulating pin)
16B Second holding pin (conductive pin)
17 First movable pin group
18 Second movable pin group
21 First opposite portion lifting unit (first distance changing unit)
23 Solid dielectric member
24 First power supply device
61 Silicon substrate
62 Thin film pattern (pattern)
201 Substrate processing apparatus
205 Second opposite portion lifting unit (second distance changing unit)
223 Second electrode
224 Second power supply device
301 Substrate processing apparatus
303 Conductive liquid supply unit
305 Spin chuck (substrate holding unit)
311 Spin motor (drying unit)
325 Power supply
401 Substrate processing apparatus
406 Contact surface
501 Substrate processing apparatus
503 Gas knife unit (drying unit)
W Substrate

What is claimed is:

1. A substrate processing method comprising:
a substrate holding step of holding a substrate in which a pattern is defined on one major surface;
a charge supply step of supplying a charge of one polarity to the substrate;
a first voltage application step of applying, in parallel with the charge supply step, a voltage of the other polarity to a first electrode arranged on the other major surface of the substrate through a dielectric member, and releasing a ground connection of the substrate;
a second voltage application step of applying, after the first voltage application step, a voltage of the one polarity to the first electrode while keeping a state where the ground connection of the substrate is released; and
a drying step of removing, in parallel with the second voltage application step, a liquid from the one major surface of the substrate so as to dry the substrate.

2. The substrate processing method according to claim 1, further comprising:
an insulating liquid film holding step of holding, in parallel with the second voltage application step, a liquid film of an insulating liquid whose resistivity is equal to or more than a resistivity of pure water on the one major surface of the substrate,
wherein the drying step includes a step of removing the insulating liquid from the one major surface of the substrate.

3. The substrate processing method according to claim 2, wherein the insulating liquid includes a low surface tension liquid whose surface tension is lower than a surface tension of the pure water.

4. The substrate processing method according to claim 1, further comprising:

a first distance changing step of changing, in parallel with the second voltage application step, a distance between the first electrode and the other major surface of the substrate.

5. The substrate processing method according to claim 1, further comprising:

a third voltage application step of applying, in parallel with the second voltage application step, the voltage of the other polarity to a second electrode which is opposite the one major surface of the substrate with a predetermined distance left therebetween.

6. The substrate processing method according to claim 5, further comprising:

a second distance changing step of changing, in parallel with the third voltage application step, a distance between the second electrode and the one major surface of the substrate.

7. The substrate processing method according to claim 1, wherein the substrate holding step further includes:

a first substrate holding step of supporting, in parallel with the charge supply step, the substrate by a plurality of holding pins including at least one conductive pin formed with a conductive material; and a second substrate holding step of supporting, in parallel with the second voltage application step, the substrate with an insulating pin formed with an insulating material without use of the conductive pin.

8. The substrate processing method according to claim 1, wherein the charge supply step includes a step of providing, while supplying a conductive liquid to the substrate, the charge of the one polarity to the conductive liquid.

9. A substrate processing apparatus comprising:

a substrate holder that holds a substrate in which a pattern is defined on one major surface;

a charge supply that supplies a charge of one polarity to the substrate held in the substrate holder;

a first electrode that is arranged through a dielectric member on the other major surface of the substrate held in the substrate holder;

a first power supply that applies a voltage to the first electrode;

a dryer that removes a liquid from the one major surface of the substrate held in the substrate holder; and a controller that controls the charge supply, the first power supply and the dryer, wherein the controller performs:

a charge supply step of applying a voltage to the substrate held in the substrate holder so as to supply the charge of the one polarity to the substrate;

a first voltage application step of applying, in parallel with the charge supply step, a voltage of the other polarity to the first electrode arranged on the other major surface of the substrate through the dielectric member, and releasing a ground connection of the substrate;

a second voltage application step of applying, after the first voltage application step, a voltage of the one polarity to the first electrode while keeping a state where the ground connection of the substrate is released; and a drying step of removing, in parallel with the second voltage application step, the liquid from the one major surface of the substrate so as to dry the substrate.

10. The substrate processing apparatus according to claim 9, further comprising:

a ground connection unit that provides a ground connection that connects the substrate held in the substrate holder to ground, and that includes a switch that switches between the provision of the ground connection of the substrate and a release of the ground connection.

11. The substrate processing apparatus according to claim 9, further comprising:

a solid dielectric member that is arranged between the other major surface of the substrate held in the substrate holder and the first electrode so as to be opposite the other major surface of the substrate.

12. The substrate processing apparatus according to claim 11, wherein the solid dielectric member includes a contact surface which makes contact with the other major surface of the substrate.

13. The substrate processing apparatus according to claim 9, further comprising:

an insulating liquid supply that supplies, to the one major surface of the substrate, an insulating liquid whose resistivity is equal to or more than a resistivity of pure water.

14. The substrate processing apparatus according to claim 13, wherein the insulating liquid includes a low surface tension liquid whose surface tension is lower than a surface tension of the pure water.

15. The substrate processing apparatus according to claim 9, further comprising:

a first distance changer that changes a distance between the first electrode and the other major surface of the substrate.

16. The substrate processing apparatus according to claim 9, further comprising:

a second electrode that is arranged on the one major surface of the substrate with a predetermined distance left therebetween; and a second power supply that applies a voltage to the second electrode, wherein the controller controls the second power supply so as to further perform, in parallel with the second voltage application step, a third voltage application step of applying a voltage of the other polarity to the second electrode.

17. The substrate processing apparatus according to claim 16, further comprising:

a second distance changer that changes a distance between the second electrode and the one major surface of the substrate.

18. The substrate processing apparatus according to claim 9, comprising:

a plurality of holding pins which contact-support a circumferential edge portion of the substrate and which include a conductive pin formed with a conductive material and an insulating pin formed with an insulating material; and a holding pin mover that moves the holding pins, wherein the controller controls the holding pin mover so as to perform:

a first substrate holding step of supporting, in parallel with the charge supply step, the substrate by the holding pins including at least the one conductive pin; and a second substrate holding step of supporting, in parallel with the second voltage application step, the substrate by a plurality of the insulating pins without use of the conductive pin.

19. The substrate processing apparatus according to claim 9, further comprising:

a conductive liquid supply that supplies a conductive liquid to the one major surface of the substrate; and a power supply that applies a voltage to the conductive liquid supplied from the conductive unit supply to the substrate, wherein the controller controls the conductive liquid supply and the power supply so as to perform the charge supply step by providing the charge of the one polarity to the conductive liquid while supplying the conductive liquid to the substrate.

* * * * *